(12) United States Patent
Kim

(10) Patent No.: US 9,437,772 B2
(45) Date of Patent: Sep. 6, 2016

(54) METHOD OF MANUFACTURE OF ADVANCED HETEROJUNCTION TRANSISTOR AND TRANSISTOR LASER

(71) Applicant: Matthew H. Kim, Scottsdale, AZ (US)

(72) Inventor: Matthew H. Kim, Scottsdale, AZ (US)

( * ) Notice: Subject to any disclaimer, the term of this patent is extended or adjusted under 35 U.S.C. 154(b) by 79 days.

(21) Appl. No.: 14/217,022

(22) Filed: Mar. 17, 2014

(65) Prior Publication Data

US 2014/0273323 A1    Sep. 18, 2014

Related U.S. Application Data

(60) Provisional application No. 61/800,175, filed on Mar. 15, 2013, provisional application No. 61/885,434, filed on Oct. 1, 2013.

(51) Int. Cl.

| | |
|---|---|
| *H01L 33/00* | (2010.01) |
| *H01L 29/20* | (2006.01) |
| *H01L 29/66* | (2006.01) |
| *H01L 29/737* | (2006.01) |
| *H01L 29/10* | (2006.01) |
| *H01S 5/062* | (2006.01) |
| *H01S 5/183* | (2006.01) |
| *H01S 5/34* | (2006.01) |
| *H01S 5/343* | (2006.01) |
| *H01S 5/02* | (2006.01) |

(52) U.S. Cl.
CPC ....... *H01L 33/0025* (2013.01); *H01L 29/1004* (2013.01); *H01L 29/2003* (2013.01); *H01L 29/66242* (2013.01); *H01L 29/7371* (2013.01); *H01S 5/06203* (2013.01); *H01S 5/18341* (2013.01); *H01S 5/3409* (2013.01); *H01S 5/34306* (2013.01); *H01S 5/34346* (2013.01); *H01S 5/0215* (2013.01); *H01S 5/3412* (2013.01); *H01S 5/3422* (2013.01); *H01S 5/34333* (2013.01)

(58) Field of Classification Search
CPC .............. H01L 2924/1305; H01L 29/66242; H01L 2924/13051; H01L 29/165; H01L 29/267; H01L 33/06; H01L 29/1004; H01L 29/66318; H01L 29/7317; H01L 29/7322
See application file for complete search history.

(56) References Cited

U.S. PATENT DOCUMENTS

| | | | |
|---|---|---|---|
| 5,216,271 A * | 6/1993 | Takagi et al. ................ 257/370 |
| 5,508,536 A * | 4/1996 | Twynam et al. .............. 257/197 |
| 5,548,128 A * | 8/1996 | Soref et al. ..................... 257/18 |
| 6,654,392 B1 | 11/2003 | Arbore et al. |
| 6,711,203 B1 | 3/2004 | Garnache et al. |
| 7,830,926 B1 | 11/2010 | Kim |
| 8,294,224 B2 | 10/2012 | Bhattacharyya et al. |
| 8,437,374 B1 | 5/2013 | Kim |
| 8,796,744 B1 * | 8/2014 | Ma et al. ...................... 257/240 |
| 2003/0012249 A1 | 1/2003 | Eisenbeiser |
| 2012/0104462 A1 * | 5/2012 | Ichikawa ...................... 257/194 |

OTHER PUBLICATIONS

Adamiec, et al.; "Pressure-tuned InGaAsb/AlGaAsSb diode laser with 700 nm tuning range", Appl. Phys. Lett., 2004, vol. 85, pp. 4292-4294.

(Continued)

*Primary Examiner* — Bac Au
(74) *Attorney, Agent, or Firm* — Bryan Cave LLP

(57) ABSTRACT

Methods of manufacture of advanced heterojunction transistors and transistor lasers, and their related structures, are described herein. Other embodiments are also disclosed herein.

44 Claims, 72 Drawing Sheets

(56) References Cited

OTHER PUBLICATIONS

Mailhiot, et al.; "Effects of Compressive Uniaxial Stress on the Electronic Structure of . . . "; American Physical Society; 1987, vol. 36(5), pp. 2942-2945.

Yablonovitch et al.; "Extreme Selectivity in the lift-off of Epitaxial GaAs films", Appl. Phys. Lett. 1987, vol. 51(26), pp. 2222-2224.

Yablonovitch, et al.; "Van der Waals Bonding of GaAs.." Appl. Phys. Lett., 1990, vol. 56(24), pp. 2419-2421.

* cited by examiner

NPN edge emitting transistor laser structure with a GeSn QW or QD active region in a GaAs P+ base/barrier material 3500

SCH ridge laser utilizing a GeSn QW or QD region
with UID Ge barrier/OCL region

NPN HBT with an ordered InGaP emitter,
Compositionally graded Ge-GeSn base, GaAs collector

METHOD OF MANUFACTURE OF ADVANCED HETEROJUNCTION TRANSISTOR AND TRANSISTOR LASER

CROSS-REFERENCE TO RELATED APPLICATION

This application claims priority to U.S. Provisional Patent Application No. 61/800,175 filed Mar. 15, 2013 and to U.S. Provisional Patent Application No. 61/885,434 filed Oct. 1, 2013, the contents of both of which are hereby incorporated by reference.

TECHNICAL FIELD

This description relates generally to semiconductor devices, and more particularly to advanced heterojunction transistors and transistor lasers.

BACKGROUND

Heterojunction transistors, including heterojunction bipolar transistors (HBTs), have been used for many decades. For example, HBTs using silicon germanium (SiGe) as the base layer for the HBTs and using silicon (Si) as the emitter layer for the HBTs have been used for a variety of applications, as have HBTs using gallium arsenide (GaAs) as the base layer and aluminum gallium arsenide (AlGaAs) as the emitter layer.

Figure 1:
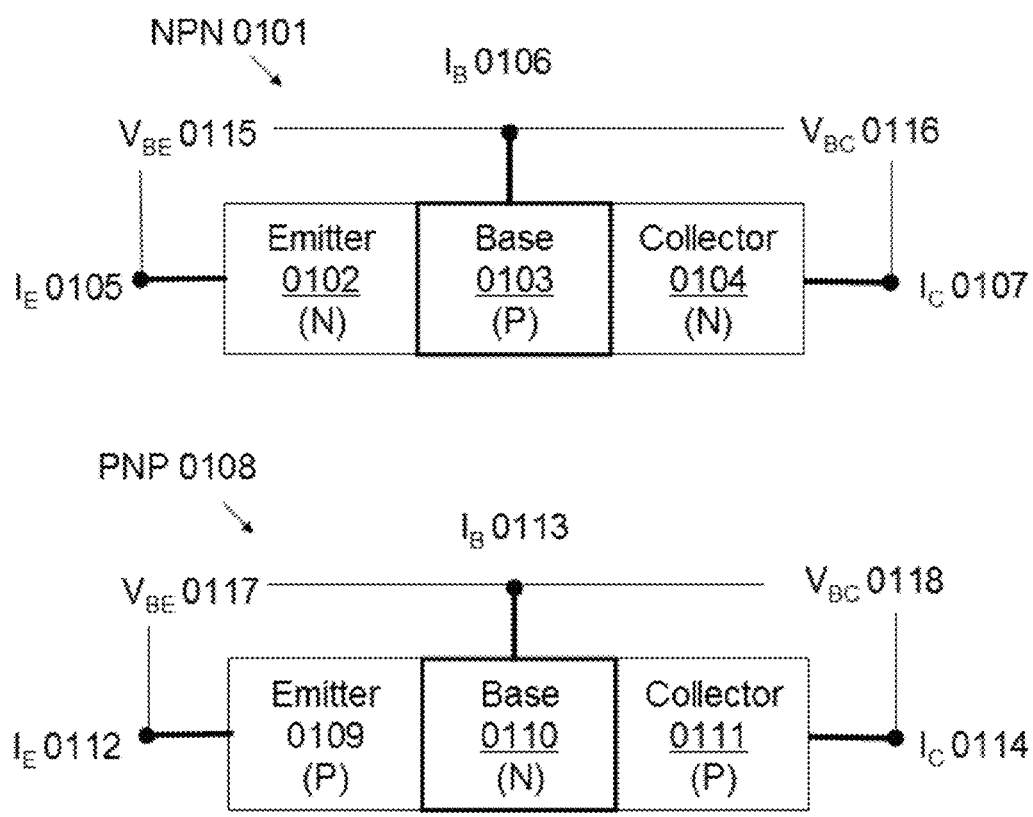
FIG. 1 shows a general configuration of a bipolar transistor as a three terminal device in its two constituent forms NPN and PNP.

For simplicity and clarity of illustration, the drawing figures illustrate the general manner of construction, and descriptions and details of well-known features and techniques may be omitted to avoid unnecessarily obscuring the present disclosure. Additionally, elements in the drawing figures are not necessarily drawn to scale. For example, the dimensions of some of the elements in the figures may be exaggerated relative to other elements to help improve understanding of embodiments of the present disclosure. The same reference numerals in different figures denote the same elements.

The terms "first," "second," "third," "fourth," and the like in the description and in the claims, if any, are used for distinguishing between similar elements and not necessarily for describing a particular hierarchical, sequential, or chronological order. It is to be understood that the terms so used are interchangeable under appropriate circumstances such that the embodiments described herein are, for example, capable of operation in sequences other than those illustrated or otherwise described herein. Furthermore, the terms "include," and "have," and any variations thereof, are intended to cover a non-exclusive inclusion, such that a process, method, system, article, device, or apparatus that comprises a list of elements is not necessarily limited to those elements, but may include other elements not expressly listed or inherent to such process, method, system, article, device, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein.

The terms "couple," "coupled," "couples," "coupling," and the like should be broadly understood and refer to connecting two or more elements or signals, electrically, mechanically or otherwise. Two or more electrical elements may be electrically coupled, but not mechanically or otherwise coupled; two or more mechanical elements may be mechanically coupled, but not electrically or otherwise coupled; two or more electrical elements may be mechanically coupled, but not electrically or otherwise coupled. Coupling (whether mechanical, electrical, or otherwise) may be for any length of time, e.g., permanent or semi-permanent or only for an instant.

"Electrical coupling" and the like should be broadly understood and include coupling involving any electrical signal, whether a power signal, a data signal, and/or other types or combinations of electrical signals. "Mechanical coupling" and the like should be broadly understood and include mechanical coupling of all types. The absence of the word "removably," "removable," and the like near the word "coupled," and the like does not mean that the coupling, etc. in question is or is not removable.

DETAILED DESCRIPTION

The fabrication of a germanium tin (GeSn) based heterojunction bipolar transistor and/or light emitting transistor or transistor laser or light emitting device or laser for electronics and photonics is described herein. Where GeSn is used as the base material in a heterojunction transistor, the GeSn, GeSn quantum dot, GeSn quantum wire, and/or GeSn quantum dot material can be used as the active region of a light emitting transistor or transistor laser or light emitting device or laser. In one embodiment, a heterojunction bipolar transistor includes a GeSn base region. In another embodiment, a method of manufacturing a heterojunction bipolar transistor includes forming a GeSn base region. In a further embodiment, a device includes: a first heterojunction bipolar transistor comprising a PNP device having a first GeSn base; and a second heterojunction bipolar transistor comprising an NPN device having a second GeSn base, wherein the first and second heterojunction bipolar transistors are located over a common substrate. In another embodiment, method of manufacturing a device includes: forming a first heterojunction bipolar transistor comprising a PNP device having a first GeSn base; and forming a second heterojunction bipolar transistor comprising an NPN device having a second GeSn base, wherein forming the first and second heterojunction bipolar transistors occur simultaneously with each other over a common substrate. In yet another embodiment, a device includes: a first bipolar transistor comprising a first GeSn base; and a second bipolar transistor comprising a second GeSn base, wherein the first and second bipolar transistors are complementary devices and are located over a common substrate. In a further embodiment, a method of manufacturing a device includes: forming a first bipolar transistor comprising a first GeSn base; and forming a second bipolar transistor comprising a second GeSn base, wherein forming the first and second bipolar transistors occur simultaneously with each other over a common substrate. In still another embodiment, a bipolar transistor includes a GeSn base region, and in yet another embodiment, a method of manufacturing a bipolar transistor includes providing a GeSn base region. In a further embodiment, a transistor laser includes a GeSn active region, and in another embodiment, a method of forming a transistor laser includes forming a GeSn active region. The description herein elucidates a methodology for making a heterojunction bipolar transistor (HBT) that utilizes GeSn as the base material. Furthermore, the unique properties of GeSn can be utilized as the active region of a variation of the transistor which is the transistor laser, or in a light emitting device like a laser. Embodiments described herein can relate to the following: GeSn which has the smallest band gap energy for the material systems GaN, GaAs, Si, InP, Ge, Sn, AlAs, InAs, GaP and thus would be useful for making a heterojunction bipolar transistor, laser or transistor laser device. Nomenclature: Ga (gallium), N (nitrogen or nitride), As (arsenic or arsenide), Si (silicon), In (indium), P (phosphorous or phosphide), Ge (germanium), Al (aluminum), Sn (tin), Sb (antimony or antimonide), B (boron), C (carbon, carbide). The embodiments can relate to the following:

1) Bipolar transistor using a GeSn base
2) Bipolar transistor using a graded Ge—GeSn base
3) Bipolar light emitting transistor or transistor laser using in the base region a GeSn quantum well, quantum wire, or quantum dot active region.
4) Light emitting or laser structure using GeSn quantum well, quantum wire, or quantum dot active region.

The same or different embodiments can relate to:
1) Lateral structures (edge emitting)
2) vertical structures
3) inverted vertical structures
4) Indirect band gap GeSn
5) Direct band gap GeSn
6) Multiple quantum well layers
7) Multiple quantum dot layers
8) Multiple quantum wire layers In one embodiment, a heterojunction bipolar transistor can include a GeSn base region. In another embodiment, a method of manufacturing a heterojunction bipolar transistor can include forming a GeSn base region. In a further embodiment, a device can include a first heterojunction bipolar transistor comprising a PNP device having a first GeSn base, and a second heterojunction bipolar transistor including an NPN device having a second GeSn base.

A bipolar transistor or bipolar junction transistor is a three terminal or three layer device that relies on doping (adding "impurity" atoms) of the semiconductor layers to form N-type or "N" (electron surplus layer) semiconductor and P-type or "P" (electron deficient layer) semiconductor to form PN junction (diodes) in a three terminal configuration. This three terminal or three layer device can include back-to-back PN junctions to form a three layer sandwich with each of the layers named the emitter, base, and collector. There are two kinds of bipolar transistors, NPN and PNP.

FIG. 1 shows the general configuration of the bipolar transistor as a three terminal device in its two constituent forms NPN 0101 and PNP 0108. The NPN 0101 structure comprises an N-type emitter 0102, connected to a P-type base 0103, which is then connected to a N-type collector 0104 region, which comprises the three terminal device. The corresponding currents in the three terminal device correspond to the emitter current $I_E$ 0105, base current $I_B$ 0106, and collector current $I_C$ 0107. The NPN 0101 device has a junction at the emitter-base, where the applied voltage is $V_{BE}$ 0115, and a second junction at the base-collector, where the applied voltage is $V_{BC}$ 0116.

The PNP 0108 structure comprises a P-type emitter 0109, connected to an N-type base 0110, which is then connected to a P-type collector 0111 region, which comprises the three terminal device. The corresponding currents in the three terminal device correspond to the emitter current $I_E$ 0112, base current $I_B$ 0113, and collector current $I_C$ 0114. The PNP 0108 device has a junction at the emitter-base, where the applied voltage is $V_{BE}$ 0117, and a second junction is at the base-collector, where the applied voltage is $V_{BC}$ 0118. The base-emitter voltage $V_{BE}$ turns on the transistor and generally is operated in forward bias, and the base-collector voltage $V_{BC}$ is generally reversed biased and also determines the breakdown voltage of the device.

The base region controls the operation of the transistor. The characteristics and properties of the base material and the base-emitter junction and the base-collector junction are the dominant factors that determine the electronic properties of bipolar and heterojunction bipolar transistors. Thus the utilization of a new type of base material in these transistors allows for the development of vastly improved transistors for high speed and power efficient operation.

Semiconductors can be discussed in terms of their energy band structure. The energy band structure shows the allowable carrier (electron or hole) energy states for semiconductor as a function of the crystal momentum direction. The energy band structure can be divided into two main regions: the conduction band; and the valence band. N-type material conduction relies on free movement of electrons in the conduction band of the material. The conduction band can be characterized by the conduction band energy level (lowest energy in the conduction band). P-type material conduction relies on the free movement of holes (hole: absence of an electron) in the valence band of the material. The valence band is characterized by the valence band energy level (or the highest energy level in the valence band). The difference between the conduction band energy level and the valence band energy level determine the energy band gap of the semiconductor (difference of the conduction band energy minima to the valence band energy maxima).

At the PN junctions of the bipolar transistor, there exists a depletion zone that in the absence of an externally applied electric field prevents the movement of the charge carriers across the junctions or different layers. The operation of this device relies on two types of carriers, free electrons (negative charges in the conduction band) and free holes (absent electron charge carrier, positive charge in the valence band). Thus, the name bipolar is ascribed to this device because its operation involves both electrons and holes, as opposed to unipolar devices like field effect transistors whose operation involves only one of electrons or holes.

The bipolar transistor has three distinct regions: the emitter, the base, and the collector. The flow of charges (called electrical current or current) in this transistor is due to the bidirectional diffusion of charge carriers across the junction. The bipolar transistor is biased as follows. The emitter is forward biased via the contact pads with the voltage potential (base-emitter voltage $V_{BE}$) to force charge carriers from the emitter to the base. The collector is reversed biased via the contact pads with a voltage potential (base-collector voltage) that causes charge carriers to be attracted from the base to the collector. The corresponding currents are called the emitter current, base current and the collector current.

Figure 2:
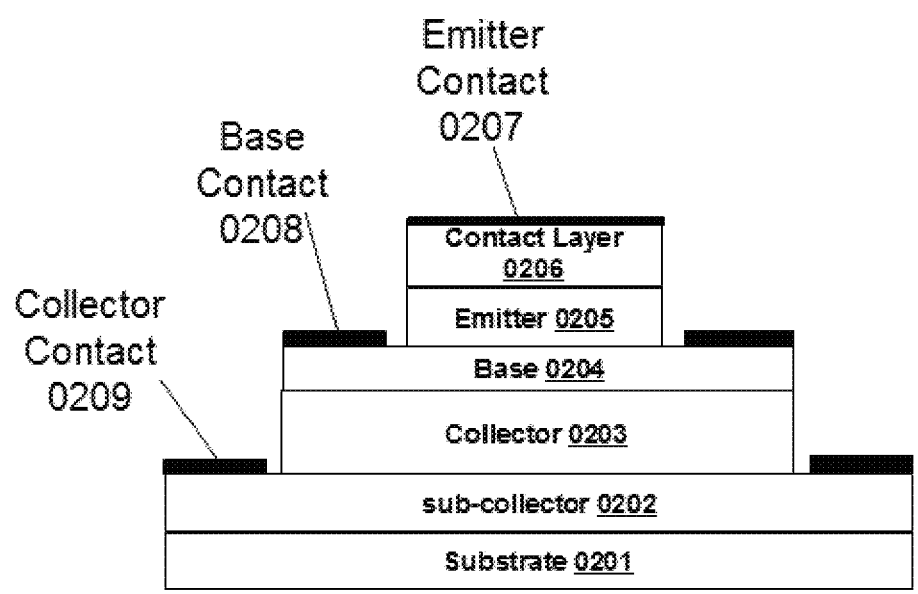
FIG. 2 shows a general cross-sectional device depiction of a bipolar transistor in a vertical stack geometry.

FIG. 2 shows a general configuration of a bipolar transistor as a vertical stack geometry. Typically the structure can be grown epitaxially, ion implanted or fabricated by various means. For a vertical bipolar transistor, typically a conducting or insulating substrate 0201 is used as the seed crystal to start the growth of the structure. A highly conducting sub-collector 0202 is then grown, followed by a low doped collector 0203. The base 0204 which is of opposite conductivity as the collector 0203 is then grown, followed by an emitter 0205, and finally a highly conducting contact layer 0206. Electrical contact is made to device via the metalized contact pads: emitter contact 0207, base contact 0208, and collector contact 0209. The voltages and currents are applied to the device via the contact pads. Vertical configuration offers some advantages.

Some of the advantages of a bipolar device are: typically in an NPN configuration electrons will travel vertically in the device from the emitter to the collector. Thus it is straightforward to produce devices where the electron transit time through the device is short (high cut off frequency $F_t$). Generally the entire area of the emitter contact will conduct the current; thus one can have high current densities in a small area, thus allowing for high circuit densities. The turn-on voltage (voltage across the base-emitter junction) $V_{BE}$ is independent of device processing issues like size because it corresponds to the potential at the base-emitter junction, thus process variations across a wafer can be minimized which is desirable for manufacturing. The turn-on voltage $V_{BE}$ controls the output current at the collector $I_C$ and results in a high transconductance $g_m = eI_C/k_BT$, where "e" is the charge of the electron, $I_C$ is the collector current, "$k_B$" is Boltzmann's constant, and "T" is the temperature. This is the highest transconductance available for any three terminal device and allows circuit operation with low $V_{BE}$ swings.

The operation of the bipolar transistor (transistor action) is based on the flow of charge carriers injected from the emitter into the base which can diffuse into the collector forming the emitter to collector current (collector current). The free charge carriers initially in the emitter are called majority carriers. The majority charge carriers that are injected into the base from the emitter, once in the base, are called minority carriers, which then can diffuse to the collector. The base region controls the flow of the minority carriers injected into the base thus controlling the flow of the collector current from the emitter to the collector. By drawing out the minority carriers that are injected into the base from the emitter, small levels of minority carriers drawn from the base control the larger collector current that flows from the emitter to the collector. Also, the base region is made thin to enhance the diffusion of carriers from the emitter to the collector.

The current gain or "beta" of the bipolar transistor is the ratio of the collector current $I_C$ to the base current $I_B$. Basically, the ratio is the number of carriers that get across the transistor from the emitter to the collector, vs. the number of carriers that get caught in the base.

For a typical NPN transistor, the biasing scheme is as such. The emitter to base $V_{BE}$ bias is such that the base is biased slightly positive as compared to the emitter. The collector to base $V_{BC}$ bias is such that the collector is biased much more positively than the base. This biasing scheme can ensure that, for small values of base current, large values of collector currents can be controlled. The current gain is typically about "100".

For a typical PNP transistor the biasing scheme is as such. The emitter to base $V_{BE}$ bias is such that the base is biased slightly negative as compared to the emitter. The collector to base $V_{BC}$ bias is such that the collector is biased much more negatively than the base. This biasing scheme can ensure that, for small values of base current, large values of collector currents can be controlled.

The bipolar homojunction transistor can be made of one semiconductor material. The bipolar transistor can be used as a switch, amplifier, or oscillator, etc. It can be fabricated in discrete (single) component or as a component in integrated circuits.

Heterojunction bipolar junction transistors (HBT) can differ from the bipolar transistor (also called a homojunction bipolar transistor) by using at least two different semiconductors. The heterojunction bipolar transistor typically uses different semiconductor materials for at least one of the junctions, the emitter-base junction, and/or the base-collector junction. The use of differing semiconductor materials is called a heterojunction.

Heterojunction bipolar transistors (HBTs) can be advantageous in some situations for formation of the emitter-base junction. In homojunctions, transistors the emitter is typically doped (impurity incorporation with an atomic element to create free charge carriers) more heavily than the base region. If the heterojunction is designed properly, the emitter has an energy band gap greater than the base region. If the conduction and valence band alignment of the two materials that form the heterojunction is proper, it is then possible to limit the injection of majority carriers (initial free charge carriers in the base) of the base region into the emitter region (or additionally termed, limit the minority carrier injection into the emitter). This occurs because the heterojunction can create a potential barrier either in the valence or conduction band to block the majority carriers in the base, thus eliminating injection of majority carriers from the base into the emitter. In the heterojunction transistor, the base can be heavily doped at concentrations much greater than the emitter material. The physics of the heterojunction can be strongly determined by the conduction and valence band alignment between the materials.

Figure 3:
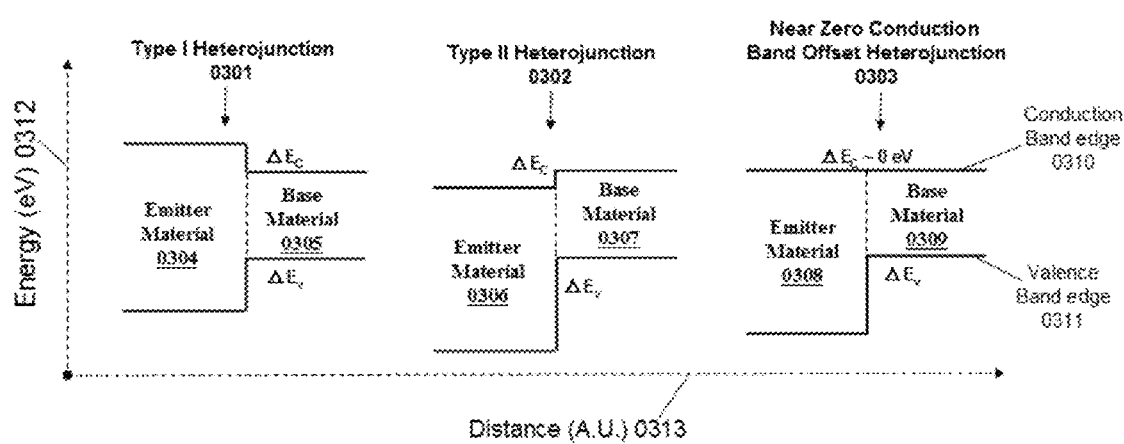
FIG. 3 shows a flatband energy diagram for three typical heterojunction situations between the emitter and base materials: type I, type II, near zero conduction band offset.

FIG. 3 shows a flatband energy diagram for three typical heterojunction situations between emitter and base materials (focuses on the case where we have an N-type emitter material and a P-type base material): type I, type II, near zero conduction band offset. The heterojunction is at the interface between the emitter material and the base material. The type of diagram depicted is called a flat band energy diagram, which represents how the conduction band edge 0310 and the valence band edge 0311 change as one goes through the dis-similar semiconductor materials. The vertical axis 0312 has the value of Energy with typical units of "eV", and the horizontal axis 0313 is the relative Distance in arbitrary units "A.U." through the heterojunction of semiconductor materials. The energy level line called the conduction band edge 0310 is the minimum energy value of the conduction band, and the energy level line called the valence band edge 0311 is the maximum value of the valence band. The diagram shows distance on the horizontal scale and that is a relative distance into the semiconductor device. One could put units of thickness, but that is usually omitted, and this represents a schematic for carrier transport. The difference between the conduction band edge 0310 and the valence band edge 0311 in the base material is the band gap energy of the base material. The difference between the conduction band edge 0310 and the valence band edge 0311 in the emitter material is the band gap energy of the emitter material.

There are various types of heterojunctions between the emitter and base materials: (1) Type I heterojunction 0301; (2) Type II heterojunction 0302; and (3) near zero conduction band offset 0303 (there can also be a near zero valence band offset) at the heterojunction. Type I heterojunction has an energy discontinuity at the conduction band and valence band, where the smaller band gap at base material 0305 lies between the conduction and valence band edges of emitter material 0304. $\Delta E_C$ is called the conduction band offset at the emitter-base heterojunction (difference between the conduction band edges in the respective materials), and $\Delta E_V$ is call the valence band offset at the emitter-base junction (difference between the valence band edges in the respective materials). Type II heterojunctions have a discontinuity at the conduction and valence band edge, but the base energy alignment is staggered or offset. The energy band gap of base material 0307 can be staggered above emitter material 0306, and the band gap as depicted in the figure (or staggered below the emitter material 0306 band gap). Finally, one can have a situation of a zero or near zero conduction band offset heterojunction 0303 as shown in the figure, where the conduction band offset $\Delta E_C$ is zero or small, typically less than 0.1 eV between emitter material 0308 and base material 0309.

For NPN heterojunction transistors, where the emitter material is N-type and the base material is P-type, a large valence band offset $\Delta E_V$ between the emitter and the base is desired, as shown in the three cases (1) Type I heterojunction 0301; (2) Type II heterojunction 0302; and (3) near zero conduction band offset heterojunction 0303. This large valence band offset $\Delta E_V$ prevents the back injection of holes from the base to emitter, which can reduce the gain of the transistor. Thus the base material band gap energy should be less than the emitter material band gap energy. Looking at the FIG. 3 diagram, it seems that a type II heterojunction current 0302 would be preferable because it has the largest valence band offset $\Delta E_V$, but in some examples, the desired situation for the efficient transport of carriers across the base to promote transistor action is the near zero conduction band offset heterojunction 0303 situation or where the conduction band offset $\Delta E_C$ is typically less than 0.1 eV.

Figure 4:
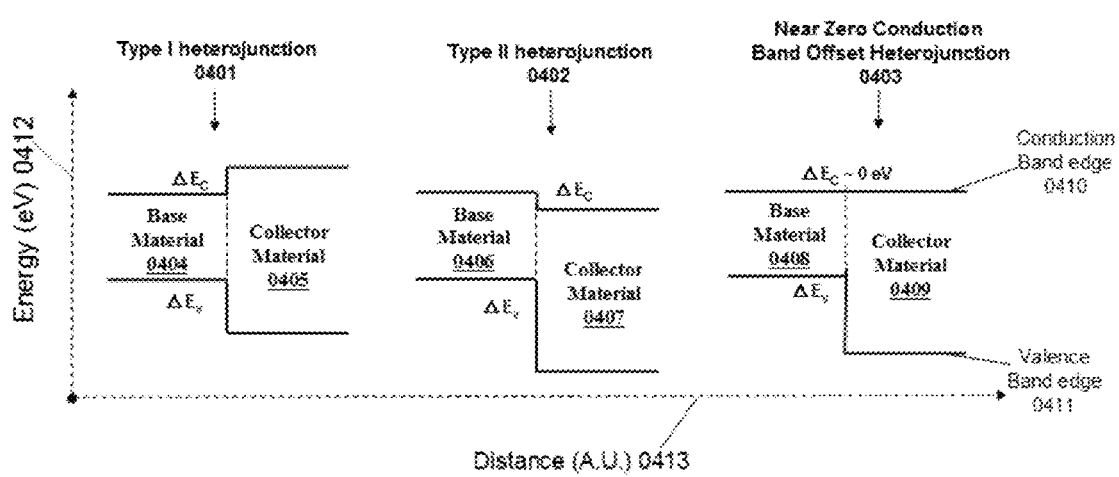
FIG. 4 shows a flatband energy diagram for three typical heterojunction situations between the base and collector materials: type I, type II, near zero conduction band offset.

FIG. 4 shows a flatband energy diagram for three typical heterojunction situations between the base material and the collector material (focuses on the case where we have a P-type base material and an N-type collector material): type I, type II, near zero conduction band offset. The heterojunction is at the interface between the base material and collector material. The type of diagram depicted is called a flat band edge energy diagram, where the vertical axis is the Energy (eV) 0412 value and the horizontal axis is a relative Distance (A.U.) 0413 through heterojunction of semiconductor materials. The energy level lines are called the conduction band edge 0410, is the minimum energy value of the conduction band and the valence band edge 0411 is the maximum value of the valence band. The diagram shows distance on the horizontal scale, and the distance is a relative distance into the semiconductor device. One could put units of thickness, but that is usually omitted and this represents a schematic for carrier transport. The difference between the conduction band edge 0410 and the valence band edge 0411 in the base material is the band gap energy of the base material. The difference between the conduction band edge 0410 and the valence band edge 0411 in the collector material is the band gap energy of the collector material.

There are various types of heterojunctions between the base and collector materials: (1) Type I heterojunction 0401; (2) Type II heterojunction 0402; and (3) near zero conduction band offset 0403 (there can also be a near zero valence band offset) at the heterojunction. Type I heterojunction has an energy discontinuity at the conduction band and valence band, where the smaller band gap base material 0404 regions lies between the conduction and valence band edges of the collector material 0405. $\Delta E_C$ is called the conduction band offset at the base-collector heterojunction (difference between the conduction band edges in the respective materials), and $\Delta E_V$ is call the valence band offset at the base-collector heterojunction (difference between the valence band edges in the respective materials). Type II heterojunctions have a discontinuity at the conduction and valence band edge, but the base energy alignment is staggered or offset. The energy band gap of base material 0406 can be staggered above the band gap of collector material 0407 as depicted in the figure (or staggered below the band gap of collector material 0407). Finally, one can have a situation of a zero or near zero conduction band offset heterojunction 0403 as shown in the figure, where the conduction band offset $\Delta E_C$ is zero or small, typically less than 0.1 eV between the base material 0408 and the collector material 0409.

For NPN heterojunction transistors, where the base material is P-type and the collector material is typically N-type, one would like a large collector band gap energy because this allows the NPN transistor to have a big breakdown voltage. Looking at the FIG. 4 diagram, it seems that a type II heterojunction 0402 would be preferable because the base material 0406 has higher conduction band energy than the collector material 0407 but, in some examples, the desired situation for the efficient transport of carriers across the base to promote transistor action is the near zero conduction band offset heterojunction 0403 situation or where the conduction band offset $\Delta E_C$ is typically less than 0.1 eV.

Figure 5:
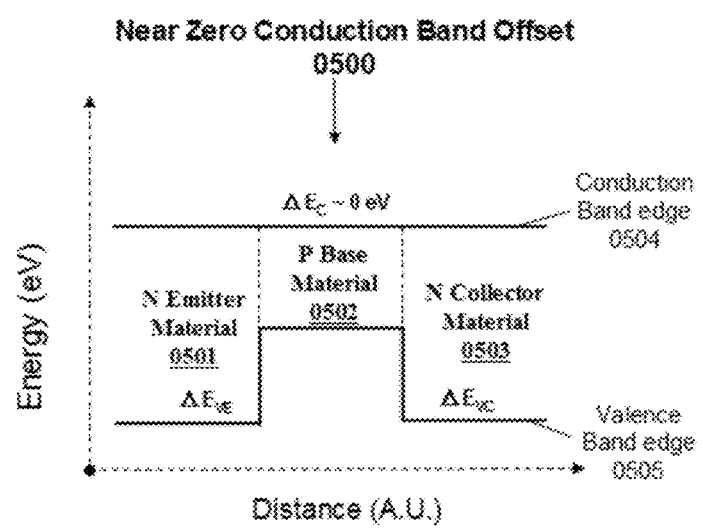
FIG. 5 shows a flatband band edge diagram through an NPN transistor for optimized transport.

FIG. 5 shows the flatband energy diagram through an NPN heterojunction bipolar transistor 0500 for optimized transport. The figure shows the lineup of the conduction band edge 0504 and the valence band edge 0505 through the NPN heterojunction transistor 0500. There is a zero conduction or near zero conduction band edge offset $\Delta E_C$ from the N emitter material 0501 to the P base material 0502 to the N collector 0503. The emitter-base valence band offset is represented by $\Delta E_{VE}$ and the base-collector valence band offset is $\Delta E_{VC}$. In physical situations it is desirable to have the smallest conduction band offset that is possible from N emitter material 0501 to P-base material 0502 to N collector 0503. Here the band gap energy of N emitter material 0501 is larger than the band gap energy of P base material 0502, where there is a large valence band offset $\Delta E_{VE}$ between N emitter material 0501 to P base material 0502, and the junction is a heterojunction. The band gap energy of N collector material 0503 can be less than, equal to, or greater than the band gap energy of P base material 0502. Generally the band gap energy of N collector material 0503 should be equal to, or greater than, the band gap energy of P base material 0502. The greater the band gap energy of N collector material 0503 the better the breakdown voltage of NPN heterojunction bipolar transistor 0500. This is generally desirable for high power and robust devices. If N collector material 0503 is the same material as P base material 0502, there is a homojunction at the base-collector junction and a heterojunction at the emitter-base junction, and such a device is called a single heterojunction bipolar transistor device. If N emitter material 0501 and N collector material 0503 are the same, then the device is called a symmetric double heterojunction bipolar transistor device, and such a device results in a minimum in zero offset voltage in the measurement of the collector current vs. the collector-emitter voltage as a function of the stepped voltage bias of the base-emitter junction, which is desirable to improve the power added efficiency of NPN heterojunction bipolar transistor 0500. For robust and high power, one would like the collector band gap energy to be as large as possible. If the emitter material, the base material, and the collector material are all dis-similar, the device would be called an asymmetric double heterojunction bipolar transistor device.

The NPN heterojunction transistor can promote efficient transport when there is zero or near zero or the smallest conduction band offset between emitter-base-collector. In an NPN device, the electrons are key carrier that makes up the collector current, and the base-emitter junction controls this electron current. The base alignment of the conduction band offset can be desirable in some examples. Large conduction band energy offsets or discontinuities at the emitter-base or collector-base junctions can hinder electron transport.

Figure 6:
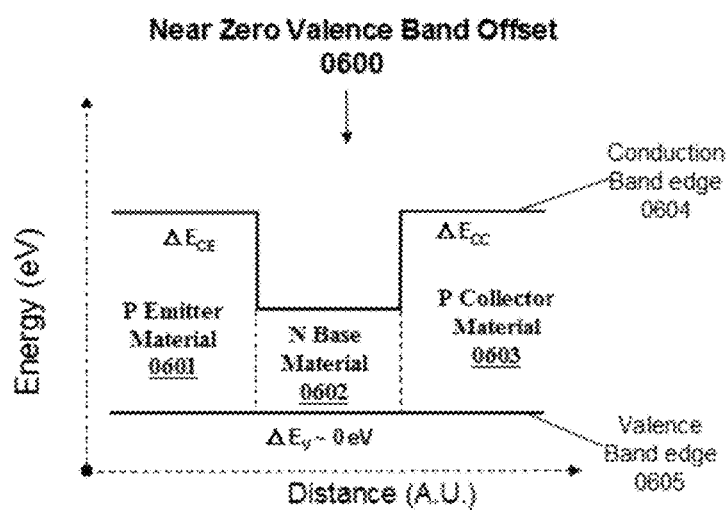
FIG. 6 shows a flatband edge diagram through a PNP transistor for optimized transport.

FIG. 6 shows the flatband energy diagram through a PNP heterojunction bipolar transistor 0600 for optimized transport. The figure shows the line-up of conduction band edge 0604 and valence band edge 0605 through PNP heterojunction transistor 0600. There is a zero valence band or near zero valence band edge offset $\Delta E_V$ from P emitter material 0601 to N base material 0602 to P collector 0603. The emitter-base conduction band offset is represented by $\Delta E_{CE}$ and the base-collector conduction band offset is $\Delta E_{CC}$. In physical situations it is desirable to have the smallest valence band offset that is possible from P emitter material 0601 to N base material 0602 to P collector 0603. Here the band gap energy of P emitter material 0601 is larger than the band gap energy of N base material 0602, where there is a large conduction band offset $\Delta E_{CE}$ between P emitter material 0601 to N base material 0602, and the junction is a heterojunction. The band gap energy P collector material 0603 can be less than, equal to, or greater than the band gap energy of N base material 0602. Generally the band gap energy of P collector material 0603 should be equal to, or greater than, the band gap energy of N-base material 0602. The greater the band gap energy of P collector material 0603 the better the breakdown voltage of PNP heterojunction bipolar transistor 0600. This is generally desirable for high power and robust devices. If P collector material 0603 is the same material as N base material 0602, there is a homojunction at the base-collector junction and a heterojunction at the emitter-base junction, and such a device is called a single heterojunction bipolar transistor device. If P emitter material 0601 and P collector material 0603 are the same, then the device is called a symmetric double heterojunction bipolar transistor device, and this results in a minimum in zero offset voltage in the measurement of the collector current vs. the collector-emitter voltage as a function of the stepped voltage bias of the base-emitter junction, which is desirable to improve the power added efficiency of PNP heterojunction bipolar transistor 0600. For robust and high power, one would like the collector band gap energy to be as large as possible. If the emitter material, the base material, and the collector material are all dissimilar the device would be called an asymmetric double heterojunction bipolar transistor device.

The PNP heterojunction transistor can promote efficient transport when there is zero or near zero valence band offset between emitter-base-collector. In a PNP device, the holes are key carriers that make up the collector current, and the base controls this hole current. The base alignment of the valence band offset can be desirable in some examples. Valence band energy discontinuities at the emitter-base or collector-base junctions can hinder hole transport.

The relationship of the conduction and valence band offsets for many semiconductors is well studied, and numerous values of the conduction band offsets $\Delta E_C$ and valence band offsets $\Delta E_V$ between dissimilar semiconductors (heterojunction) have been published in the literature.

Unlike homojunction bipolar transistors, heterojunction bipolar transistors (HBTs) allow for a higher base doping density ($>1\times10^{19}$ cm$^{-3}$) thus reducing the base resistance and maintaining current gain. For NPN HBTs, higher base doping density can occur as a result of the large valence band offset at the emitter-base junction. For PNP HBTs, higher base doping density can occur as a result of the large conduction band offset at the emitter-base junction.

Typically, one would like to have the highest doping density that is possible in the base. Typically the highest levels of base doping are greater than $1\times10^{19}$ cm$^{-3}$. High doping levels are typically greater than $1\times10^{18}$ cm$^{-3}$ range and typically low doping levels are in the $1\times10^{16}$ cm$^{-3}$ to $5\times10^{17}$ cm$^{-3}$ range. The high doping density in the base causes a reduction in the base sheet resistance thus allowing the transistor to have larger $F_{max}$ (e.g., the maximum frequency to get power gain out of the transistor). Also, by having high base doping one can reduce the thickness of the base and increase the $F_t$ (e.g., the transit frequency, time for carrier to go across base region). The relationship between transit frequency $F_t$ and the maximum oscillation frequency $F_{max}$ is as follows for an HBT: $F_{max}=(F_t/8\pi R_B C_{CB})^{1/2}$. The transit frequency $F_t$ is basically inverse of the time for the electron to traverse the emitter, base and collector. The parameters $R_B$ and $C_{CB}$ refer to the base sheet resistance and the capacitance of the collector-base junction. The parameter $F_{max}$ is the unity power gain frequency and indicates the maximum frequency with power gain from a device.

The reason why heterojunction bipolar transistors (HBTs) can be advantageous, is that heterojunction bipolar transistors (HBTs) allow for a higher base doping density ($>1\times10^{19}$ cm$^{-3}$) thus reducing the base resistance and maintaining current gain. For various choices of the emitter and base materials, it is possible to obtain large valence band offset $\Delta E_V$. This large valence band offset $\Delta E_V$ prevents the back injection of minority carriers into the emitter, thus keeping the gain of the HBT high (no degradation of the gain with high doping of the base material).

Additionally, in some examples for the base-collector junction, the base-collector breakdown voltage is set by the energy band gap of the collector material. Typically, one would like to have a low energy band gap base material (typically these are relevant semiconductors with band gaps less than 0.75 eV, like GeSn, Ge, InGaAs, GaAsSb) because that sets the turn-on voltage of the base-emitter junction—or the onset of transistor action. However, in a homojunction (base and collector materials are the same), a low energy band gap at the collector can result in a low base-collector breakdown voltage. Thus a large potential difference between the base and the collector junction could allow the transistor to have a low breakdown voltage which causes the transistor to be easily damaged thus hurting ruggedness. In a heterojunction bipolar transistor, it is possible to combine a low energy band gap base region with a large energy band gap collector region thus allowing for a large breakdown voltage. Heterojunctions transistor can be optimized utilizing optimized material for the emitter, base, and collector. Heterojunction bipolar transistors can optimize the emitter base collector regions to make high performance and high power transistors.

The characteristics and properties of the base and the base-emitter junction and the base-collector junction are the dominant factors that determine the electronic properties of bipolar and heterojunction bipolar transistors. Thus the utilization of a new type of base material like GeSn in these transistors allows for the development of vastly improved transistors for high speed and power efficient operation.

GeSn is a useful material for use as the base material for bipolar transistors because it can become a direct gap material at higher Sn %, which makes it a useful material for light emission. Thus GeSn in bulk form or GeSn quantum wells (QW) or GeSn quantum wires, or GeSn quantum dots (QD) can act as the active region for light emission in devices such as a light emitter, laser or transistor laser.

Lasers are devices that can produce intense narrowly divergent, substantially single wavelength (monochromatic), coherent light. Laser light of different wavelengths can be advantageously applied in many fields, including biological, medical, military, space, industrial, commercial, computer, and telecommunications.

Semiconductor lasers may utilize an active region, which may be formed with a homojunction (using similar materials), single or double heterojunction (using dissimilar materials), or with a quantum dot ("QD"), quantum wire, quantum well ("QW") or quantum cascade region. The energy transitions can occur from interband or inter-sub-band electronic states. The quantum well or quantum wire, or quantum dot structure may be formed when a low energy band gap semiconductor material is typically surrounded or confined by a larger bandgap semiconductor materials. Additionally, these quantum confined heterostructures can be type I, or type II or type III (broken energy alignment). The fundamental wavelength that characterizes quantum well (QW) or quantum dot (QD) is determined primarily by the thickness, composition, and material of the quantum well.

In order for lasing to occur, a laser device typically has a resonant cavity and a gain medium to create population inversion. In some highly efficient semiconductor laser examples, population inversion generally occurs with the injection of electrical carriers into the active region, and the resonant cavity is typically formed by a pair of mirrors that surround the gain medium. The method of injection of carriers can be divided into electrical injection of carriers and optical pumping for injection of carriers. Electrical injection is generally performed by an electrical current or voltage biasing of the laser and forms the basis of the electrical injection laser. Optical pumping typically uses incident radiation that allows the formation of electrons and holes in the laser. Additionally, these methods can be operated in a continuous wave (CW) pulsed, synchronous, or asynchronous modes.

Figure 7:
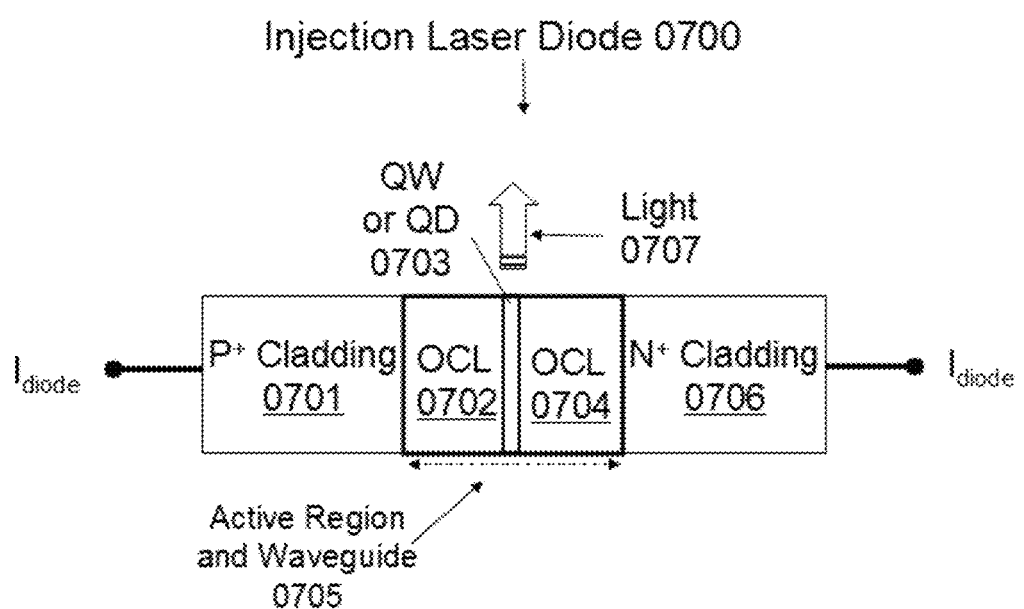
FIG. 7 shows a general configuration of an injection laser diode, with a quantum well or quantum dot active region.

FIG. 7 shows the general configuration of a PN junction laser or injection laser diode 0700, with a quantum well or quantum dot 0703 active region. This PN junction device operates on the principle of minority injection of carriers (electrons and holes, the $I_{diode}$ current) into the active region and waveguide 0705. The P$^+$ cladding 0701 region may serve as the injection of holes. N$^+$ cladding 0706 may serve as the injection of electrons. It can be possible when a low band gap material is placed inside a larger energy band gap, like the optical confinement layers OCL 0702 and OCL 0704, the formation of QW or QD 0703 can be formed. These QW or QD 0703 can serve as the active region for the collection of both electrons and holes and produces the inverted population necessary for laser operation. The wide band gap P+ cladding 0701 and N+ cladding 0706 semiconductors provide for the optical confinement because their index of refraction is generally lower than that of the optical confinement materials OCL 0702 and OCL 0704. The cladding layers also provide funneling of the electrical carriers to the QW or QD 0705 regions. Light 0707 can be produced by recombination of carriers in the QW or QD. Additionally, there are the optical confinement layers (OCL) which serve as the barrier to the QW or QD region thus providing for the quantum confinement, and also serves as the waveguide material. The OCL layers generally have band gap energies between that of the QW or QD and the wide band gap energy cladding layers. The combination of the QW or QD 0703 and the OCL 0702 and OCL 0704 form the active region and waveguide 0705 of the laser structure.

Figure 8:
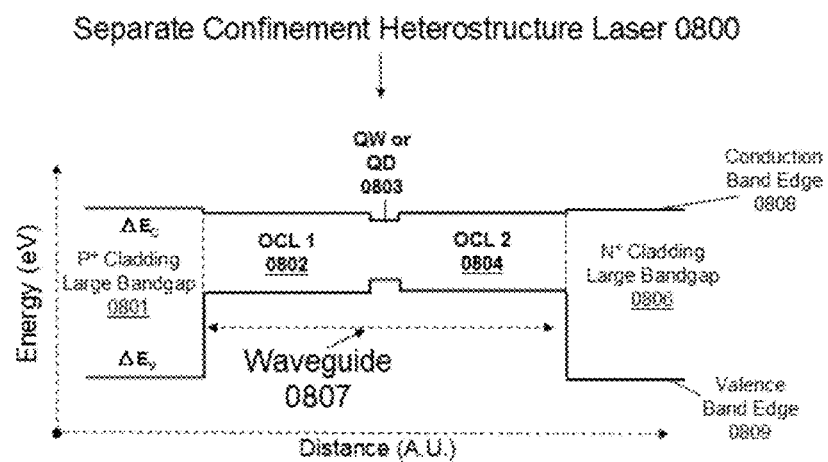
FIG. 8 shows a flat band energy diagram of a general configuration of a separate confinement heterostructure laser with an active QW or QD region which can be of the type I heterojunction band alignment.

FIG. 8 shows the exemplary flat band energy diagram showing the conduction band edge 0808 and the valence band edge 0809 of a separate confinement heterostructure (SCH) laser 0800 with an active QW or QD 0803 region. The OCL1 0802 and OCL2 0804 form the barrier layers to the QW or QD 0803 which allows for quantum confinement and can be of the type I heterojunction band alignment. Such a structure provides efficient recombination of the carriers and good optical confinement of the light produced from the recombination of the carriers. The P+ cladding large bandgap 0801 and the N+ cladding large bandgap 0806 provides for minority carrier injection and funnels the carriers into the waveguide region ultimately recombining in the QW or QD 0803 active region. The cladding layers form the boundary for the waveguide 0807 with the OCL1 0802 and OCL2 0804 regions thus providing for efficient confinement of light. In this design the P+ cladding large bandgap 0801 and N+ cladding large bandgap 0806 have the largest bandgap energies in the device structure. Next the OCL1 and OCL2 layers have the next largest bandgap energies. Finally the QW or QD 0803 materials have the smallest bandgap energies. In this design the P+ cladding large bandgap 0801 and OCL1 0802 has a type I heterojunction alignment, and in this design the N+ cladding large bandgap 0806 and OCL2 0804 also has a type I heterojunction alignment. Various configuration of the SCH are possible for optimization of the laser. Note that though the figure shows only one QW or QD region, but multiple QW or QD regions can be used, if higher efficiencies are wanted. Typically such a structure is inserted into a resonant cavity for the light amplification that is required for laser operation.

Two common types of semiconductor lasers are in-plane, also known as edge emitting or Fabry Perot lasers (also includes distributed feedback lasers), and surface emitting also known as vertical cavity surface emitting lasers ("VCSELs"). Edge emitting lasers emit light from the edge of the semiconductor wafer whereas VCSELs emits light from the surface of the laser. In addition, for the edge emitter the resonant cavity is typically formed with cleaved mirrors at each end of the active region.

Figure 9:
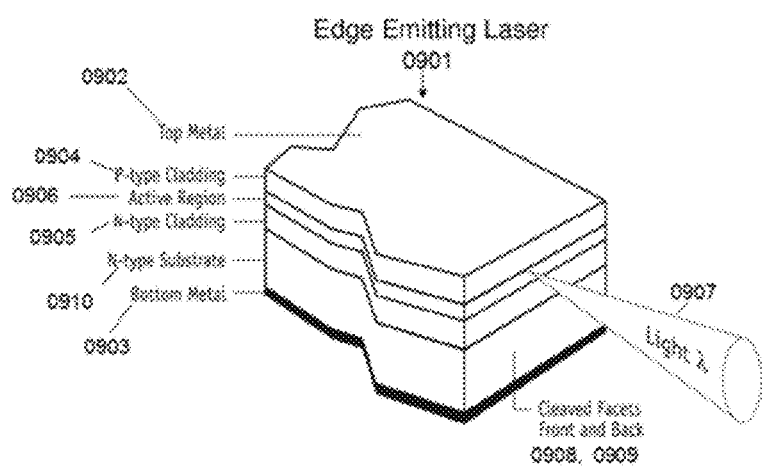
FIG. 9 shows an example of a cut away device depiction of an edge emitting injection diode laser.

FIG. 9 is a perspective schematic of a typical edge emitting injection diode laser or in-plane semiconductor laser 0901. The edge emitting laser 0901 can comprise a substrate 0910 with an active region 0906 disposed between a P-type cladding layer 0904 and an N-type cladding layer 0905. Cleaved facets on the front 0908 and on the back 0909 of the laser typically form a resonant optical cavity. The order of the layers may not be restricted as described above. To activate the laser, a bias current can be applied to top 0902 and bottom 0903 metal contacts. Upon application of the bias to the laser, light of a wavelength λ 0907 is typically emitted from the edge of the laser. An exemplary edge emitting semiconductor laser may include a GeSn quantum well active region material 0906 with GaAs barriers for near-infrared (IR) light emission 0907, or their equivalents. The QW active region of the structure is typically capable of emitting a designed center wavelength over a wide range of possible wavelengths depending on a number of device design parameters including but not limited to the thickness and composition of the layer materials. Being able to tune light over the wide range of wavelengths could be useful for a variety of applications.

The design and fabrication of this type of edge emitting laser structure may utilize consideration of the material properties of each layer within the structure, including energy band structure and band alignments, electronic transport properties, optical properties, systems design, and the like. An edge emitting laser such as the exemplary one described above may satisfactorily be wavelength tuned in the manner previously described.

It may also be possible to omit the top metal 0902 and the bottom metal 0903 and optically pump the edge emitter from the top, bottom or side with another laser that may have an emission wavelength shorter than the edge emitter 0901. This may simplify the process because metallization of the laser 0901 can be avoided.

The second type of semiconductor laser, VCSELs, emits light normal to the surface of the semiconductor wafer. The resonant optical cavity of a VCSEL may be formed with two sets of distributed Bragg reflector (DBR) mirrors located at the top and bottom of the laser, with the active region (which may be a quantum well or quantum wire, quantum dot region), sandwiched between the two Bragg reflectors. Note the designation of N DBR means that the DBR is doped N-type.

Figure 10:
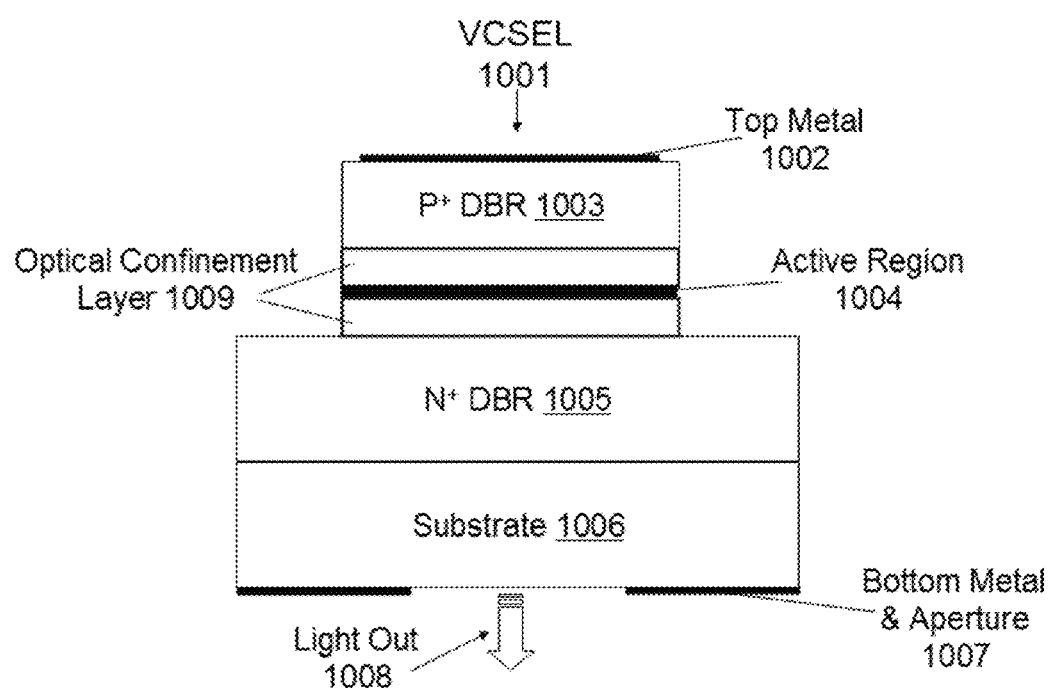
FIG. 10 shows an example of a cross-sectional device depiction of a VCSEL, where light is coming out of the bottom, but could be designed so that light comes out of the top.

FIG. 10 is an exemplary schematic of the side view of a vertical cavity surface emitting laser ("VCSEL") 1001. A substrate 1006 may have deposited layers of P-type distributed Bragg reflectors ("DBR") material 1003, and N-type distributed Bragg reflector material 1005. An active region 1004 is inserted in the optical confinement layer 1009 then sandwiched between the P DBR 1003 and the N DBR 1005 structures. Metal contacts 1002, 1007 are provided for applying a bias to the laser. The P-type DBRs 1003 and N-type DBRs 1005 form the resonant optical cavity. The order of the layers is not restricted as described above. Upon application of a current bias to the laser, light 1008 is typically emitted from the surface of the laser, which can be the bottom or top of the laser. A VCSEL laser 1001 such as the exemplary one described above may allow laser emission from the surface of the structure rather than from the side, or edge, as in the edge emitting laser of FIG. 9. Though the diagram of an example of a VCSEL shows the light is coming out of the bottom, but could be designed so that light comes out of the top.

It may also be possible to omit the top metal 1002 and the bottom metal 1007 and optically pump the VCSEL 1001 from the top or bottom with another laser that may have an emission wavelength shorter than the VCSEL 1001. This may simplify the process because metallization of the laser 1001 can be avoided.

These lasers can be called diode lasers or injection diode lasers and are two terminal devices. The HBT are three terminal devices. It is possible to combine both structures to form the light emitting heterojunction bipolar transistor which can act as a three terminal device, but also can emit light. Such a device would allow for integrated circuit designs that could transmit data optically and act as high speed switching transistors, all in a single device. Because the light emitting transistor is a three terminal device, the extra terminal allows the biasing of the base collector junction to quickly collect the charge carriers and, thereby out performing laser diodes and/or two terminal devices.

For both the edge emitting laser 0901 and the VCSEL 1001, the input control to the lasers may be a current bias, voltage bias or optical pump techniques as described. Furthermore, both electrical injection and optical pumping can be operated in continuous wave (CW), pulsed, synchronous, or asynchronous modes of operation.

The light emitting transistor laser could comprise a bipolar transistor with a direct gap quantum well or quantum dot or quantum wire inserted in the base/barrier region. The quantum well or quantum wire or quantum dot forms the collection region (active region) for electrons and holes to recombine to generate light.

In the following figures or tables, $N^+$ refers to high N-type doping, $N^-$ refers to moderate N-type doping, $P^+$ refers to high P-type doping, $P^-$ refers to moderate N-type doping, and UID refers to unintentional doping.

Figure 11:
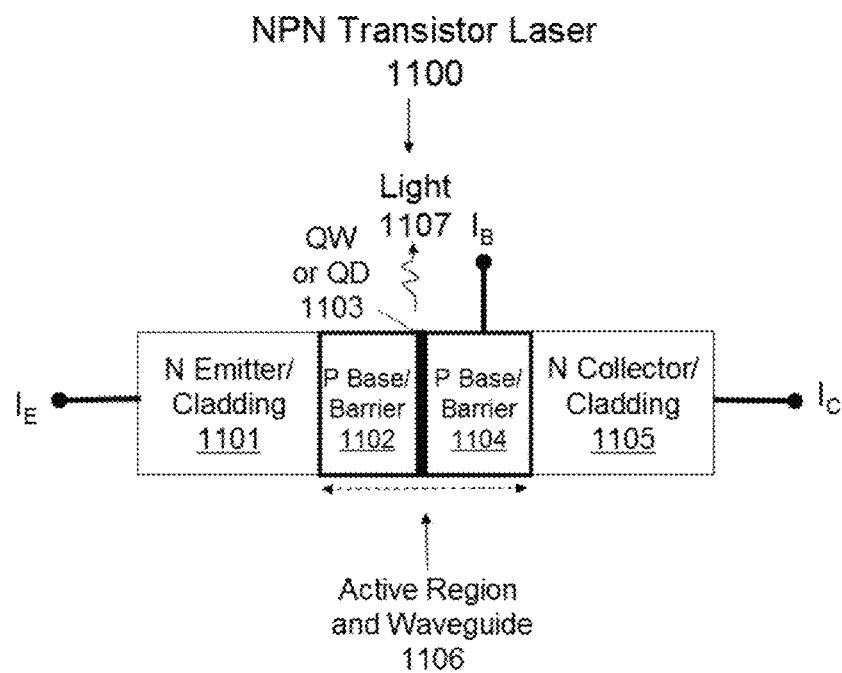
FIG. 11 shows a simple diagram of an NPN transistor laser showing the three terminal device configuration with a corresponding free carrier type designation, with a quantum well or quantum dot active region in the base.
Figure 12:
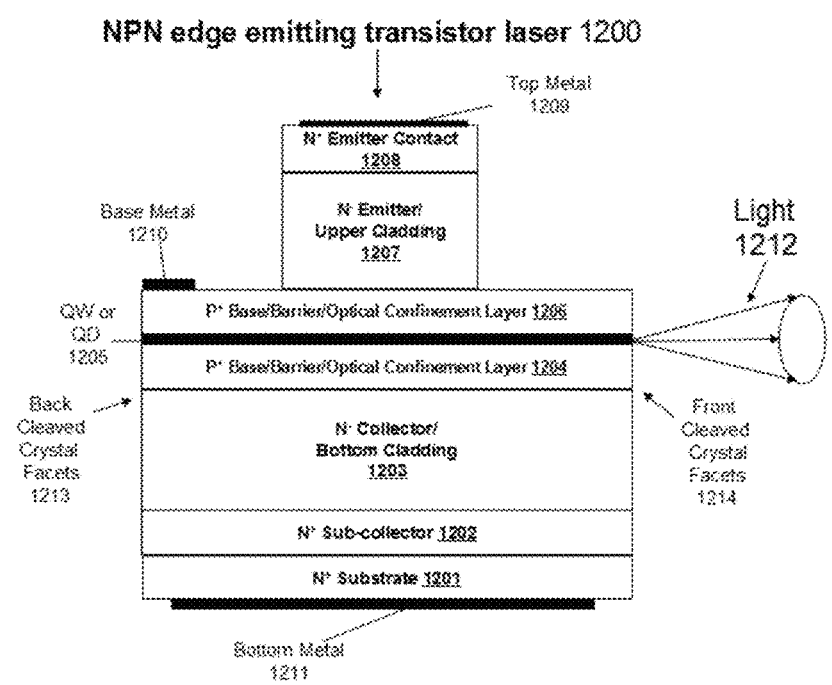
FIG. 12 shows a possible cross-sectional device depiction of an NPN edge emitting transistor laser or light emitting structure.

FIG. 11 shows a simple diagram of an NPN transistor laser 1100 showing the three terminal device configuration with the corresponding emitter-base-collector designation, with a quantum well or quantum dot active 1103 inserted into P base/barrier 1102 and 1104. Here emitter 1101 and the collector 1105 can form the cladding regions for optical confinement of the light 1107 produced by recombination of the carriers in the quantum active region. The P base forms the barrier region for the quantum well, quantum wire or quantum dot and also the waveguide material. Because the transistor laser acts as a transistor and a laser, the emitter-base-collector needs to have dual functions for the electrical and optical. For an NPN HBT laser the emitter has to inject electrons into the base and also form the cladding layer for light confinement as designated by N emitter/cladding 1101. The base region should be heavily P-type doped and forms the barrier to the QW or QD 1103 material and thus is designated by the P base/barrier 1102 and P base/barrier 1104. The P base/barrier 1102 and 1104 and the QW or QD 1103 form the active region and the waveguide 1106 of the NPN transistor laser 1100. To additionally form for example a light edge emitting transistor laser a resonant cavity is typically formed by cleaving mirrors at the front and back facets of the crystal to optically amplify the photon population FIG. 12 shows a cross-sectional device depiction of an NPN edge emitting transistor laser 1200. The device comprises an $N^+$ substrate 1201 as the starting point. A heavily doped $N^+$ sub-collector 1202 is grown on the $N^+$ substrate 1201. Then a dual purpose lightly doped N– collector/bottom cladding 1203 layer is formed. Then a $P^+$ base/barrier/optical confinement layer 1204 is grown and this also starts the formation of the waveguide region for the confinement of the light. Next the QW or QD 1205 active region is grown, and then on top of this layer is the $P^+$ base/barrier/optical confinement layer 1206 which finishes the waveguide portion of the device. On top of this layer is then grown the $N^-$ emitter/upper cladding 1207 which provides the cladding finishing up the device. Metal contacts are placed at the $N^+$ emitter contact 1208 via the top metal 1209 contact, the $P^+$ base/barrier/optical confinement layer 1206 via the base metal 1210, and the $N^+$ substrate 1201 via the bottom metal 1211. The resonant cavity is formed by the front cleaved crystal facets 1214 and the back cleaved crystal facets 1213. Light 1212 is emitted from the front of the device. The device is biased in a standard NPN transistor configuration, but because of the inclusion of the QW or QD 1205, $P^+$ base/barrier/optical confinement layer 1204 and 1206 and the N-collector/bottom cladding 1203 and $N^-$ emitter/upper cladding 1207, the device will form a light emitting or laser transistor when properly designed. A typical way of making this structure is to use epitaxial techniques to grow the basic layered structure then use standard device processing techniques to fabricate the full device. The laser includes quantum well or quantum wire or quantum dot inserted into a base region of the heterojunction bipolar transistor. The laser can require a resonant cavity to get optical gain, and typically this can formed from the front and back cleaved facets of the semiconductor crystal wafer.

Vertical emission of light normal to the surface of the semiconductor wafer is also a useful configuration for transistor lasers. The resonant optical cavity of a vertical transistor laser may be formed with two sets of distributed Bragg reflector (DBR) mirrors located at the top and bottom of the laser, with the active region (which may be a quantum well or quantum wire, quantum dot region), sandwiched between the two Bragg reflectors.

Figure 13:
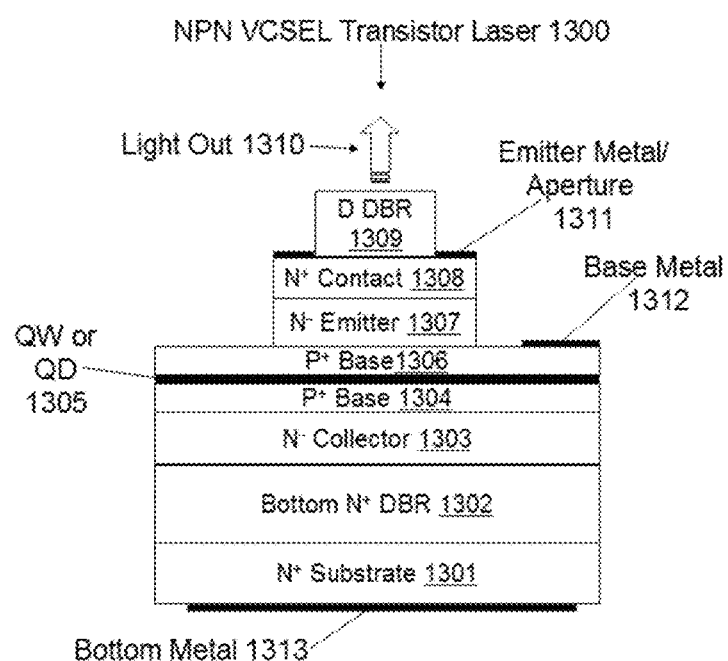
FIG. 13 shows an example of a possible cross-sectional device depiction of an NPN VCSEL transistor laser where light is coming out of the top, but also could be designed so that light comes out of the bottom.

FIG. 13 shows a cross-sectional device depiction of an example of a possible configuration of a NPN VCSEL transistor 1300, where the light is coming out of the top, but also could be designed so that light comes out of the bottom. The device can be grown on an $N^+$ conducting substrate 1301, with the growth of a bottom $N^+$ DBR 1302 stack which forms the bottom mirror of the device. $N^-$ collector 1303 is then grown on the bottom mirror. $P^+$ base 1304 is then grown on the $N^-$ collector 1303, and also forms the barrier for QW or QD 1305 active region. QW or QD 1305 is deposited on $P^+$ base 1304, and then $P^+$ base 1306 is deposited on QW or QD 1305, finalizing the barrier material to the active region for quantum confinement effects. $N^-$ emitter 1307 is then grown on $P^+$ base 1306. Then an $N^+$ contact 1308 is deposited on $N^-$ emitter 1307. Finally a dielectric mirror stack D DBR 1309 is deposited on $N^+$ contact 1308. VCSEL transistor laser 1300 is processed using standard techniques of mesa etch and metallization to form the final structure, where metal contacts emitter metal/aperture 1311 is deposited on $N^+$ contact 1308. Emitter metal 1311 forms an aperture for light out 1310. Base metal 1312 is deposited on $P^+$ base 1306, and bottom metal 1313 is deposited on $N^+$ substrate 1301. NPN VCSEL transistor laser 1300 is operated as a standard bipolar device.

GeSn is alloy semiconductor of the constituent semiconductors germanium (Ge, which is an indirect semiconductor, with an energy band gap of 0.66 eV) and alpha tin or cubic tin (Sn which is zero energy gap direct semiconductor). GeSn can be an indirect or direct energy band gap semiconductor depending on the alloy composition. A direct gap semiconductor has its conduction band minimum energy and valence band energy maximum occur at the same crystal momentum (k-space). If the location of the conduction band energy minimum and the valence band energy maximum occurs at different crystal momentum (or different location in k-space), it is an indirect semiconductor. Direct gap semiconductors are highly efficient for radiative recombination of electrons and holes, thus most light emitting devices are fabricated from direct gap semiconductors.

GeSn semiconductors have been grown epitaxially by metalorganic chemical vapor deposition (MOCVD), molecular beam epitaxy (MBE), ion implantation follow by anneal, by pulse laser deposition (laser ablation), but, additionally, liquid phase epitaxy, vapor phase epitaxy and various other epitaxial growth techniques can be used to grow the GeSn material described herein. The GeSn layers have been grown up to 20% Sn content. Both N-type and P-type doping has been achieved in GeSn layers.

Figure 14:
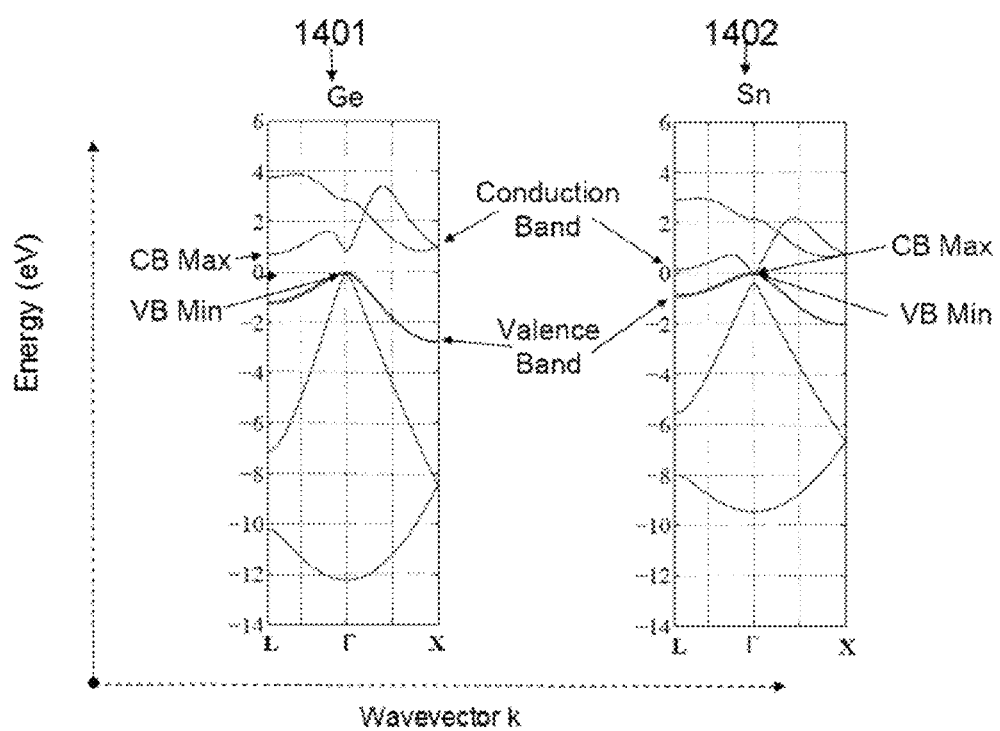
FIG. 14 shows energy band structure diagrams for Ge and Sn semiconductor materials.

FIG. 14 shows the energy band structure diagrams for the semiconductors Ge 1401 and Sn 1402. The vertical axis is the Energy with units of (eV) and the horizontal axis is the Wavevector k. The energy band structure diagrams depict the available or unavailable (forbidden gap) energy levels for the charge carriers in the semiconductor. The plot shows energy on the vertical scale and the crystal momentum direction on the horizontal scale. There are significant crystal momentum points "X," "Γ" (Brilloun zone center) and "L." Ge 1401 is an indirect gap semiconductor because the conduction band minima is at the "L" point and the valence band maximum is at the "Γ" point. Sn 1402 is a semimetal or zero direct gap semiconductors with the conduction band minima and valence band maxima at the "Γ" point. As Sn is added to Ge, the conduction band energy at the "Γ" point moves down faster than the conduction band energy at the "L" point, and thus, turning GeSn at some alloy composition turns into a direct gap semiconductor.

The direct to indirect transition can occur about 7% Sn in GeSn, but can be observed up to 11% Sn. The energy band gap at 7% Sn is about 0.585 eV, this corresponds to a wavelength of about 2370 nm. Ge is a group IV semiconductor and though it is an indirect semiconductor, it has some properties that are advantageous. Ge 1401 has a local minimum at the "Γ" point of the conduction band. The lowest energy point in the Ge 1401 conduction band is at the "L" point and is only 0.14 eV lower than the "Γ" point a room temperature. Various methods can be used to lower the gamma point below the L point such as introducing biaxial tensile strain, or heavily N-type doping the Ge. However, by adding Sn to Ge, it is possible to lower the band gap but also form a direct gap semiconductor. In addition, one could employ both tensile strain and adding Sn to Ge to make a direct gap semiconductor.

In some examples heterojunction bipolar transistors (HBT) can be a desirable device for greater power handling capability, higher power efficiency, and lower signal distortion in some examples. The fabrication of a GeSn based HBT structure enables a new transistor technology that can significantly outperform SiGe, GaAs, InP, and GaN transistors in high-power, high-frequency applications. The new HBT semiconductor structure described herein exhibits a large valence band discontinuity between the emitter and base; has a low energy band-gap base (the term low energy band gap base typically refers to the relevant semiconductors with band gaps less than 0.75 eV, like GeSn, Ge, InGaAs, GaAsSb); and a second (double) heterojunction can be inserted between the base and collector with a good breakdown electric field. These attributes positively can impact several key device parameters such as collector-emitter breakdown voltage, DC current gain, and power gain cutoff frequency ($F_{max}$). The low band-gap GeSn base can significantly decrease transistor turn-on voltage and thereby increase the power added efficiency of the device.

Figure 15:
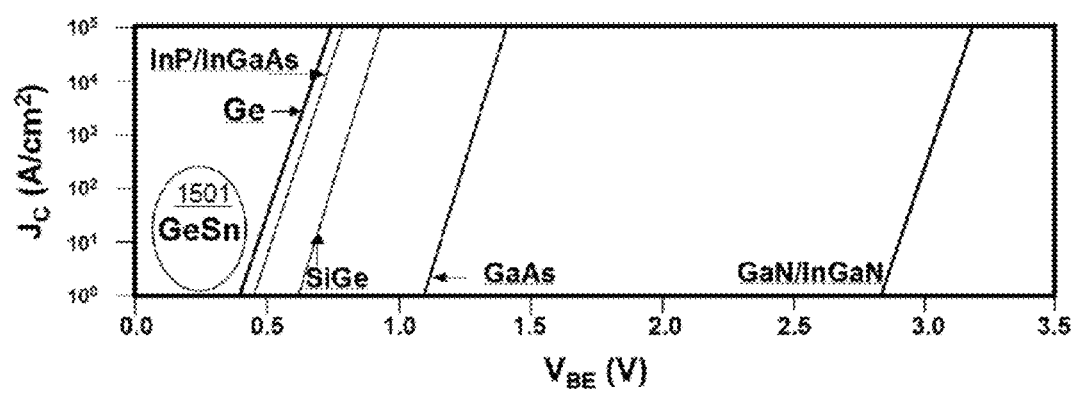
FIG. 15 shows a graph of collector current density $J_C$ vs. turn-on voltages ($V_{BE}$) of various HBT material systems.

FIG. 15 shows a graph of the collector current density $J_C$ vs. the turn-on voltages ($V_{BE}$) of various HBT material systems. The figure shows a plot of the collector current density $J_C$ (A/cm$^2$) vertical scale versus base-emitter voltage $V_{BE}$ (V), horizontal scale. The plotted characteristics (ideal) for several different heterojunction bipolar transistor (HBT) technologies are shown. The GeSn HBT structure described herein has the lowest turn-on voltage 1501 of the technologies shown of Ge, InP/InGaAs, SiGe, GaAs, GaN/InGaN.

For NPN heterojunction transistors, it is generally desirable for the base region to be heavily P-type doped. This allows for the base sheet resistance to be minimized thus allowing for high frequency operation of the transistor. The GeSn base can be heavily doped P-type in some embodiments. When the hole concentration as measured by Hall Effect, high doping levels (>1×10$^{19}$ cm$^{-3}$) can be achieved in GeSn.

Figure 16:
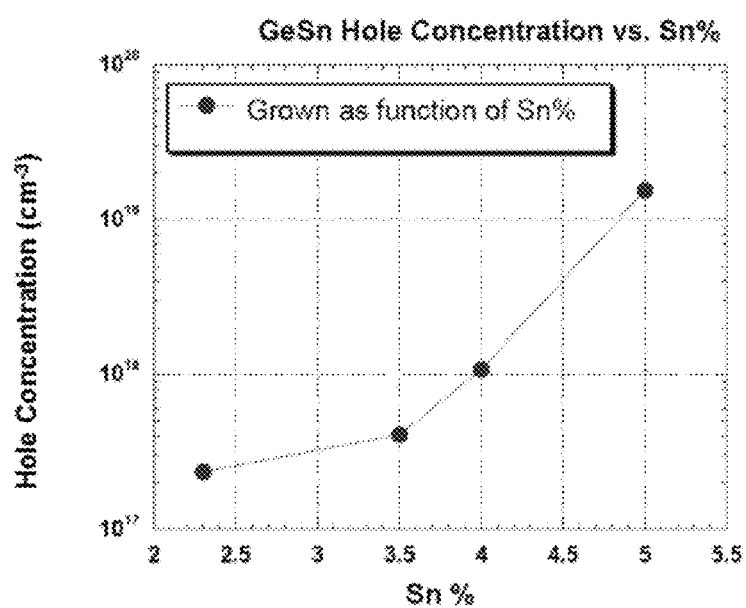
FIG. 16 shows the hole concentration of GeSn films as a function of Sn %, as measured by Hall effect.

FIG. 16 shows the hole concentration of GeSn films as a function of Sn %, as measured by Hall effect. The vertical axis is the hole concentration (cm$^{-3}$) and the horizontal axis is the Sn %. From the hole concentration data vs. Sn % of FIG. 16, it is readily seen that GeSn can be P-type doped at the highest levels of base doping which are greater than 1×10$^{19}$ cm$^{-3}$. Additionally, GeSn can achieve a large hole mobility (Ge hole mobility is about 1800-2000 cm$^2$/Vs, as compared to GaAs hole mobility 400 cm$^2$/Vs) which is a precondition for making the base region thin.

By utilizing GeSn in the base of a heterojunction bipolar transistor, one can lower the turn-on voltage because the bandgap of GeSn is less than that of Ge, which is less than that of the materials systems GaN, GaAs, Si, InP, GaP, AlAs, and Ge. Additionally, at low Sn content, GeSn has all the advantages that a Ge base material adds. For an NPN structure, Ge is desirable for the base region because it can be heavily doped P-type, it has the highest hole mobility (desirable for reducing the resistance of the base), also this hole mobility can be increased by applying tensile or compressive strain, and its conduction band alignment is favorable with numerous semiconductors. At about 7% Sn and greater, GeSn goes from an indirect semiconductor to a direct gap semiconductor, though this indirect to direct transition can occur at Sn percentages up to 11%.

Figure 17:
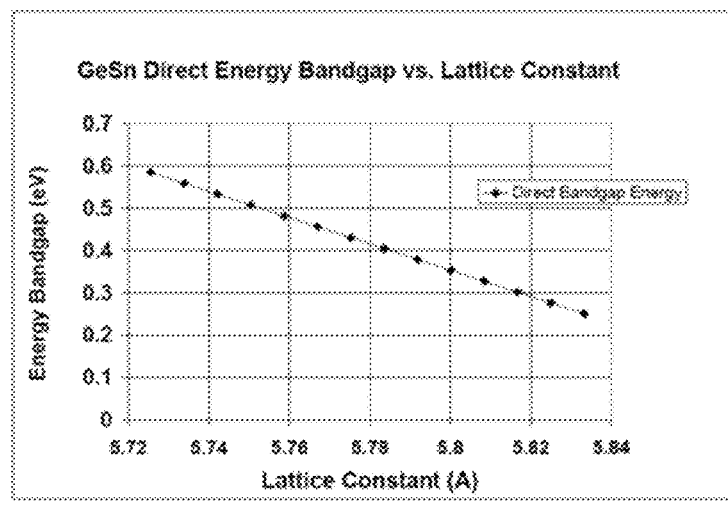
FIG. 17 shows a representative graph showing a GeSn direct band gap energy vs. its lattice constant.

FIG. 17 shows a representative graph showing the GeSn direct band gap energy vs. lattice constant. The vertical axis shows the values of the Energy Bandgap (eV) and the horizontal axis shows the Lattice Constant (Å). The dots and the line through the dots represent GeSn direct gap energy as a function of its lattice constant. Because the data is for the direct band gap transition, the first data point is near 7% Sn and the last is near 20% Sn. Ge has an indirect bandgap energy of 0.66 eV. GeSn is indirect up to about 7% Sn then becomes a direct gap semiconductor with an energy gap of 0.585 eV and a lattice constant of about 5.725 Å, and the band gap energy typically reduces to about 0.25 eV at 20% Sn with a lattice constant of about 5.835 Å. The emission wavelengths that can occur in bulk direct gap GeSn range from about 2370 nm at 7% Sn to 5540 nm at 20% Sn.

Figure 18:
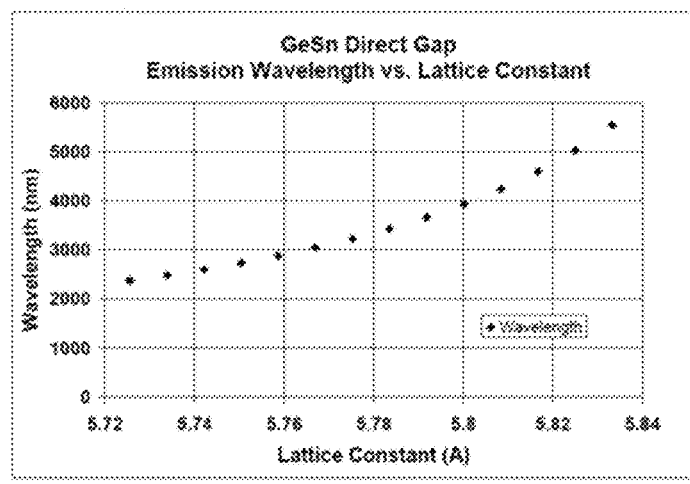
FIG. 18 shows a range of wavelengths that can be achieved by direct gap GeSn.

FIG. 18 shows a replot of FIG. 17 showing a representative graph showing the GeSn emission wavelength vs. lattice constant. The vertical axis shows the values of the Wavelength (nm) and the horizontal axis shows the Lattice Constant (Å). The dots and the line through the dots represent GeSn possible emission wavelength as a function of its lattice constant. For on-chip communications 1000 nm to 3000 nm is acceptable. For telecommunications applications, the typical wavelengths used are 1300 nm and 1550 nm. These wavelengths can be achieved by using quantum well or quantum dot GeSn materials. These low dimensional structures like two dimensional "2D" QW, one dimensional "1D" quantum wires, or zero dimensional "0D" quantum dot structures increase the light emission energy due to quantum confinement effects.

It should be noted that GeSn is an alloy semiconductor and that Sn percentages can be varied from 0%≤Sn %≤20%.

GeSn materials are useful for quantum confined structures. Quantum confined structures such as quantum wells (QWs), quantum wires, and quantum dots (QDs) structures add a new degree of freedom in making light emitting materials. Because GeSn can be become a direct gap material at 7% to 11% Sn content, and it would be useful to have possible wavelengths in the 1000 to 3000 nm range because this covers the telecommunications and fiber optics networks. One method of taking GeSn bulk material to get energies that cover this wide range is to use quantum well, quantum wire, or quantum dot technologies, because the light emission is then dependent on quantum confinement or quantum size effects.

QDs form artificial semiconductor atoms with electronic "shells" that can be engineered to control their light absorption properties. Besides their novel electronic properties, QDs also have interesting material properties; their 3-dimensional shape allows greater strain relief at the QD surfaces than for planar growth. GeSn QDs can be grown on Si without creating dislocations. Absorption over broad wavelengths comes from an ensemble of QDs that have sizes that vary statistically. Also because GeSn at low Sn content starts as indirect material and then becomes a direct gap material at higher contents, it is possible to produce efficient light emission in QD structures with indirect gap semiconductors. The limitations of the indirect nature of the bandgap GeSn (Sn %<7%) can be overcome by the formation of low-dimensional structures such as quantum dots because this method uses the spread in k-space caused by the quantum confinement to circumvent the indirect bandgap problem of the GeSn. Thus QDs are useful for producing light emission in direct and indirect gap materials.

The use of GeSn as the active layer of the quantum dot laser has significant advantages. The greater than 4% mismatch between GeSn and Si allows for the self-assembly of Ge islands by the Stranski-Krastanov growth mode (strained layer epitaxy). This 3-dimensional growth mode is a method of making zero dimensional structures (i.e. QD). For QDs to effectively provide light emission, the QD material is generally of a lower energy band gap than the barrier material. The relatively low GeSn bandgap energy makes it a desirable starting point for absorption in the near-IR1 and mid-IR. It is possible by controlling the size of the Ge quantum dots, to change the interband (electron-hole recombination) to allow for energy transitions in the near-IR to mid-IR. The GeSn QD with Si barriers can be of type II band alignment.

Figure 19:
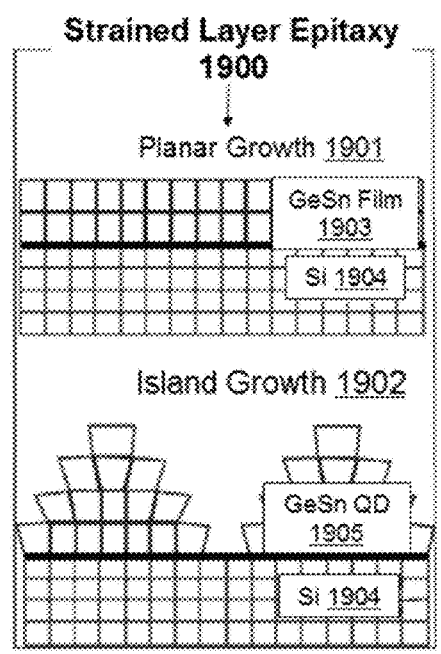
FIG. 19 shows a formation of quantum dot structures resulting from self-assembled GeSn quantum dots by the Stranski-Krastanov (SK) method that transitions from two dimensional planar growth to island growth.

FIG. 19 shows the formation of quantum dot structures are a result of the ability of self-assembled GeSn by the Stranski-Krastanov (SK) or strained layer epitaxy 1900 method that transitions from two dimensional planar growth 1901 to island growth 1902. In SK growth methodology a larger lattice constant semiconductor GeSn film 1903 is grown on a semiconductor with a smaller lattice constant Si 1904. Under proper conditions two dimensional planar growth 1901 starts but quickly transitions to island growth 1902 thus forming the GeSn QD 1905 structure. Thus when a larger lattice constant semiconductor is grown on a semiconductor with a smaller lattice constant, when the critical thickness of the larger lattice constant layer is exceeded QDs may form. The lattice mismatch between the two layers should be generally greater than 2% for dot formation. The lattice mismatch of GeSn to grown on Si with a lattice constant of 5.43 Å, starts off at a 4% lattice mismatch for low Sn % and can reach up to at 20% Sn content a 7% lattice mismatch with Si. If SiGe layers are used as the barrier depending on the Ge content in the SiGe the lattice mismatch could be significantly reduced. Typically quantum dots are less than 15 nm, but they can range from 1 to 100 nm in size. Strained layer epitaxy 1900 is a methodology for growing quantum structures with dissimilar lattice constant materials. After the 3D growth of the QD, the QD layer usually has a barrier layer grown on top to finalize the quantum confinement.

Figure 20:
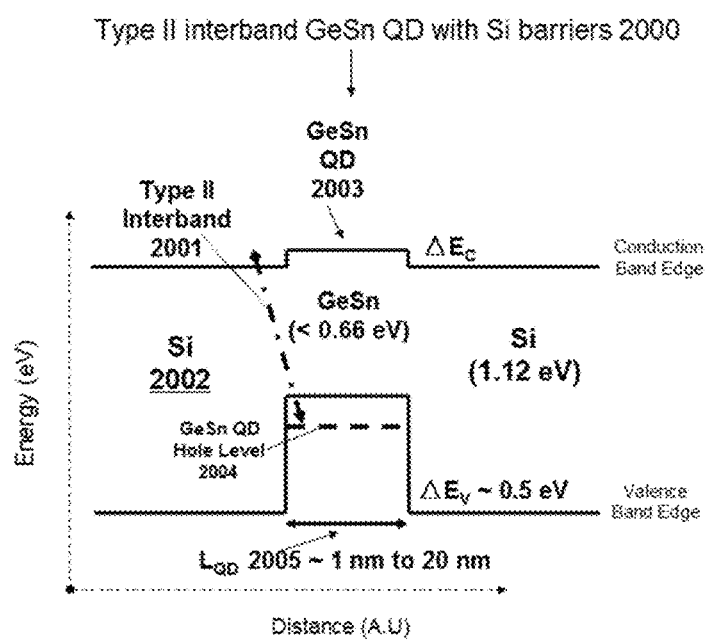
FIG. 20 shows a flat band energy diagram of a GeSn quantum dot to Si which can be of a type II heterojunction band alignment.

FIG. 20 shows a flat band energy diagram of type II interband GeSn QD with Si barriers 2000. The GeSn QD 2003 to Si 2002 heterojunction which can be of a type II heterojunction band alignment but at higher Sn % may become type I alignment. The figure shows a type II interband 2001 transition from the conduction band of the Si 2002 to the GeSn QD hole level 2004. The energy band gap is indicated in parenthesis below the material of interest. These type II interband 2001 transitions allow the possibility of light emission. Type II energy band alignments allow for emission energy levels that can be the closest to the energy band gap of the bulk semiconductor. Note the size $L_{QD}$ 2005 of the GeSn QD 2003 determines the energy difference of the type II interband transition. By changing the size $L_{QD}$ one can change the emission wavelength of the structure.

Figure 21:
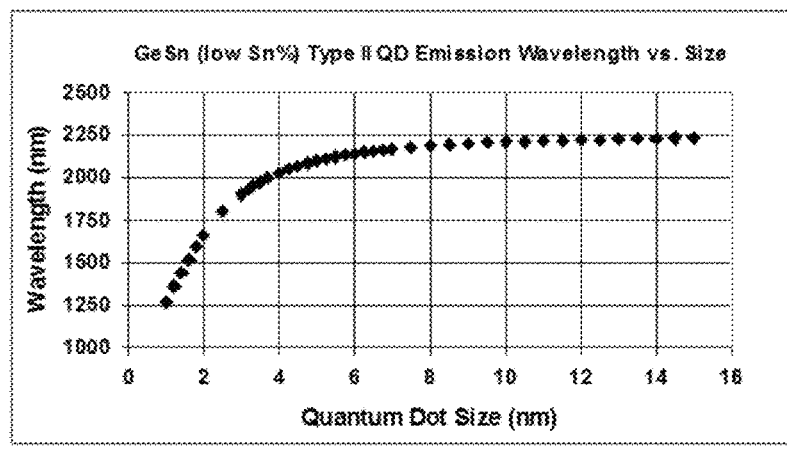
FIG. 21 shows a possible range of emission wavelengths that are achievable in a type II GeSn quantum dot heterostructure with Si barriers. This possible data is for low Sn % GeSn alloys.

FIG. 21 shows the possible range of emission wavelengths that are achievable in a type II GeSn quantum dot heterostructure with Si barriers. The vertical axis is the wavelength (nm). The horizontal axis is the Quantum dot size (nm). This possible data represents the case for low Sn % GeSn alloys. The graph shows that emission wavelengths achievable depend on the size of the quantum dot. Note the wavelengths are in the range of telecommunications. If the Sn % is increased the wavelengths achievable will get longer.

A type I heterostructure band alignment can occur for a GeSn QD if the substrate of interest is SiGe, because the addition of Ge to Si barriers, altering the Si band structure. The addition of Ge into Si increases the lattice constant, thus SiGe has a larger lattice constant than Si. Thus it is possible to obtain higher Sn % GeSn QD on SiGe because the SiGe lattice constant is larger than the Si lattice constant.

Figure 22:
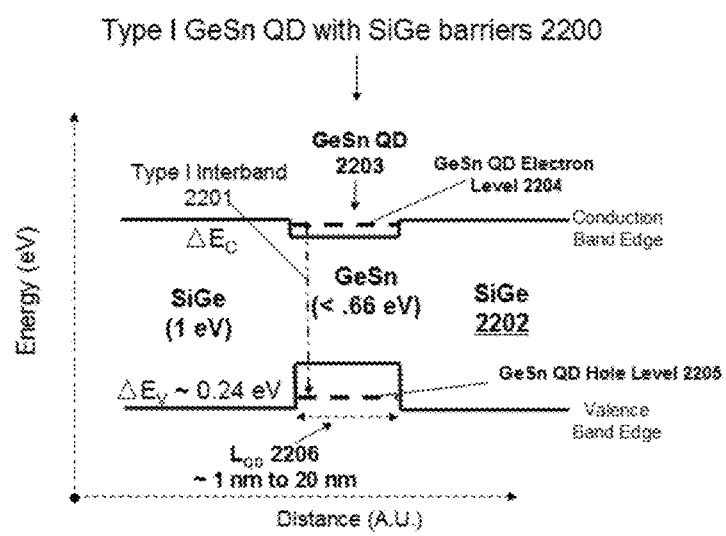
FIG. 22 shows a flat band energy diagram of GeSn quantum dot with SiGe barriers which can be of type I alignment.

FIG. 22 shows type I alignment of the GeSn QD with SiGe barriers 2200. The flat band energy diagram of GeSn QD 2203 with SiGe 2202 barriers which can be of type I alignment. The figure shows a type I interband 2201 transition from the conduction band of GeSn QD electron level 2204 to the GeSn QD hole level 2205. These type I interband 2201 transitions allow the possibility of light emission. Note the size $L_{QD}$ 2206 of the GeSn QD 2203 determines the interband transition energy. Because the arrangement is of a type I heterostructure the emission energies that can be achieved are typically higher than in a type II heterostructure. It is straightforward to calculate the range of wavelengths achievable in the GeSn quantum dot with SiGe barriers. Basically the emission wavelengths that can be achieved for a type I alignment are shorter than that of type II QD heterostructures. By utilizing SiGe 2202 one can change the Ge content of the SiGe thus changing the properties of the SiGe barrier layer to the GeSn QD 2203, thus in this structure the emission wavelengths achievable depends on the QD size $L_{QD}$, the ratio of Ge to Sn in the GeSn 2203 material, and the ratio of Si to Ge in the SiGe 2202 barrier layer. If the Ge content is high enough (greater than 50%) in the SiGe barrier it can be possible to grow GeSn in a planar growth mode thus forming two dimensional growth or QWs.

Figure 23:
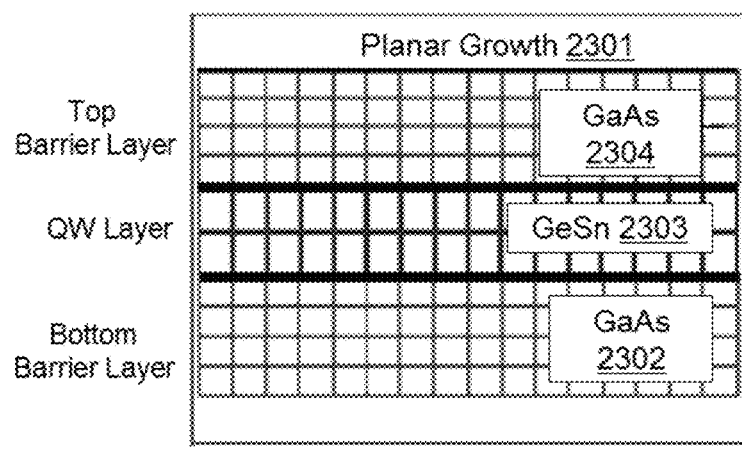
FIG. 23 shows a methodology of planar growth of a QW region on top of a barrier layer, and then growth of another barrier layer on top of the QW layer.

The formation of QWs are more straightforward because the materials are grown in a planar structure, and the QW can be coherently strained or near latticed matched. FIG. 23 shows the methodology of planar growth 2301 of the GeSn 2303 QW region on the GaAs 2302 bottom barrier layer. GaAs 2302 bottom barrier layer has a larger lattice constant then the GeSn 2303. But for low Sn % that GeSn 2203 can be grown coherently or pseudomorphic on the GaAs 2302. To finalize the QW layer a GaAs 2304 top barrier layer is grown on the GeSn 2303 QW layer. Note that the barrier layer generally has a larger bandgap energy then the QW layer. The thickness of the QW region and the band alignment to the barrier materials determine the allowable energy transitions.

Figure 24:
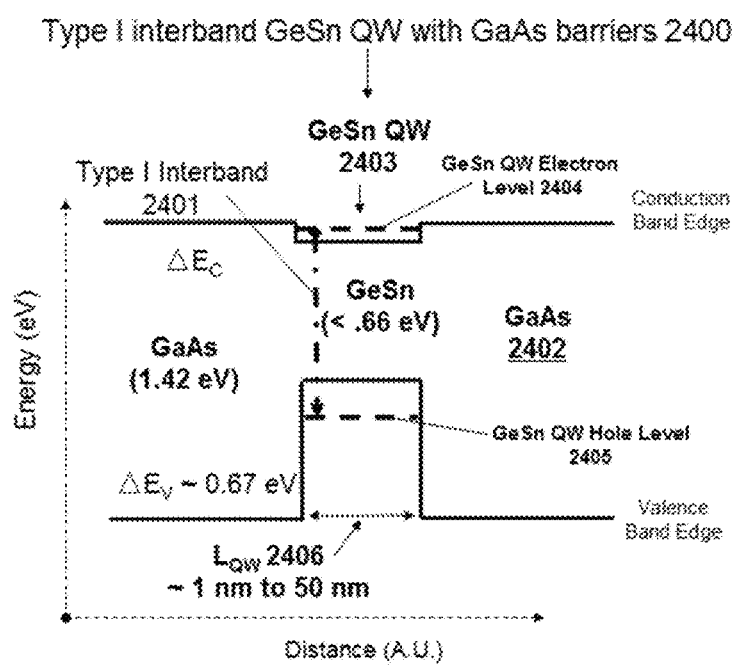
FIG. 24 shows a flat band energy band type I alignment of a GeSn QW with a GaAs barrier.

FIG. 24 shows a flat band energy band diagram of a type I interband GeSn QW with GaAs barriers 2400. The band alignment of GeSn QW 2403 with GaAs 2402 barrier can be of a type I heterojunction. Because the lattice constant of GaAs and Ge is both about 5.66 Å, one could also use a Ge barrier material to obtain a type I alignment. Because for low Sn % GeSn, the GeSn growth on GaAs or Ge will be compressively strained. As long as the GeSn thickness is less than the critical thickness, coherent planar or pseudomorphic growth can proceed on the GaAs or Ge barrier material, thus forming the GeSn QW. The Type I interband transitions are an excellent method for producing the emission of light from semiconductor heterostructures. The FIG. 24 shows a type I interband 2401 transition from the conduction band GeSn QW electron level 2404 to the GeSn QW hole level 2405. These type I interband 2401 transitions allow the possibility of light emission. Note the size $L_{QW}$ 2406 of the GeSn QW 2403 determines the type I interband transition energy. Because the arrangement is of a type I heterostructure the emission energies that can be achieved are typically higher than in a type II heterostructure. It is straightforward to calculate the range of wavelengths achievable in the GeSn quantum dot with low Sn % with GaAs barriers. Basically the emission wavelengths that can be achieved for a type I alignment are shorter than that of type II QD heterostructures.

For QW of a type I heterostructure the emission energies that can be achieved are typically higher than in a type II heterostructure. Type I interband transitions generally result in energy transitions that are greater than the bulk GeSn transitions. Type II transitions can result in energy transitions that can be less than the bulk GeSn transitions. Basically the emission wavelengths that can be achieved for a type I alignment are shorter than that of type II QW heterostructures. As the Sn % in GeSn increases the QW wavelengths will get longer.

By utilizing a direct energy gap GeSn bulk material or a GeSn quantum well or a GeSn quantum dot in the base region of a transistor can achieve a light emitting HBT, that can emit light from 1000 nm to 5000 nm.

For simplicity and clarity of illustration, the drawing figures illustrate the general manner of construction, and descriptions and details of well-known features and techniques may be omitted to avoid unnecessarily obscuring the examples. Additionally, elements in the drawing figures are not necessarily drawn to scale. For example, the dimensions of some of the elements in the figures may be exaggerated relative to other elements to help improve understanding of the examples presented. Like reference numerals are used to designate like parts in the accompanying drawings.

Figure 25:
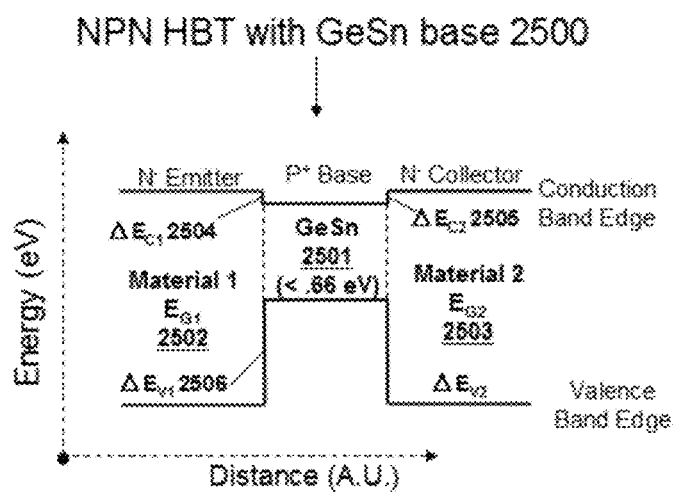
FIG. 25 shows a general flat band energy diagram of an NPN GeSn double heterojunction bipolar transistor.

For an NPN HBT utilizing a GeSn base region certain requirements are necessary to optimize the structure. FIG. 25 shows the general flat band energy diagram of an NPN GeSn double heterojunction bipolar transistor. This shows the general configuration of an optimized NPN HBT with GeSn base 2500 region (energy band gap is indicated in parenthesis below the material of interest) can include an N-type emitter of material 1 $E_{G1}$ 2502, with a $E_{G1}$ energy band gap greater than the GeSn 2501 (has an energy band gap which is less than 0.66 eV) an forms the P-type base region; then a N-type collector material 2 $E_{G2}$ 2503 where the energy bandgap energy $E_{G2}$ which may equal or be greater than the material 1 $E_{G1}$ 2502. Furthermore, the conduction band offset energies $\Delta E_{C1}$ 2504 at the emitter base junction and the $\Delta E_{C2}$ 2505 at the base collector junction should be zero or near zero in value. Small conduction band offsets between the emitter-base junction and the collector-base junction are desirable for electron transport. Additionally, the valence band offset $\Delta E_{V1}$ 2506 at the emitter base junction should be as large as possible to ensure that there is no back injection of holes from the GeSn 2501 P-type base to material 1 $E_{G1}$ 2502 N-type emitter material.

HBT performance can be improved, in some examples, by grading the composition of the base to decrease the energy band gap gradually through the base. The grading of the base energy band gap can create an electric field, which causes a reduction in the transit time of the charged carriers. The slope of Ge to GeSn compositional grade in the base in this example can be varied from linear to discontinuous functions. The graded GeSn may comprise starting growth of Ge at the emitter than grading to higher Sn % GeSn at the collector or may comprise starting growth of low Sn % GeSn at the emitter than grading to higher Sn % GeSn at the collector.

Figure 26:
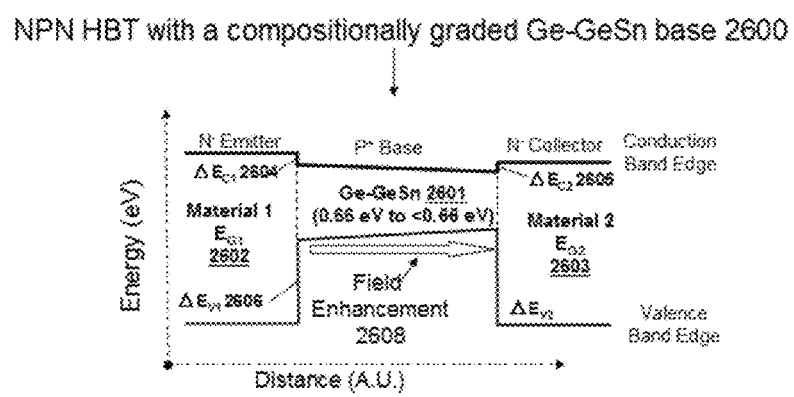
FIG. 26 shows a flatband energy diagram that shows an NPN HBT with a compositionally graded GeSn base (Ge or low Sn % graded to higher Sn % GeSn).

FIG. 26 shows the general flat band energy diagram of an NPN HBT with a graded Ge—GeSn base 2600 region. Starting next to the N emitter material 1 $E_{G1}$ 2602 with a Ge or a low Sn % GeSn layer which is graded to higher Sn % GeSn and is represented by Ge—GeSn 2601. This results in a field enhancement 2608 region. The general configuration of this NPN HBT with the graded Ge—GeSn 2601 P-type base region can include an N-type emitter of material 1 $E_{G1}$ 2602, with a $E_{G1}$ energy band gap greater than the Ge—GeSn 2601 energy band gap which is less than 0.66 eV; a Ge—GeSn 2601 P-type base region; then a N-type collector material 2 $E_{G2}$ 2603 where the energy bandgap energy $E_{G2}$ may equal or be greater than that of material 1 $E_{G1}$ 2602. Furthermore, the conduction band offset energies $\Delta E_{C2}$ 2605 at the emitter base junction and the $\Delta E_{C1}$ 2604 at the base collector junction should be zero or near zero in value. Having small conduction band offsets between the emitter-base junction and the collector based junction is desirable for electron transport. Additionally, the valence band offset $\Delta E_{V1}$ 2606 at the emitter base junction should be as large as possible to ensure that there is no back injection of holes from the Ge—GeSn 2601 P-type base to material 1 $E_{G1}$ 2602 N-type emitter material.

The importance of the base region of the HBT can further be elucidated by the following example. For a GaAs base HBT which has a base thickness of 1000 Å, for an equivalent device the GeSn base in a HBT, the base thickness could be halved to 500 Å with no detrimental but enhanced results. The $F_t$ for GeSn HBT would increase because of the thinner base. Because the GeSn base resistivity (0.0002 ohm-cm) is 10 times less than GaAs resistivity (0.002) ohm-cm), the parameter $F_{max}$ would increase by a factor of $(5*F_t)^{1/2}$. This is because $F_t$ increased because the base thickness was halved, but the base sheet resistance of the GeSn base only increased by a factor of two, but it is still 5 times less than the base sheet resistance of the GaAs HBT. Thus GeSn is excellent material for high frequency HBT performance.

GeSn base material advantages, at low Sn % are similar properties to Ge. GeSn has a low band gap (lower than Ge: the term low energy band gap base typically refers to the relevant semiconductors with band gaps less than 0.75 eV, like GeSn, Ge, InGaAs, GaAsSb) which results in low turn-on voltage (less than 0.5 V) for the base emitter junction. GeSn (low Sn %<20%) hole mobility is high like Ge (2000 cm$^2$/Vs as compared to GaAs 400 cm$^2$/Vs) and acceptors can be incorporated to high density (>1×10$^{19}$ cm$^{-3}$), thus the base can be made ultra-thin (much less than 500 Å) while maintaining a low base sheet resistance (P-type base resistivity is about 0.0002 ohm-cm) which increases current gain and decreases electron transit time. GeSn can be heavily doped P-type (>1×10$^{19}$ cm$^{-3}$). GeSn for low Sn concentration, has shallow acceptors, so the hole concentration is generally equal to the acceptor doping level and independent of temperature. The low base sheet resistance of GeSn results in a high $F_{max}$. The surface recombination velocity is low for P-type Ge and GeSn. GeSn can be made to become a direct gap semiconductor at compositions in the range from 7% to 11% Sn content thus useful as a light emitting semiconductor material.

A light emitting heterojunction bipolar transistor can be formed by placing a GeSn quantum well or quantum dot in the base region of a heterojunction transistor. This is a methodology for the formation of the transistor laser.

Figure 27:
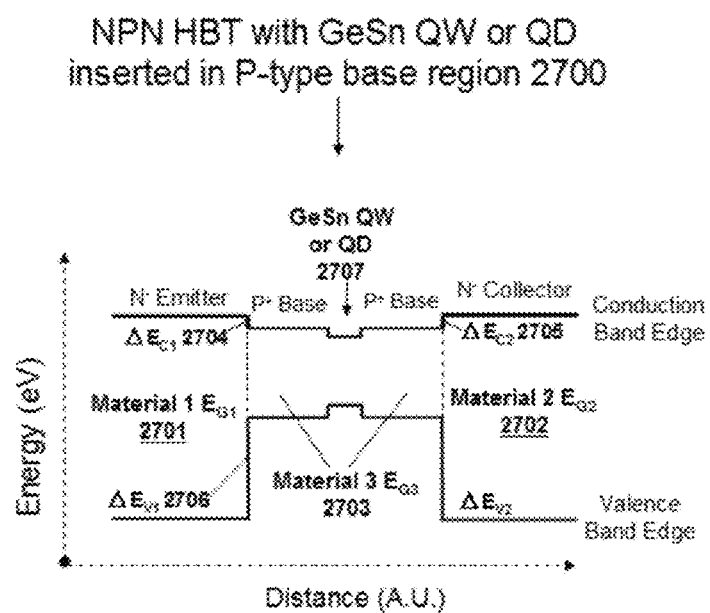
FIG. 27 shows a resulting flatband energy diagram of a GeSn quantum well or quantum dot material placed in the base region of a heterojunction transistor.

FIG. 27 shows the resulting flatband energy diagram of an NPN HBT with GeSn QW or QD inserted in the P-type base region 2700 for the initial formation of a light emitting transistor. Material 3 $E_{G3}$ 2703 is the P-type base region and forms the barrier to the GeSn QW or QD 2707 to get quantum confinement and also may serve as the waveguide material. The material 3 $E_{G3}$ 2703 bandgap energy should be greater than the band gap energy of the bulk GeSn material which is less than equal to 0.66 eV. The N-type emitter material 1 $E_{G1}$ 2701 and N-type collector material 2 $E_{G2}$ 2702 may serve as the cladding layers of the transistor laser. The general configuration of an optimized NPN HBT with can include an N-type emitter of material 1 $E_{G1}$ 2701, with an $E_{G1}$ energy band gap greater than material 3 $E_{G3}$ 2703 P-type base region. The N-type collector material 2 $E_{G2}$ 2702 should have a bandgap energy $E_{G2}$ equals to the material 1 $E_{G1}$ 2701 or can be much larger. The conduction band offset energies $\Delta E_{C1}$ 2704 at the emitter base junction and the $\Delta E_{C2}$ 2705 at the base collector junction need not be near zero because a type I alignment assists in funneling the carriers into the waveguide and to the GeSn QW or QD 2707. Additionally, the valence band offset $\Delta E_{V1}$ 2706 at the emitter base junction should be as large as possible to ensure that there is no back injection of holes from the P-type base to material 1 $E_{G1}$ 2701 N-type emitter material.

Figure 28:
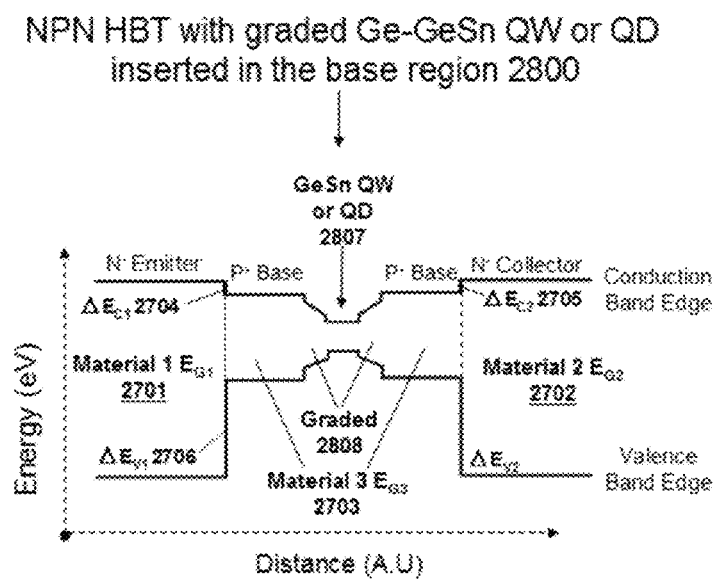
FIG. 28 shows where a flat band energy diagram of a GeSn quantum well or quantum dot where a barrier has been graded from a base material to a GeSn active region.

Additional variations could include grading of the quantum region in the base material of such a device. FIG. 28 shows a slight variation to FIG. 27 where the flat band energy diagram of NPN HBT has a GeSn QW or QD 2807 inserted in the base region 2800 where the barrier layer that has been graded 2808 from the P base material 3 2703.

Exemplary Configurations: note these are exemplary heterojunction bipolar transistor and/or transistor laser configurations and are used to illustrate the purposes and used of the various configurations. In various embodiments, the GeSn base region can be replaced by a graded Ge to GeSn base region.

Exemplary Configuration 1, which is an NPN structure of a GaAs Emitter—GeSn Base—GaAs Collector symmetric double heterojunction transistor. Typically GaAs HBTs have been the standard of the industry. The device elucidated in this example can include a symmetric double heterojunction GaAs—GeSn—GaAs HBT device. This device can have desirable base characteristics with a low voltage base turn-on (<0.66 eV depending on Sn %, at 20% Sn % the band gap energy can be 0.25 eV) region and a symmetric double heterojunction thus eliminating the offset voltage in the transistor output characteristic that reduces power added efficiency.

Figure 29:
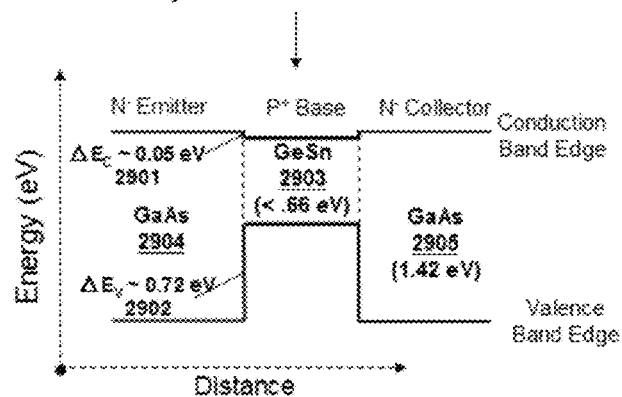
FIG. 29 illustrates an exemplary flat band energy diagram of an NPN structure of a GaAs Emitter-GeSn Base-GaAs Collector symmetric double HBT.

FIG. 29 illustrates an exemplary flat band energy diagram of a GaAs Emitter—GeSn Base—GaAs Collector NPN symmetric double HBT 2900. Note the near zero conduction band offset $\Delta E_C$~0.05 eV 2901 with a large valence band offset $\Delta E_V$~0.72 eV 2902. Near zero conduction band offsets are generally less than 0.1 eV. This unique arrangement of materials combines the high transconductance of heterojunction bipolar transistor (HBT) technology, and a desirable emitter-base heterojunction (wide band-gap GaAs 2904 emitter on a narrow band-gap high conductivity P$^+$ GeSn 2903 base). The large valence band discontinuity between the GaAs emitter and GeSn base allows one to lightly N dope the GaAs emitter, while heavily doping P base GeSn 2903. The large valence band discontinuity prevents the back injection of holes into the emitter thus preventing the degradation in the gain or beta of the transistor. The GaAs 2905 collector provides a reasonable base collector breakdown because the band gap energy of the GaAs is 1.42 eV.

This unique arrangement of materials combines the high transconductance of heterojunction bipolar transistor (HBT) technology, with the breakdown voltage (using a GaAs collector), and a desirable emitter-base heterojunction (wide band-gap GaAs emitter on a narrow band-gap high conductivity P-type GeSn base). The combination of a low band-gap (<0.66 eV depending on Sn %) GeSn base coupled with a wide band-gap GaAs (can be about 1.42 eV) collector can be used for high speed power applications. This symmetric double heterojunction bipolar transistor device results in a minimum in the zero offset voltage in the measurement of the collector current vs. the collector-emitter voltage as a function of the stepped voltage bias of the base-emitter junction, which is desirable for improving the power added efficiency of the NPN heterojunction bipolar transistors. The use of efficient GaAs—GeSn—GaAs transistors can significantly enhance battery life while also enabling operation at high frequency response, which can be desirable when used as RF power amplifiers for wireless or cellular phone applications.

Figure 30:
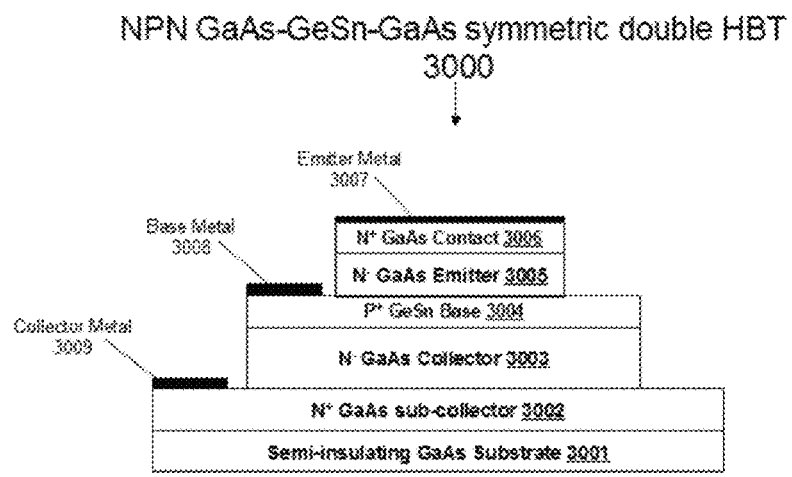
FIG. 30 shows an exemplary cross-sectional device depiction embodiment of an NPN GaAs—GeSn—GaAs symmetric double HBT.

FIG. 30 shows an exemplary cross-sectional device depiction of embodiment of an NPN GaAs—GeSn—GaAs symmetric double HBT 3000. This device depiction shows the standard HBT in a mesa configuration. One can grow this device epitaxially with a variety of techniques like MBE, MOCVD, etc. One starts with a high quality single crystal semi-insulating GaAs substrate 3001. An N$^+$ GaAs sub-collector 3002, is grown first, followed by the N$^-$ GaAs collector, 3003, then the GeSn Base 3004 (which has been grown by MBE, MOCVD, PLD, etc.). An N$^-$ GaAs emitter 3005 is grown on the P-type base, followed by the N$^+$ GaAs contact layer 3006. Contact is made to the device through the emitter metal 3007, the base metal 3008, and the collector metal 3009.

Figure 31:
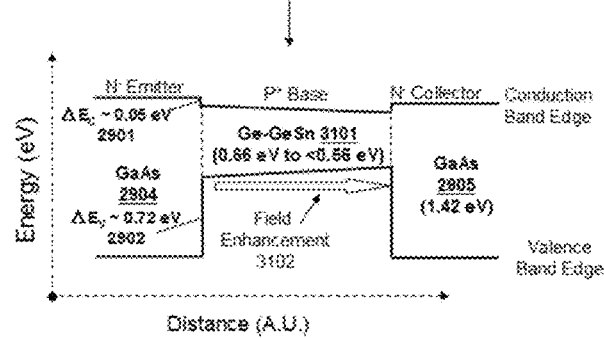
FIG. 31 illustrates an exemplary flat band energy diagram of an NPN structure of a GaAs Emitter-compositionally graded GeSn Base-GaAs Collector double heterojunction transistor where the base is graded GeSn (Ge or low Sn % graded to higher Sn % GeSn).

Additionally, the base can be compositionally graded from Ge—GeSn to have field enhancement of the carriers. FIG. 31 illustrates an exemplary flat band energy diagram of the NPN structure of a GaAs Emitter—graded Ge—GeSn 3101 Base—GaAs Collector double HBT 3000. FIG. 31 is a variation on FIG. 29, by including the graded Ge—GeSn 3101 P-type base region; this structure creates an electric field that accelerates the electrons across the base to the collector, thus creating the field enhancement 3102 region. The compositionally graded Ge—GeSn 2601 layer may comprise at the emitter a Ge or a low Sn % GeSn layer which is graded to higher Sn % GeSn at the collector interface. The compositional grading range can go from Ge at the emitter to GeSn at various compositions up to 20%.

Table 1 shows an exemplary structure that could be grown for the NPN structure of a GaAs Emitter—GeSn Base—GaAs Collector double heterojunction transistor. Note the table shows a GeSn base region or a compositionally graded Ge—GeSn base region, either which can be used in the structure.

TABLE 1

Exemplary Epitaxial Structure of NPN GaAs—GeSn—GaAs HBT

| Layer | Layer Name | Description | Comment |
|---|---|---|---|
| 1 | N⁺ cap | ~1000 Å InGaAs (Te-doped >$10^{19}$ cm$^{-3}$) InGaAs layer is fully relaxed | Te = tellurium |
| 2 | N⁻ Emitter Cap | ~1500 Å GaAs (Si-doped ~5 × $10^{18}$ cm$^{-3}$) | Si = silicon |
| 3 | N⁻ Emitter | ~500 Å GaAs (Si-doped ~3 × $10^{17}$ cm$^{-3}$) | |
| 4 | P⁺ Base | ~500 Å GeSn (B-doped >$10^{19}$ cm$^{-3}$) 0 ≤ Sn % ≤ 20% Thickness range 100 Å-5000 Å | Or graded Ge—GeSn |
| 5 | N⁻ Collector | ~10000 Å GaAs (Si-doped ~1 × $10^{16}$ cm$^{-3}$) | |
| 6 | N⁺ sub-collector | ~5000 Å GaAs (Si-doped ~5 × $10^{18}$ cm$^{-3}$) | |
| 7 | High Purity Buffer | ~500 Å GaAs (undoped) | UID |
| 8 | | GaAs semi-insulating substrate | |

Note the compositionally graded Ge—GeSn layer may comprise at the emitter interface a Ge or a low Sn % GeSn layer which has a graded to higher Sn % GeSn at the collector interface. The grading range can go from Ge at the emitter to GeSn at various compositions up to 20%.

Exemplary GaAs advantages: The large valence band offset between GaAs emitter and GeSn base can stop back injection of holes into the emitter. This allows for low N-type doping of the emitter and high P-type doping of the base, thus lowering base emitter capacitance while still achieving sizable current gain. GeSn is near latticed matched to GaAs (~5.65 Å), which enables dislocation free growth.

The GaAs—GeSn emitter base junction has a large valence (~0.72 eV which is larger than the GeSn band gap). This eliminates the back injection of holes to the emitter from the base, which reduces the gain of the transistor. Additionally, the base is doped heavily P-type (typically>1× $10^{13}$ cm$^{-3}$), with such high doping of the base, the emitter valence band offset blocks the holes even though the base doping is much higher than the N-type emitter doping (~low $10^{17}$ cm$^{-3}$). Furthermore, because GeSn has a low resistivity of 0.0002 ohm-cm, one can decrease the thickness of the base significantly, while still moderately increasing the base sheet resistance value. The frequency response of the device is related to the $F_t$ and $F_{max}$. The relationship between transit frequency $F_t$ and the maximum oscillation frequency $F_{max}$ is as follows for an HBT: $F_{max}=(F_t/8\pi R_B C_{CB})^{1/2}$. The transit frequency $F_t$ is basically the inverse of the time for the electron to traverse the emitter, base and collector. The parameters $R_B$ and $C_{CB}$ refer to the base sheet resistance and the capacitance of the collector base junction. The parameter $F_{max}$ is the unity power gain frequency and indicates the maximum frequency with power gain from a device. The transit frequency can be further improved by having a higher saturation velocity for the collector.

It should be noted that there are many types of N-type and P-type dopants. For standard III-V semiconductors like GaAs, InP, InGaAs, InGaP, the N-type dopants are Si, Ge, Sn, Pb, S, Se, Te. The P-type dopants for standard III-V semiconductors are C, Zn, Be, Mg. Common dopants for group IV semiconductors like GeSn, Ge, Si, SiGe, GeSiSn for N-type dopants are P, As, Sb. The P-type dopants are B, Al, Ga.

Also designations such as N⁺ reference highly N-type doped material and N⁻ lightly doped N-type material. Also designations such as P⁺ reference highly P-type doped material and P⁻ lightly doped P-type material. Unintentionally doped material can be denoted as UID.

Figure 32:
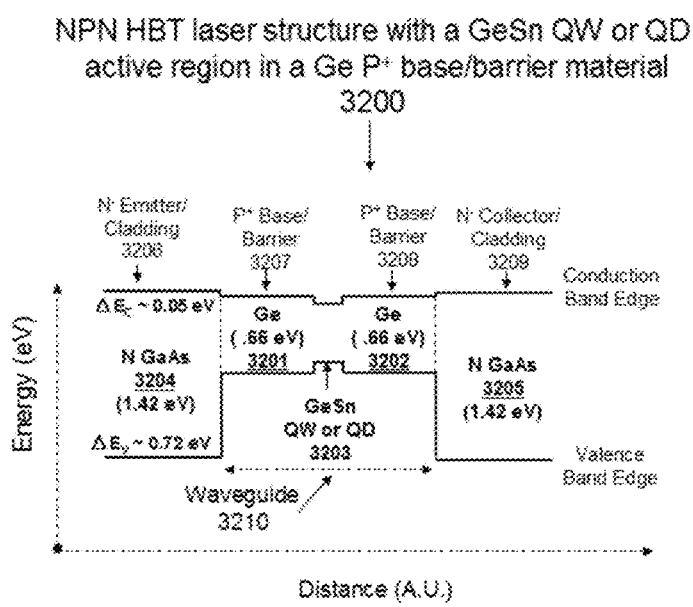
FIG. 32 shows an exemplary flatband energy diagram of an NPN transistor laser structure with a GeSn QW or QD active region in a Ge P-type base/barrier material 3200.

In some examples, to fabricate a light emitting bipolar transistor may require an insertion into the Ge base region (or GaAs base) a GeSn quantum dot or quantum well. FIG. 32 shows the exemplary flatband energy diagram of an NPN transistor laser structure with a GeSn QW or QD active region in a Ge P⁺ base/barrier material 3200. The Ge 3201 and 3202 forms the P⁺ base and also acts as a barrier layer for quantum confine the electrons and holes in the GeSn QW or QD 3203. QWs are formed by having a large energy bandgap material surrounded by a low energy bandgap material which results in two dimensional electron confinement. For a QD the growth of a large lattice constant material on a smaller lattice constant material results in strained layer epitaxy allowing the self-assembled three dimensional island growth. Typical thickness of quantum wells can be about 10 nm but they can range from 1 nm to 50 nm depending on the wavelength of interest that needs to be produced. Typical quantum dot diameters are in the range of 1 nm-20 nm, but are dependent on the wavelength of light that needs to be emitted. The GeSn QW or QD 3203 inserted into a Ge 3201 & 3202 base/barrier serves for the collection region for electrons and holes to recombine to generate light. The Ge 3201 & 3202 also serve as the optical confinement layer and the waveguide material. The GaAs 3204 & 3205 serves as the emitter/cladding and collector/cladding material for this structure. The cladding serves as funneling carriers into the active/waveguide region and traps the emit light in the waveguide structure. The large energy bandgap difference between the GaAs 3204 & 3205 and the Ge 3201 & 3202 ensures a large index of refraction difference at the N⁻ emitter/cladding 3206 and P⁺ base/barrier 3207 junction and a large index refraction difference at the P⁺ base/barrier 3208 and N⁻ collector/cladding 3209, thus making an excellent waveguide 3210 to optically confine the light produced by the active region.

Figure 33:
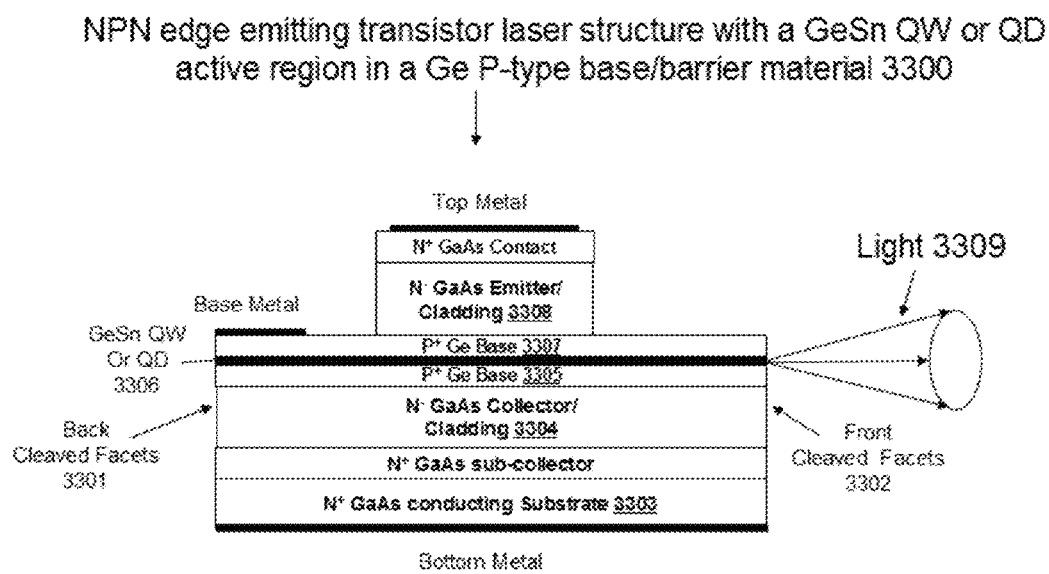
FIG. 33 shows a possible cross-sectional device depiction of an NPN transistor laser structure with a GeSn QW or QD active region in a Ge P-type base/barrier material 3300.

FIG. 33 shows a possible cross sectional device depiction of an NPN transistor laser structure with a GeSn QW or QD 3306 active region in a Ge P-type base/barrier material 3300. The structure can be grown on N⁺ GaAs conducting substrate 3303, which is the seed crystal to grow the full structure. N GaAs collector/cladding 3304 and the N⁻ GaAs emitter/cladding 3308 do dual functions of optical confinement of the light 3309 produced and the controlling the flow of electrons and holes. The P⁺ Ge Base 3305 and 3307 form the barrier material for the GeSn QW or QD 3306, and also provide the waveguide material. The laser can require a resonant cavity to get optical gain, and typically this can formed from the front cleaved facets 3302 and back cleaved facets 3301 of the semiconductor crystalline structure.

Table 2 shows an exemplary epitaxial structure of an NPN light emitting with a GeSn QW or QD active region in a Ge P-type base/barrier HBT.

TABLE 2

Exemplary Epitaxial Structure of NPN light emitting with a GeSn QW or QD active region in a Ge P-type base/barrier HBT

| Layer | Layer Name | Description | Comment |
|---|---|---|---|
| 1 | N+ cap | ~1000 Å InGaAs (Te-doped >$10^{19}$ cm$^{-3}$) | |
| 2 | N− Emitter/Cladding | ~1000 Å GaAs (Si-doped ~3 × $10^{17}$ cm$^{-3}$) | |
| 3 | P+ Base/Barrier | ~450 Å Ge (B-doped >$10^{19}$ cm$^{-3}$) | (B = boron) |
| 4 | QW undoped Or QD UID | ~100 Å GeSn<br>Sn content can be: 0 ≤ Sn % ≤ 20%<br>QW (Sn % ~7% to 12% GeSn)<br>QW thickness range 10 Å-1000 Å<br>QD (Sn % ~12% to 20% GeSn)<br>QD size range 10 Å-200 Å | for light emission<br>1000 nm-4000 nm |
| 5 | P+ Base/Barrier | ~450 Å Ge (B-doped >$10^{19}$ cm$^{-3}$) | |
| 6 | N− Collector | ~1000 Å GaAs (Si-doped ~1 × $10^{16}$ cm$^{-3}$) | |
| 7 | N+ sub-collector | ~500 Å GaAs (Si-doped ~5 × $10^{18}$ cm$^{-3}$) | |
| 8 | N+ Buffer | ~500 Å GaAs (Si-doped ~5 × $10^{18}$ cm$^{-3}$)<br>GaAs N+ conducting substrate | Crystalline |

The semiconductor alloy $In_{0.49}Ga_{0.51}P$ (InGaP) can be lattice matched to GaAs. InGaP can be grown in a disordered phase, ordered phase, or a combination of the two. The disordered InGaP phase has a bandgap energy of 1.9 eV. The band gap of the ordered InGaP is about 1.85 eV. In some examples, to fabricate a light emitting bipolar transistor may require an insertion into the GaAs base region a GeSn quantum dot or quantum wire, or quantum well layer. The GaAs is the p type base material but also acts as a barrier layer to quantum confine the electrons and holes in the GeSn QW. QWs are formed by having a large energy bandgap material surrounded by a low energy bandgap material which results in two dimensional electron confinement. For a QD the strained layer growth results in three dimensional electron confinement. Typical thicknesses of quantum wells are about 100 Å but they could be larger or less than that thickness depending on the emission wavelength desired. Typical quantum dot diameters are in the range of 1 nm-20 nm, but are dependent on the wavelength of light that needs to be emitted.

Figure 34:
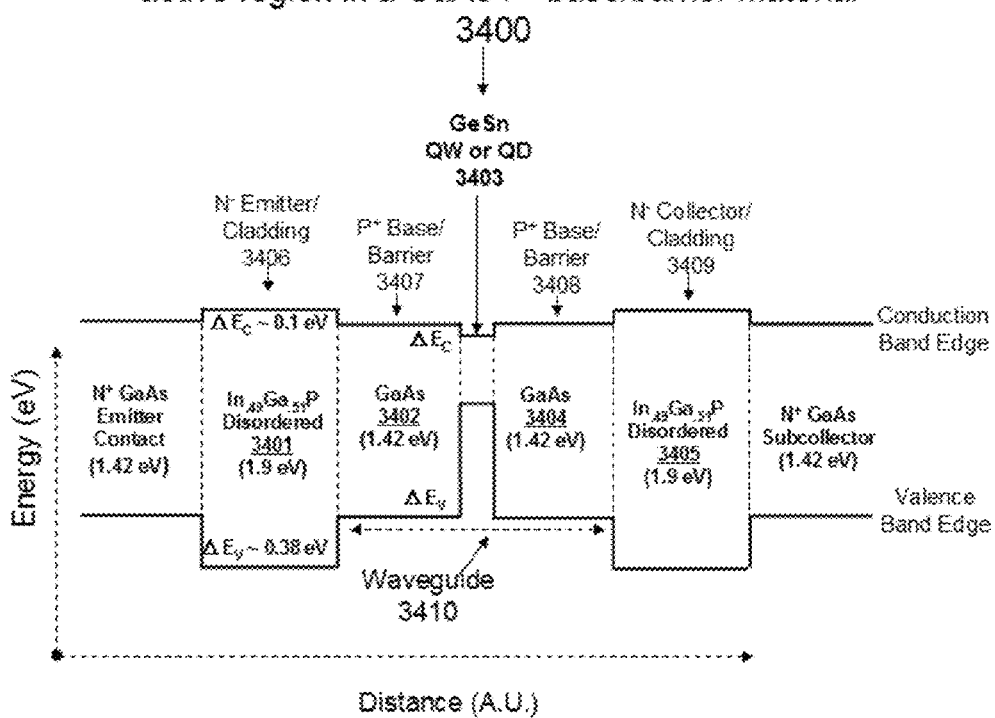
FIG. 34 shows an exemplary flatband energy diagram of an NPN transistor laser structure with a GeSn QW or QD active region in a GaAs P-type base/barrier material 3400.

FIG. 34 shows the exemplary flatband energy diagram of an NPN transistor laser structure with a GeSn QW or QD active region in a GaAs P+ base/barrier material 3400. The $In_{0.49}Ga_{0.51}P$ disordered 3401 & 3405 serves as the N− emitter/cladding and N− collector/cladding layers. Note the relevant band discontinuities $\Delta E_C$, $\Delta E_V$ are shown in the figure. The laser includes a GeSn QW or QD 3403 active region for the collection region for electrons and holes to recombine to generate light, which is inserted into a P+ GaAs base/barrier 3402 & 3404, which also serves as the barrier layer of the GeSn QW or QD 3403 active region, thus serving also as the optical waveguide 3410 material. The large energy bandgap difference between the $In_{0.49}Ga_{0.51}P$ disordered 3401 & 3405 and the GaAs base/barrier 3402 & 3404 ensures a large index of refraction difference at the N− emitter/cladding 3406 and P+ base/barrier 3407 junction and a large index refraction difference at the P+ base/barrier 3408 and N− collector/cladding 3409, thus making an excellent waveguide 3410 to optically confine the light produced by the active region.

Figure 35:
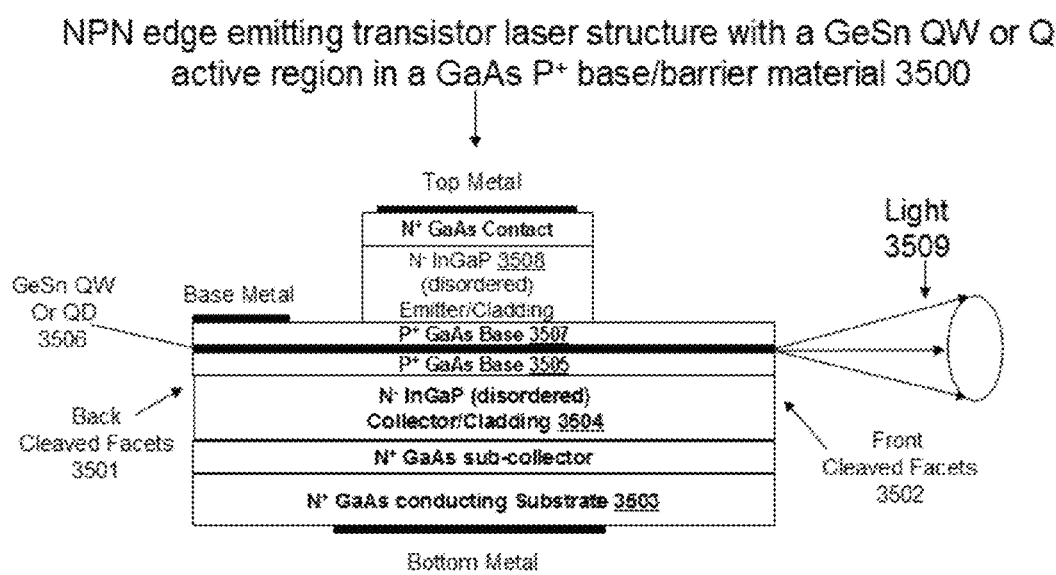
FIG. 35 shows a possible cross sectional device depiction of an NPN edge emitting transistor laser structure with a GeSn QW or QD active region in a GaAs P-type base/barrier material 3500.

FIG. 35 shows a possible cross-sectional device depiction of an NPN edge emitting transistor laser structure with a GeSn QW or QD active region in a GaAs P+ base/barrier material 3500. A GeSn QW or QD 3506 active region in a P+ GaAs base 3505 & 3507 which also functions as the barrier material for the QW or QD. This is an exceptional device because the type I discontinuities form an excellent optical and electrical confining structure. The structure can be grown on N+ GaAs conducting substrate 3503, which is the seed crystal to grow the full structure. N− InGaP (disordered) collector/cladding 3504 and the N− InGaP (disordered) emitter/cladding 3508 do dual functions of optical confinement of the light 3509 produced and the controlling the flow of electrons and holes. P+ GaAs base 3505 & 3507 form the barrier material for GeSn QW or QD 3506, and also provide the waveguide material. The laser can require a resonant cavity to get optical gain, and typically this can formed from the front cleaved facets 3502 and back cleaved facets 3501 of the semiconductor crystalline structure.

Table 3 shows an exemplary table of the epitaxial structure of an NPN light emitting GeSn QW or QD active region in a GaAs P-type base/barrier HBT.

TABLE 3

An exemplary epitaxial structure of an NPN edge emitting transistor laser structure with a GeSn QW or QD active region in a GaAs P-type base/barrier material

| Layer | Layer Name | Description | Comment |
|---|---|---|---|
| 1 | N+ cap | ~1000 Å InGaAs (Te-doped >$10^{19}$ cm$^{-3}$) | |
| 2 | N− Emitter/Cladding | ~5000 Å $In_{0.49}Ga_{0.51}P$ (Si-doped ~3 × $10^{17}$ cm$^{-3}$) | Disordered |
| 3 | P+ Base/Barrier | ~500 Å GaAs (B-doped >$10^{19}$ cm$^{-3}$) | |
| 4 | Undoped QW or QD | ~55 Å GeSn<br>Sn content can be: 0 ≤ Sn % ≤ 20% | for light emission<br>1000 nm-4000 nm |

TABLE 3-continued

An exemplary epitaxial structure of an NPN edge emitting transistor laser structure with a GeSn QW or QD active region in a GaAs P-type base/barrier material

| Layer | Layer Name | Description | Comment |
|---|---|---|---|
|  |  | QW (Sn % ~7% to 12% GeSn) |  |
|  |  | QW thickness range 10 Å-1000 Å |  |
|  |  | QD (Sn % ~12% to 20% GeSn) |  |
|  |  | QD size range 10 Å-200 Å |  |
| 5 | P$^+$ Base/Barrier | ~500 Å GaAs (B-doped >10$^{19}$ cm$^{-3}$) |  |
| 6 | N$^-$ Collector/Cladding | ~5000 Å In$_{0.49}$Ga$_{0.51}$P (Si-doped ~3 × 10$^{17}$ cm$^{-3}$) | Disordered |
| 7 | N$^+$ sub-collector | ~500 Å GaAs (Si-doped ~5 × 10$^{18}$ cm$^{-3}$) |  |
| 8 | N$^+$ Buffer | ~500 Å GaAs (Si doped ~5 × 10$^{18}$ cm$^{-3}$) |  |
| 9 |  | N$^+$ GaAs conducting substrate | Crystalline |

The transistor laser has the integrated features of both the transistor and the laser. From such a structure it can be straightforward to simplify the structure and grow a separate confinement heterostructure (SCH) laser.

Figure 36:
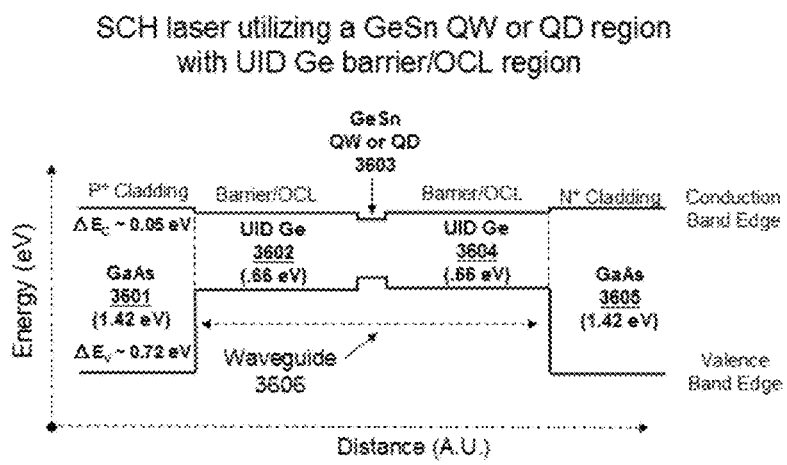
FIG. 36 shows an exemplary flat band energy diagram of a SCH laser utilizing a GeSn QW or QD region located in UID Ge barrier/waveguide region with GaAs cladding.

FIG. 36 shows an exemplary flat band energy diagram of an SCH laser utilizing a GeSn QW or QD region located in UID Ge barrier/OCL layer 3602 & 3604 region with P$^+$ GaAs 3601 cladding and N$^+$ GaAs 3605 cladding layers. This structure represents a PN junction or diode with an unintentionally doped (UID) active region and optical confinement region between the P$^+$ GaAs 3601 and N$^+$ GaAs 3605 cladding. The UID Ge 3602 and 3604 forms the barrier material for the GeSn QW or QD 3603 active region. The combination of the barrier and active region forms the waveguide 3606 of the laser. The P$^+$ GaAs 3601 cladding region serves for injection of the holes and for the optical confinement of the light emitted from the active region. The N$^+$ GaAs 3605 cladding region serves for injection of the electrons and for the optical confinement of the light emitted from the active region. Though this depicts a symmetric structure it can be also asymmetric.

Figure 37:
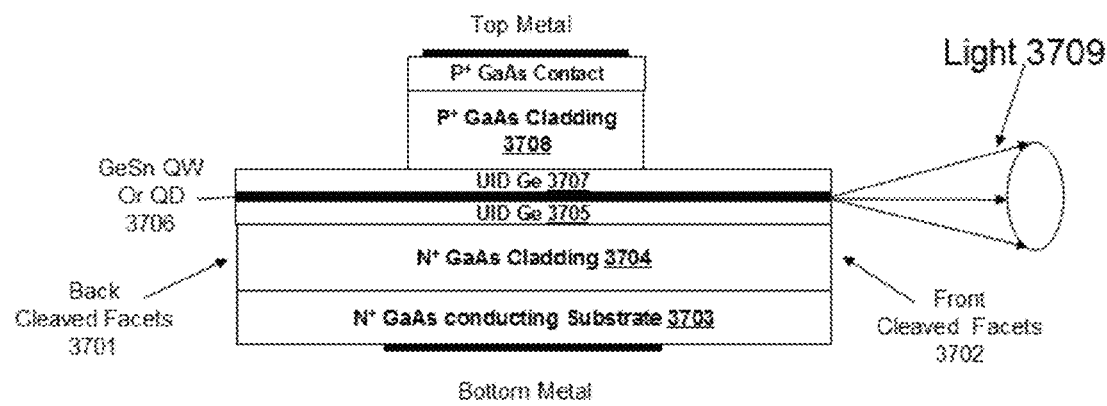
FIG. 37 shows a cross-sectional device depiction of a SCH laser utilizing a GeSn QW or QD region located in UID Ge barrier/OCL region with GaAs cladding.

FIG. 37 shows a cross sectional depiction of a SCH ridge laser utilizing a GeSn QW or QD region located in UID Ge barrier/OCL region with P-type GaAs and N-type GaAs cladding. The structure can be grown on N$^+$ GaAs conducting substrate 3703. N$^+$ GaAs cladding 3704 serves for the injection of electrons into the active region and the bottom cladding for the optical confinement of the light emitted from the active region. The P$^+$ GaAs cladding 3708 serves for the injection of holes into the active region and, additionally, the top cladding for optical confinement of the light 3709 emitted from the active region. The UID Ge 3705 & 3707 forms the barrier material for the GeSn QW or QD 3706, and also provide the OCL material. The laser can require a resonant cavity to get optical gain, and typically this can be formed from the front cleaved facets 3702 and back cleaved facets 3701 of the semiconductor crystalline structure. The ridge structure provides the vertical guiding of the current into the active region.

Table 4 shows an exemplary epitaxial structure SCH injection diode laser with a GeSn QW or QD region with Ge barriers.

TABLE 4

Exemplary epitaxial structure SCH injection diode laser with a GeSn QW or QD region with Ge barriers.

| Layer | Layer Name | Description | Comment |
|---|---|---|---|
| 1 | P$^+$ cap | ~1000 Å GaAs (Zn doped >10$^{19}$ cm$^{-3}$) |  |
| 2 | P$^+$ Cladding | ~10000 Å GaAs (Zn doped ~1 × 10$^{18}$ cm$^{-3}$) |  |
| 3 | Barrier/OCL | ~450 Å Ge | UID |
| 4 | QW undoped Or QD | ~100 Å GeSn | for light emission 1000 nm-4000 nm |
|  |  | Sn content can be: 0 ≤ Sn % ≤ 20% |  |
|  |  | QW (Sn % ~7% to 12% GeSn) |  |
|  |  | QW thickness range 10 Å-1000 Å |  |
|  |  | QD (Sn % ~12% to 20% GeSn) |  |
|  |  | QD size range 10 Å-200 Å |  |
| 5 | Barrier/OCL | ~450 Å Ge | UID |
| 6 | N$^+$ Cladding | ~10000 Å GaAs (Si-doped ~1 × 10$^{18}$ cm$^{-3}$) |  |
| 8 | N$^+$ Buffer | ~5000 Å GaAs (Si-doped ~5 × 10$^{18}$ cm$^{-3}$) |  |
| 9 |  | GaAs N$^+$ conducting substrate | Crystalline |

Figure 38:
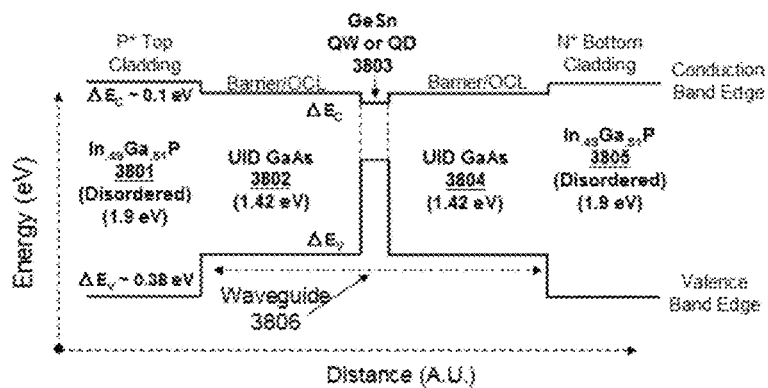
FIG. 38 shows an exemplary flat band energy diagram of an SCH diode laser utilizing a GeSn QW or QD region located in UID GaAs barrier/waveguide region with type InGaP cladding.

A variation of the laser structure could incorporate GeSn QW or QD region in a UID GaAs barrier/waveguide region, and utilizing latticed match InGaP as the cladding material. FIG. 38 shows an exemplary flat band energy diagram of an SCH diode laser utilizing a GeSn QW or QD region located in UID GaAs 3802 & 3804 barrier/OCL region with P$^+$ InGaP 3801 disordered and N$^+$ InGaP 3805 disordered cladding. This structure represents a PN junction or diode with an unintentionally doped (UID) active region and optical confinement region between the P$^+$ InGaP 3801 disordered and N$^+$ InGaP 3805 disordered cladding. The UID GaAs 3802 & 3804 forms the barrier material for the GeSn QW or QD 3803 active region. The combination of the barrier and active region forms the waveguide 3806 of the laser. The P$^+$ In$_{0.49}$Ga$_{0.51}$P disordered 3801 top cladding region serves for injection of the holes and for the optical confinement of the light emitted from the active region. The N$^+$ In$_{0.49}$Ga$_{0.51}$P disordered 3805 bottom cladding region serves for injection of the electrons and for the optical confinement of the light emitted from the active region. Though this depicts a symmetric structure it can be also asymmetric.

Table 5 shows an exemplary epitaxial structure SCH injection diode laser with a GeSn QW or QD region with GaAs barriers.

TABLE 5

Exemplary epitaxial structure SCH injection diode laser with a GeSn QW or QD region with GaAs barriers.

| Layer | Layer Name | Description | Comment |
|---|---|---|---|
| 1 | P+ cap | ~1000 Å GaAs (Zn doped >$10^{19}$ cm$^{-3}$) | |
| 2 | P+ Cladding | ~10000 Å $In_{0.49}Ga_{0.51}P$ (Zn-doped ~1 × $10^{18}$ cm$^{-3}$) | Disordered |
| 3 | Barrier/OCL | ~450 Å GaAs | UID |
| 4 | QW undoped Or QD | ~100 Å GeSn<br>Sn content can be: 0 ≤ Sn % ≤ 20%<br>QW (Sn % ~7% to 12% GeSn)<br>QW thickness range 10 Å-1000 Å<br>QD (Sn % ~12% to 20% GeSn)<br>QD size range 10 Å-200 Å | for light emission<br>1000 nm-3000 nm |
| 5 | Barrier/OCL | ~450 Å GaAs | UID |
| 6 | N+ Cladding | ~10000 Å $In_{0.49}Ga_{0.51}P$ (Si-doped ~1 × $10^{18}$ cm$^{-3}$) | Disordered |
| 8 | N+ Buffer | ~5000 Å GaAs (Si-doped ~5 × $10^{18}$ cm$^{-3}$) | |
| 9 | | GaAs N+ conducting substrate | Crystalline |

Figure 39:
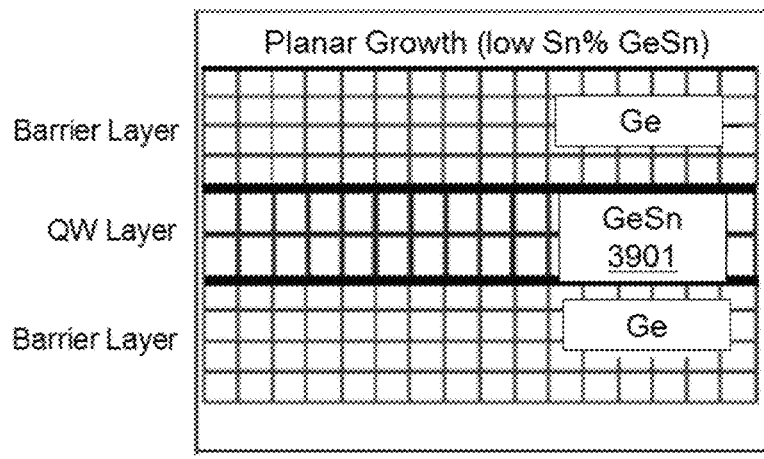
FIG. 39 shows a planar growth of strained GeSn (low Sn %) on Ge, with Ge barriers above and below a QW GeSn film.

The lattice constant of GaAs and Ge is both about 5.65 Å. The GeSn lattice constant can change from 5.66 Å to 5.833 Å at about 20% Sn content, the range of lattice mismatch at the highest Sn content is about 3%. This makes GeSn useful for growth on Ge or GaAs semiconductors, because at low Sn % GeSn can be grown coherently strained or psuedomorphic on either Ge or GaAs. For low Sn % GeSn the lattice mismatch is reasonable and films can be grown pseudomorphic (strained) if thin enough, or partial relaxation may occur for thicker films (1000 Å or more). Thus for growth of GeSn QW on Ge or GaAs, planar growth can be achieved. FIG. 39 shows the planar growth of strained GeSn 3901 (low Sn %) on Ge, with Ge barriers above and below the QW GeSn film. For low Sn % GeSn both Ge or GaAs barriers can be used for the formation of the strained GeSn QW.

Figure 40:
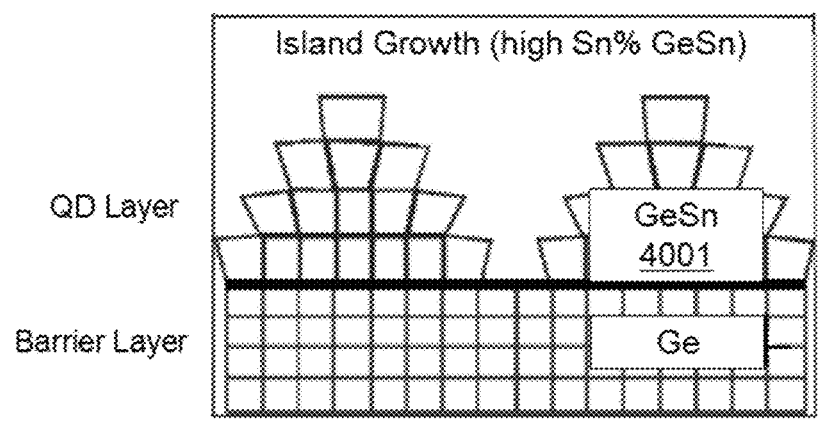
FIG. 40 shows an island growth of strained GeSn (high Sn %) on Ge barrier layer with a subsequent formation of a QD layer.

The formation of quantum dot structures are a result of the ability of self-assembled GeSn quantum dots by the Stranski-Krastanov (SK) method that transitions from two dimensional to island growth. The diagram below shows the methodology of formation. A larger lattice constant semiconductor is grown on a semiconductor with a smaller lattice constant. Under proper conditions two dimensional planar growth starts but quickly transitions to island growth thus forming the quantum dot structure. Thus the lattice constant of GeSn is typically greater than that of Ge. Typically the formation of the quantum dots occur when the critical thickness of the GeSn layer is exceeded. The lattice mismatch should be typically greater than 2% for dot formation. The range of lattice mismatch of GeSn to that of Ge (or GaAs) is approximately starts at 0% and goes up to 3% lattice mismatch at 20% Sn in GeSn. FIG. 40 shows the island growth of strained GeSn 4001 (high Sn %) on Ge barrier layer with the subsequent formation of the QD layer.

GeSn quantum structure provide a unique methodology to form both QW and QD in the same structure because the Sn % for becoming a direct gap semiconductor can vary from 7%≤Sn %≤20%. GeSn is indirect up to about 7% Sn then becomes a direct gap semiconductor with an energy bandgap of 0.585 eV and a lattice constant of about 5.725 Å, and the band gap energy typically reduces to about 0.25 eV at 20% Sn with a lattice constant of about 5.835 Å. Utilizing Ge or GaAs barriers which have a lattice constant of about 5.65-5.66, one can calculate the lattice mismatch at various compositions. The lattice mismatch between GeSn to GaAs or Ge at 7% Sn content GeSn is about 1%. The lattice mismatch between GeSn to GaAs or Ge at 20% Sn content in GeSn is about 3%. Typically the formation of the quantum dots generally occur when the critical thickness of the GeSn layer is exceeded. The lattice mismatch should be typically greater than 2% for quantum dot formation. A 2% lattice mismatch of Ge or GaAs to the GeSn corresponds to a lattice constant of about 5.76 Å which is about 12% Sn in GeSn. Thus if one grows on Ge or GaAs barriers, one can get GeSn planar direct gap Type I QW for 7%≤Sn %≤12% and direct gap type I QD for 12%≤Sn %≤20%. The GeSn energies vary from 7% Sn with a bandgap energy of 0.585 eV; to 12% Sn with a bandgap energy of 0.48 eV; to 20% Sn with a bandgap energy of about 0.25 eV. Thus GeSn QW energies could be in the near-IR and the GeSn QD energies could be in the mid-IR, utilizing the exact same laser or transistor laser structure.

Exemplary Configuration 2A: Ordered InGaP Emitter—GeSn Base—GaAs Collector double heterojunction transistor. The device elucidated can include a double heterojunction InGaP—GeSn—GaAs HBT device. InGaP at the composition $In_{0.49}Ga_{0.51}P$ is latticed matched to GaAs and is a direct gap semiconductor. $In_{0.49}Ga_{0.51}P$ can be grown in two forms ordered and disordered. InGaP semiconductor grown by various epitaxial growth technologies can be latticed matched to GaAs. At high temperature growth the InGaP can grow in a crystalline structure such that the sheets of In—P and Ga—P atoms can alternate in the (001) planes of the face centered cubic (FCC) unit cell without the intermixing of the Ga and In atoms on the lattice planes. This results in an almost zero conduction band discontinuity between the InGaP and GaAs and is called the ordered phase (this can be of weakly type I or weakly type II because it is close to zero). The ordered phase has a band gap energy of 1.85 eV and the dis-ordered phase has a bandgap energy of 1.9 eV, thus the ordered phase is about bandgap energy is about 0.05 eV less than the disordered phase. With different growth conditions, the In and Ga atoms can intermix and the disordered InGaP phase can form, which has a larger conduction band offset of 0.1 eV (type I) vs. 0.03 eV for the ordered phase. It is also possible to have a mixture of ordered and disordered InGaP materials. The lattice constant of GaAs and Ge is about 5.66 Å, and this is also the lattice constant of InGaP at the composition $In_{0.49}Ga_{0.51}$ P.

In some examples, the ordered phase may have an advantage to the disordered phase, because the ordered phase has near zero conduction band offset. In some examples, this device has desirable base characteristics with a low voltage base turn-on region and that the GeSn base region can be directly inserted into a standard InGaP—GaAs HBTs, which is typically used in RF power amplifiers in cellular handsets to send the voice and data to the cell tower. Additionally, in an inverted HBT structure by using the ternary alloy InGaP as the emitter and varying the In composition away from the latticed matched condition, strain can be introduced into the GeSn base layer, thus the GeSn layer can be tensile or compressively strained.

Figure 41:
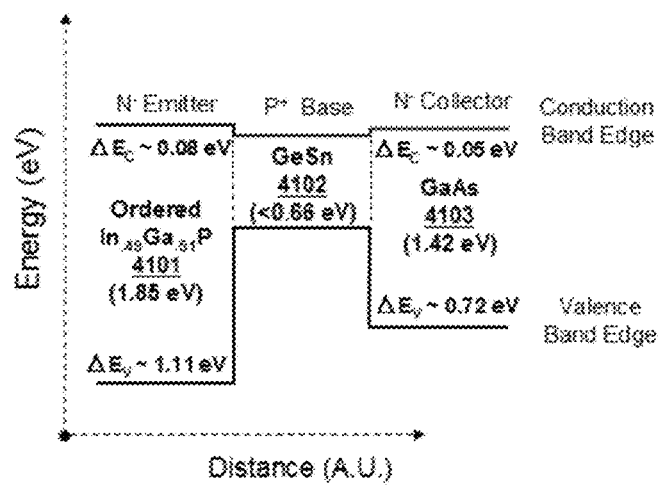
FIG. 41 shows an exemplary flat band energy diagram of an NPN HBT with an ordered InGaP emitter, GeSn base, GaAs collector.
Figure 42:
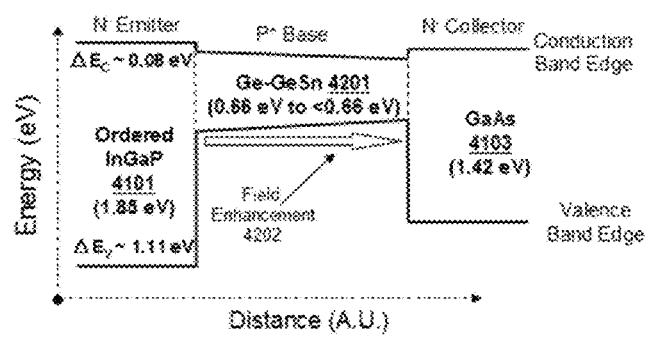
FIG. 42 shows an exemplary flat band energy diagram of an NPN HBT with an ordered InGaP N emitter, a graded GeSn (Ge or low Sn % graded to higher Sn % GeSn) base and a GaAs N collector.

FIG. 41 shows an exemplary flat band energy diagram of an NPN HBT with an ordered InGaP emitter, GeSn base and a GaAs collector. This type of HBT structure is called an asymmetric double heterojunction device. Note conduction band offsets are less than 0.1 eV and are in the near zero conduction band offset range and are desirable for NPN transistors. The ordered $In_{0.49}Ga_{0.51}P$ 4101 (disordered InGaP can also be used here) is an excellent material for the emitter because it has a small conduction band offset and a large valence band offset with GeSn 4102 $P^+$ base region. The N-type GaAs 4103 is a proven collector material for HBTs Additionally, the base can be graded from Ge—GeSn 4201 to have electric field enhancement of the charge carriers (electrons). Such structure creates an electric field that accelerates the electrons across the base to the collector. FIG. 42 shows an exemplary flat band energy diagram of an NPN HBT with an ordered InGaP N emitter, a graded Ge—GeSn 4201 $P^+$ base and a GaAs N collector. The graded Ge—GeSn 4201 layer may comprise at the emitter a Ge or a low Sn % GeSn layer which is graded to higher Sn % GeSn at the collector interface. The grading range can go from Ge at the emitter to GeSn at various compositions up to 20%. The grading of the base provide for a field enhancement 4202 region. One could grow the emitter first and then grade the Ge to GeSn.

Figure 43:
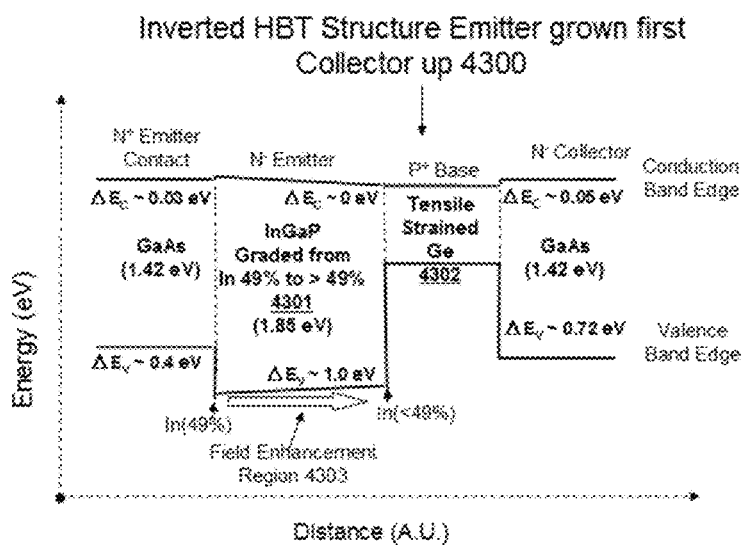
FIG. 43 shows an exemplary flat band energy diagram of an inverted NPN HBT structure where an emitter is grown first, and a base material is tensile strained Ge, collector up structure.

Table 6 shows an exemplary epitaxial structure of an NPN HBT with an ordered InGaP emitter, GeSn base region and a GaAs collector.

band gap base typically refers to the relevant semiconductors with band gaps less than 0.75 eV, like GeSn, Ge, InGaAs, GaAsSb) which results in a low turn-on voltage. The Ge hole mobility is high (2000 $cm^2/Vs$) and acceptors can be incorporated to high density (>1×$10^{19}$ $cm^{-3}$), thus the base can be made ultra-thin (less than 5000 Å) while maintaining a low base sheet resistance (<<18 Ohm/sq) which increases current gain and decreases electron transit time. Ge has true shallow acceptors, so that the hole concentration is generally equal to the acceptor doping level and independent of temperature. Ge has a low base resistivity (0.0002 ohm-cm) which results in a high $F_{max}$. The surface recombination velocity is low for P-type Ge. low resistance ohmic contacts can be formed on P-type Ge. Ge mobility (electron and hole) can be significantly improved by being biaxially tensile strain, thus for both NPN and PNP structures the base sheet resistance can be improved significantly. The Ge hole mobility under tension can exceed 10,000 $cm^2/Vs$ and under biaxial compression of Ge enhances the hole mobility but degrades the electron mobility. Thus Ge is a desirable base material thus GeSn will have similar properties Typically for HBTs the collector is grown first followed by growing the base and then growing the emitter. However, for this structure, it can be advantageous to grow an inverted HBT. By growing the $In_{0.49}Ga_{0.51}P$ emitter first, one could increase the indium content to greater than 49% In, thus, the bandgap energy would be reduced, but the lattice constant would be increased. The conduction band offset between the InGaP (In %>49) would cause the bands to be closer to zero offset between the InGaP and Ge. This methodology could be applied to a Ge base. FIG. 43 shows an exemplary flat band energy diagram of an inverted NPN HBT structure where the emitter is grown first, and the base material is tensile strained Ge. This Inverted HBT structure emitter grown first collector up 4300 has a field enhancement region 4303 in the compositionally graded InGaP 4301 $N^-$ emitter. This structure allows for the $P^+$ base to be tensile strained Ge 4302, thus enhancing the hole mobility. Additionally, one

TABLE 6

Epitaxial structure of NPN HBT with ordered InGaP emitter, GeSn base and GaAs collector.

| Layer | Layer Name | Description | Comment |
|---|---|---|---|
| 1 | $N^+$ cap | ~1000 Å InGaAs (Te-doped >$10^{19}$ $cm^{-3}$) | |
| 2 | $N^-$ Emitter Cap | ~1500 Å GaAs (Si-doped ~5 × $10^{18}$ $cm^{-3}$) | |
| 3 | $N^-$ Emitter | ~500 Å $In_{0.49}Ga_{0.51}P$ (Si-doped ~3 × $10^{17}$ $cm^{-3}$) | ordered |
| 4 | $P^+$ Base | ~500 Å GeSn (B-doped >$10^{19}$ $cm^{-3}$)<br>0 ≤ Sn % ≤ 20%<br>Thickness range 100 Å-5000 Å | Or graded Ge—GeSn |
| 5 | $N^-$ Collector | ~10000 Å GaAs (Si-doped ~1 × $10^{16}$ $cm^{-3}$) | |
| 6 | $N^+$ sub-collector | ~5000 Å GaAs (Si-doped ~5 × $10^{18}$ $cm^3$) | |
| 7 | High Purity Buffer | ~500 Å GaAs (un-doped) | UID |
| 8 | | GaAs semi-insulating substrate | Crystalline |

It should be noted that there are many types of N-type and P-type dopants. For standard III-V semiconductors like GaAs, InP, InGaAs, InGaP, the N-type dopants are Si, Ge, Sn, Pb, S, Se, Te. The P-type dopants for standard III-V semiconductors are C, Zn, Be, Mg. Common dopants for group IV semiconductors like GeSn, Ge, Si, SiGe, GeSiSn for N-type dopants are P, As, Sb. The P-type dopants are B, Al, Ga.

Ge used as a base material in HBTs has many advantages, Ge has the following properties that make it an excellent P-type base. Ge has a low band gap (the term low energy could decrease the In % in the InGaP and then the Ge would be biaxially compressively strained.

The device structure has the following advantages, by growing the emitter InGaP on GaAs, one can initially lattice match the InGaP to the GaAs as shown. When the In composition can be increased to the point where Ge is biaxially tensile strained to about at about 1.75% it then becomes a direct gap semiconductor.

Tensile Strain effects on Ge: It has shown that biaxial tensile compression causes enhancements in the hole and electron mobility. Biaxial tension on the band structure of Ge breaks the heavy hole and light hole band degeneracy and raises the light hole above the heavy hole band. This effectively increases the hole mobility. Typically the Ge band structure shows that it is an indirect semiconductor because the "L" point <111> is the conduction band minimum and the gamma "Γ" point is the valence band maximum. However Ge becomes direct gap semiconductor with 1.4% biaxial tensile strain or greater, because the gamma "Γ" point in Ge band structure gets closer to the valence band maximum faster than the L point <111>, thus making it a direct band gap semiconductor.

With biaxial tensile strain a dramatic increase in the Ge hole mobility "$\mu_h$". Thus, by growing an inverted emitter structure one can effectively tensile or compressive strain the Ge (or GeSn) layer with no degradation in performance. It has been shown experimentally that biaxial tensile can increase the in-plane hole mobility at 3% biaxial strain of a Ge hole mobility>40,000 cm$^2$/Vs. If the InGaP is graded to higher In % then an electric field can be built in that can promote the free charge carriers from the emitter into the base region.

Compressive strain effects on Ge: Ge under biaxial compression shows an enhancement in the in-plane hole mobility. It has been shown experimentally that biaxial compressive strain of 1.7% in the Ge layer increases the low field hole mobility by a factor of 3.38 to 6350 cm$^2$/V-s.

Figure 44:
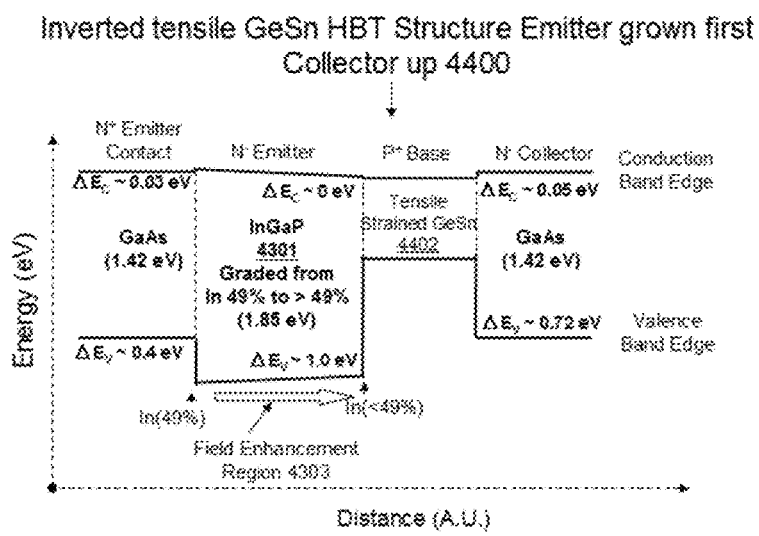
FIG. 44 shows an exemplary flat band energy diagram of an inverted NPN HBT structure where an emitter is grown first, and a base material is tensile strained GeSn, collector up structure.

The elucidated tensile and compressive strain effects should also work for GeSn for low compositions of Sn %. FIG. 44 shows an exemplary flatband energy diagram showing an inverted tensile strained GeSn HBT structure emitter grown first collector up 4400. This NPN HBT structure where the emitter is grown first, and the base material is tensile strained GeSn 4402 has some advantages. This inverted HBT structure has a field enhancement region 4303 in the graded InGaP 4301 N$^-$ emitter. This structure allows for the P$^+$ base to be tensile strained GeSn 4402, thus enhancing the hole mobility. By utilizing InGaP in this configuration one can strain the GeSn in tension or compression.

Figure 45:
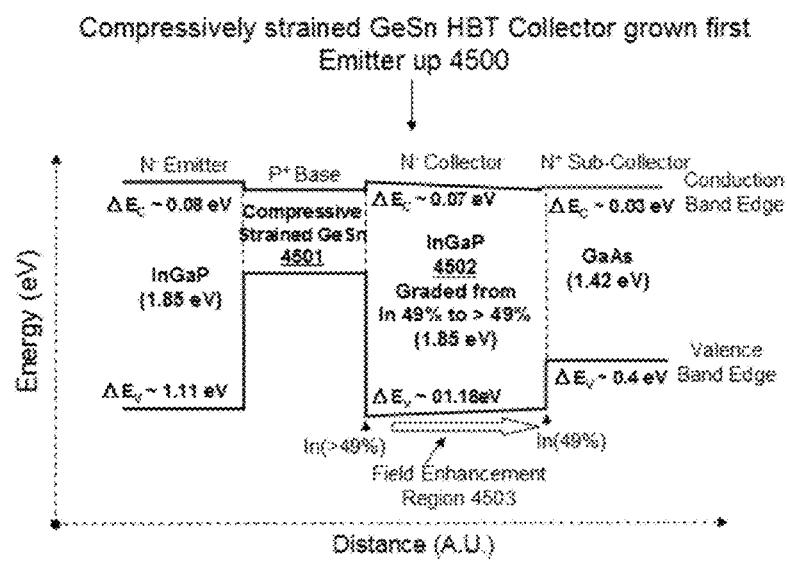
FIG. 45 shows an exemplary flatband energy diagram showing in an NPN configuration a compressively strained GeSn HBT collector grown first, emitter up.

If an inverted structure is not desirable, the collector grown first structure (emitter up) can be grown and the InGaP collector can be graded as follows; from the GaAs sub-collector the InGaP starts at 49% In, then is slowly graded up to an In % greater than 49% at the start of the GeSn base region. This will result in field enhancement region in the collector to accelerate the electrons to the sub-collector. FIG. 45 shows an exemplary flatband energy diagram showing in an NPN configuration a compressively strained GeSn HBT collector grown first emitter up 4500 structure, where the compressive strained GeSn 4501 is grown on the N$^-$ collector InGaP 4502 compositionally graded from In 49% to >49% collector which now has a field enhancement region 4503. This device has the advantage that it is a true double heterojunction almost symmetric device. This would minimize the offset voltage found in standard InGaP—GaAs HBTs that causes a reduction in power added efficiency. Note that compressively strained Ge could also be used as the base region in this device.

Figure 46:
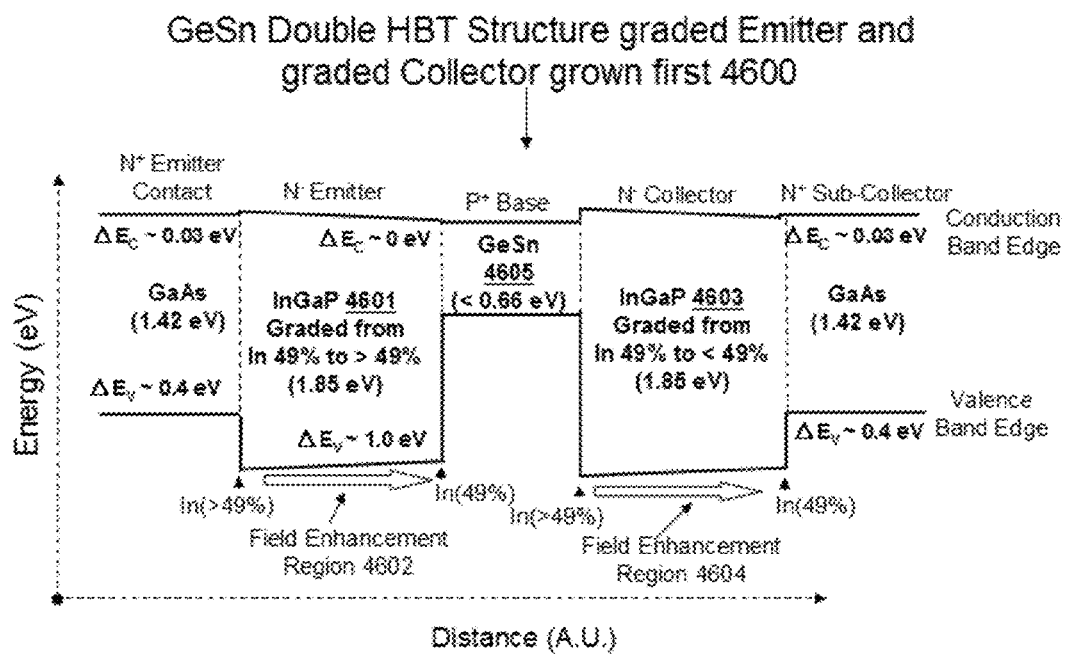
FIG. 46 shows an exemplary flatband energy diagram showing a GeSn Double HBT Structure graded Emitter and graded Collector grown first, where a GeSn base may or may not be compressively strained.

An additional variation of this device results in GeSn that may or may not be biaxially strained, by having both the emitter and collector InGaP layers compositionally graded. Basically this is a combination of the previously described embodiments for the strained GeSn HBTs. Here the emitter and collector both have field enhancement regions because the InGaP is graded in both layers. The standard configuration where the collector is grown first (emitter up) and the InGaP collector can be graded as follows; from the GaAs sub-collector the InGaP starts at 49% In, then is slowly graded up to an In % greater than 49% at the start of the GeSn base. This process is repeated for the emitter where InGaP starts at 49% In, then is slowly graded up to an In % greater than 49% at the start of N emitter contact region. FIG. 46 shows an exemplary flatband energy diagram showing a GeSn Double HBT Structure graded Emitter and graded Collector grown first 4600, where the GeSn 4605 base may or may not be compressively strained. The N$^-$ emitter InGaP 4601 is graded from In % 49% to >49% has a field enhancement region 4602. The N$^-$ collector InGaP 4603 is graded from In % 49% to <49% has a field enhancement region 4604. The field enhancement regions cause an acceleration of the electrons to the NPN device, thus reducing the transit time of the device.

Note through this patent InGaP is used throughout the text. Where ordered InGaP is referred to an equivalent device using disordered InGaP can be used. Likewise where disordered InGaP is used ordered InGaP also be used. Though at some instance the lattice matched composition to GaAs is used In$_{0.49}$Ga$_{0.51}$P. Though this is a useful reference number for starting the InGaP layer can be graded or have a different composition.

Exemplary Configuration 2B: NPN Disordered InGaP Emitter—GeSn Base—GaAs Collector double heterojunction transistor: The device elucidated can include a double heterojunction disordered In$_{0.49}$Ga$_{0.51}$P—GeSn—GaAs HBT device. In some examples, this device has desirable base characteristics with a low voltage base turn-on region. This device structure can be directly inserted into standard manufacturing InGaP—GaAs HBT. This is a slight variation on configuration 2A. The difference is the conduction band offset of disordered InGaP to GeSn is about 0.15 eV (ordered InGaP was about 0.08 at its low Sn %), and the valence band offset of the disordered InGaP to GeSn (low Sn %) is 1.09 eV (ordered InGaP was about 1.11 eV at low Sn %). In some instances it can be easier to grow the disordered InGaP.

Figure 47:
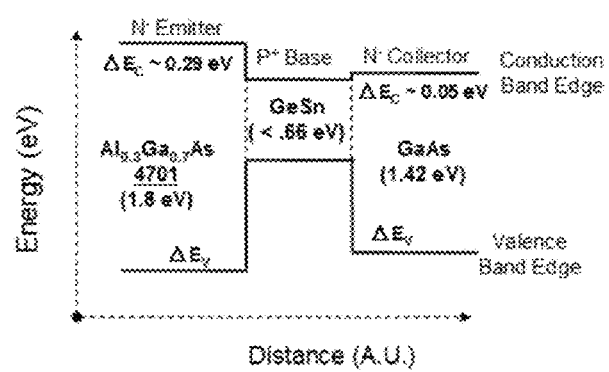
FIG. 47 shows an exemplary flatband energy diagram of an NPN AlGaAs Emitter—GeSn Base—GaAs Collector double HBT.

Exemplary Configuration (2C) NPN AlGaAs Emitter—GeSn Base—GaAs Collector double heterojunction transistor: The device elucidated can include a double heterojunction AlGaAs—GeSn—GaAs HBT device. In some examples, this device has desirable base characteristics with a low voltage base turn-on region. This is a second variation on configuration 2A. For AlGaAs for Al % less than 0.4 the material is direct gap semiconductor. The energy band gap of Al$_{0.3}$Ga$_{0.7}$As, a typical emitter composition, is 1.8 eV (direct gap) as opposed In$_{0.49}$Ga$_{0.51}$P, which has an energy band gap of 1.85 eV (direct gap). The difference is the conduction band offset of Al$_{0.3}$Ga$_{0.7}$As to GeSn (low Sn %) is 0.29 eV (ordered InGaP was 0.08), and the valence band offset of Al$_{0.3}$Ga$_{0.7}$As to GeSn (at low Sn %) is about 0.85 eV (ordered InGaP was 1.11 eV). FIG. 47 shows an exemplary flatband energy diagram of the NPN AlGaAs Emitter—GeSn Base—GaAs Collector double HBT 4700. In this HBT the N emitter is Al$_{0.3}$Ga$_{0.7}$As 4701 but the Al % could be varied to different levels for optimized transport.

Figure 48:
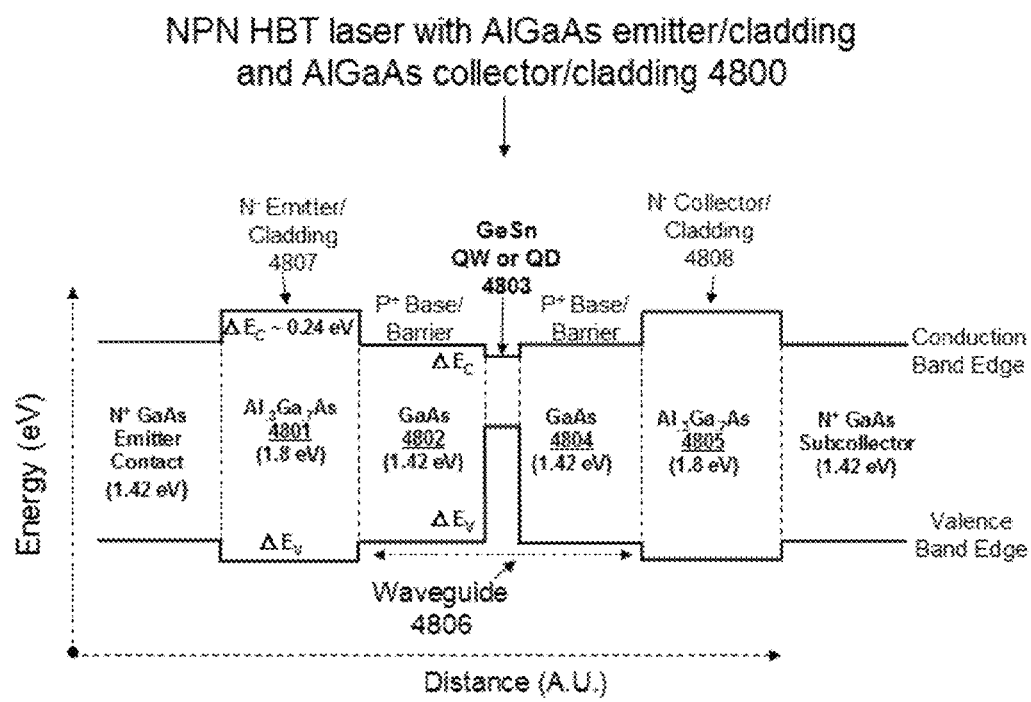
FIG. 48 shows an exemplary flat band energy diagram of an NPN HBT laser with AlGaAs emitter/cladding and AlGaAs collector/cladding.

To fabricate a light emitting NPN heterojunction bipolar transistor in this Al$_{0.3}$Ga$_{0.7}$As (InGaP could also be used as the emitter and collector) emitter HBT, a GeSn QW or QD region can be inserted into the GaAs base (Ge could also be used as the base). FIG. 48 shows an exemplary flat band energy diagram of the NPN HBT laser with AlGaAs emitter/cladding and AlGaAs collector/cladding 4800. This is an exceptional device because the type I alignment allows for excellent carrier and optical confinement. The device structure is symmetric. The N$^-$ Al$_{0.3}$Ga$_{0.7}$As 4801 & 4805 is an excellent cladding layer and has little mismatch with GaAs.

The P+ GaAs base 4802 & 4804 acts as the barrier layer for the GeSn QW or QD 4803 active region. The large energy bandgap difference between the N− Al$_{0.3}$Ga$_{0.7}$As 4801 & 4805 and the P+ GaAs base 4802 & 4804 ensures a large index of refraction difference at the N− emitter/cladding 4807 and P+ GaAs 4802 base interface; and a large index refraction difference at the P+ GaAs base 4804 and N− collector/cladding 4808, thus making an excellent waveguide 4806 to optically confine the light produced by the active region. The laser can require a resonant cavity to get optical gain, and typically this can formed from the front and back cleaved facets of the semiconductor crystal wafer.

Table 7 shows an exemplary table of the epitaxial structure of an NPN light emitting AlGaAs—GaAs—GeSn—GaAs—AlGaAs HBT.

TABLE 7

An exemplary epitaxial structure of an NPN edge emitting transistor laser structure with a GeSn QW or QD active region in a GaAs P-type base/barrier material and AlGaAs Cladding.

| Layer | Layer Name | Description | Comment |
|---|---|---|---|
| 1 | N+ cap | ~1000 Å InGaAs (Te-doped >10$^{19}$ cm$^{-3}$) | |
| 2 | N− Emitter/Cladding | ~5000 Å Al$_{0.3}$Ga$_{0.7}$As (Si-doped ~3 × 10$^{17}$ cm$^{-3}$) Diffferent A % AlGaAs can be used | |
| 3 | P+ Base/Barrier | ~500 Å GaAs (B-doped >10$^{19}$ cm$^{-3}$) | |
| 4 | Undoped QW or QD | ~55 Å GeSn Sn content can be: 0 ≤ Sn % ≤ 20% QW (Sn % ~7% to 12% GeSn) QW thickness range 10 Å-1000 Å QD (Sn % ~12% to 20% GeSn) QD size range 10 Å-200 Å | for light emission 1000 nm-4000 nm |
| 5 | P+ Base/Barrier | ~500 Å GaAs (B-doped >10$^{19}$ cm$^{-3}$) | |
| 6 | N− Collector/Cladding | 5000 Å Al$_{0.3}$Ga$_{0.7}$As (Si-doped ~3 × 10$^{17}$ cm$^{-3}$) Diffferent A % AlGaAs can be used | |
| 7 | N+ sub-collector | ~500 Å GaAs (Si-doped ~5 × 10$^{18}$ cm$^{-3}$) | |
| 8 | N+ Buffer | ~500 Å GaAs (Si-doped ~5 × 10$^{18}$ cm$^{-3}$) | |
| 9 | | N+ GaAs conducting substrate | Crystalline |

Exemplary Configuration 3: an NPN and PNP GeSiSn Emitter—GeSn Base—GeSiSn Collector symmetric double heterojunction transistor. This device configuration is different because GeSiSn can be latticed match to GeSn, even though the GeSiSn has a larger band gap energy than GeSn. In addition, because the ternary alloy GeSiSn can be grown at various compositions, it is possible to also biaxial tensile strain or compressive strain the GeSn base region (lattice constants above and below GeSn). For GeSiSn the Sn % and Si % can be adjusted so that the lattice parameter remains constant. Also P-type and N-type doping have been achieved in GeSiSn. GeSiSn can be grown on Si, GaAs, Ge substrates. For exemplary configuration 3, Si substrates will be a possible choice.

For Si based HBTs, GeSiSn is a unique semiconductor alloy because it can be latticed matched to Ge at the composition Ge$_{1-x}$(Si$_{0.8}$Sn$_{0.2}$)$_x$, where "x" can vary from 0 to 0.5 and the direct gap energy of this material can vary from 0.8 eV to 1.24 eV. Thus GeSiSn is an excellent emitter for a Si HBT or a barrier layer for a GeSn quantum well or quantum dot, because it can be latticed matched to GeSn or can compressively strain the GeSn thus promoting island growth necessary for quantum dot formation. By lowering the Si to Sn ratio in GeSiSn the lattice constant can be decreased.

Figure 49:
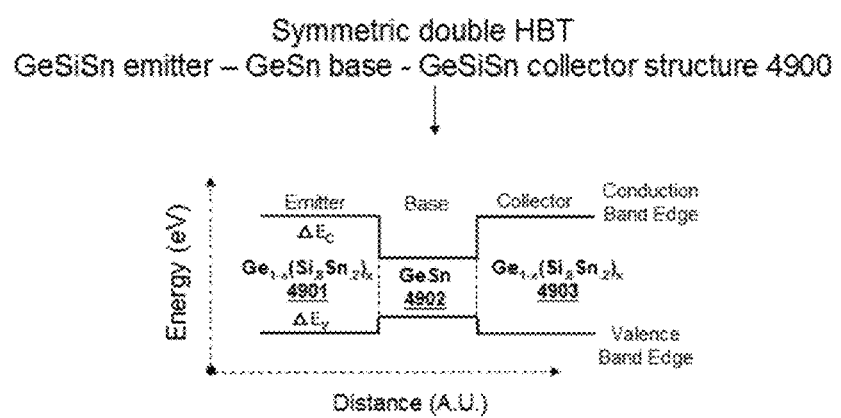
FIG. 49 shows a possible exemplary flat band energy band diagram for a symmetric double heterojunction GeSiSn emitter—GeSn base—GeSiSn collector structure which can work as an NPN or PNP transistor device.

FIG. 49 shows a possible exemplary flat band energy band diagram for a symmetric double HBT GeSiSn emitter—GeSn base—GeSiSn collector structure 4900 which can work as an NPN or PNP transistor device. However, because Ge$_{1-x}$(Si$_{0.8}$Sn$_{0.2}$)$_x$ 4901 & 4903 can be grown at different alloy (x) compositions, both compressive and tensile strain can be applied to the GeSn 4902 base, both configurations PNP and NPN are useful. This figure shows the flat "Γ" band edge energy diagram of the material structure.

Figure 50:
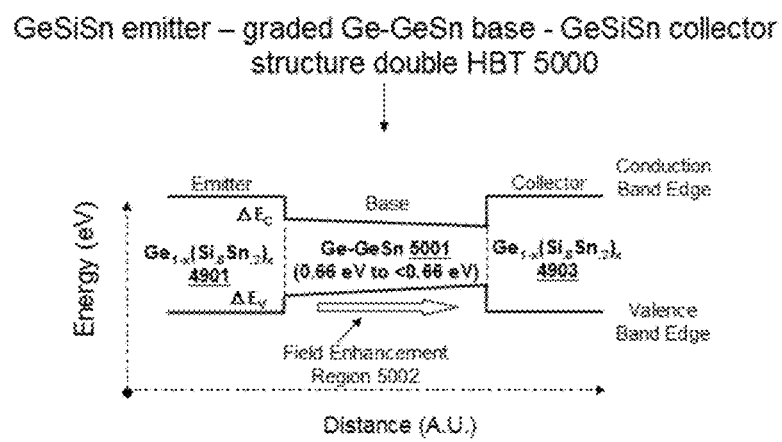
FIG. 50 shows a possible exemplary flat band energy band diagram for GeSiSn emitter—graded GeSn (Ge or low Sn % graded to higher Sn % GeSn) base—GeSiSn collector structure double HBT 5000 which can work as an NPN or PNP transistor device.

Additionally, the base can be graded from Ge to GeSn to have electric field enhancement of the charge carriers (electrons and holes) as shown below in the "Γ" band edge diagram. FIG. 50 shows a possible exemplary flat band energy band diagram for GeSiSn emitter-graded Ge—GeSn base—GeSiSn collector structure double HBT 5000 which can work as an NPN or PNP transistor device. With the graded Ge—GeSn 5001 base region a field enhancement region 5002 is created in the base. Such structure creates an electric field that accelerates the electrons and holes across the base to the collector. The graded Ge—GeSn 5001 layer may comprise at the emitter a Ge or a low Sn % GeSn layer which is graded to higher Sn % GeSn at the collector interface. The grading range can go from Ge at the emitter to GeSn at various compositions up to 20%.

Table 8 shows a possible exemplary structure for a symmetric double heterojunction GeSiSn emitter—GeSn base—GeSiSn collector structure which can work as an NPN device. If the GeSiSn lattice constant is made larger than the GeSn lattice constant, the GeSn can be tensile strained (similar to the InGaP emitter and collector situation). This causes the light hole band to rise above the heavy hold band in the valence band and results in a significant enhancement in the P-type GeSn base mobility and, thus, the same base thickness the base sheet resistance can be reduced and the high frequency performance of the transistor is ($F_{max}$) increased. Additionally, because the hole mobility is enhanced, the base resistivity will be reduced, thus one has the additional option to reduce the thickness of the base while keeping the base sheet resistance unchanged. A thinner base promotes $F_T$ to increase. In this exemplary structure the base could be a P+ Ge layer.

TABLE 8

Epitaxial structure of an NPN heterojunction
GeSiSn emitter - GeSn base - GeSiSn collector

| Layer | Layer Name | Description | Comment |
|---|---|---|---|
| 1 | $N^+$ Emitter Cap | ~1500 Å SiGe (As-doped ~5 × $10^{18}$ $cm^{-3}$) | |
| 2 | $N^-$ Emitter | ~500 Å $Ge_{1-x}(Si_{0.8}Sn_{0.2})_x$ (As-doped ~3 × $10^{17}$ $cm^{-3}$) | |
| 3 | $P^+$ Base | ~500 Å GeSn (B-doped >$10^{19}$ $cm^{-3}$) | Or graded |
| | | 0 ≤ Sn % ≤ 20% | Ge—GeSn |
| | | Thickness range 100 Å-5000 Å | |
| 4 | $N^-$ Collector | ~10000 Å $Ge_{1-x}(Si_{0.8}Sn_{0.2})_x$ | |
| | | (As-doped ~1 × $10^{16}$ $cm^{-3}$) | |
| 5 | $N^+$ sub-collector | ~5000 Å SiGe (As-doped 5 × $10^{18}$ $cm^{-3}$) | |
| | | SiGe Ge content can be varied to accomodate | |
| | | the $Ge_{1-x}(Si_{0.8}Sn_{0.2})_x$ layer | |
| 6 | $N^+$ Buffer | ~500 Å Si (As-doped 2 × $10^{18}$ $cm^{-3}$) | |
| 7 | | $N^+$ Si substrate | Crystalline |

Table 9 shows a possible exemplary structure for a symmetric double heterojunction GeSiSn emitter—GeSn base—GeSiSn collector structure which can work as a PNP device. If the GeSiSn lattice constant is made larger than the GeSn lattice constant then the GeSn can be tensile strained. This cause the light hole band in the valence to split from the heavy hole band and results in an enhancement in the P-type GeSn base mobility can occur and thus reducing the base sheet resistance and increasing the high frequency performance of the transistor. In this exemplary structure the base could be a heavily $N^+$ Ge layer.

TABLE 9

Epitaxial structure of a PNP heterojunction GeSiSn
emitter - GeSn base - GeSiSn collector

| Layer | Layer Name | Description | Comment |
|---|---|---|---|
| 1 | $P^+$ Emitter Cap | ~1500 Å SiGe (B-doped ~5 × $10^{18}$ $cm^{-3}$) | |
| 2 | $P^-$ Emitter | ~500 Å $Ge_{1-x}(Si_{0.8}Sn_{0.2})_x$ (B-doped ~3 × $10^{17}$ $cm^{-3}$) | |
| 3 | $N^+$ Base | ~500 Å GeSn (As-doped >$10^{19}$ $cm^{-3}$) | Or graded Ge—GeSn |
| | | 0 ≤ Sn % ≤ 20% | |
| | | Thickness range 100 Å-5000 Å | |
| 4 | $P^-$ Collector | ~10000 Å $Ge_{1-x}(Si_{0.8}Sn_{0.2})_x$ (B-doped ~1 × $10^{16}$ $cm^{-3}$) | |
| 5 | $P^+$ sub-collector | ~5000 Å SiGe (B-doped ~5 × $10^{18}$ $cm^{-3}$) | |
| | | SiGe Ge content can be varied to accomodate the | |
| | | $Ge_{1-x}(Si_{0.8}Sn_{0.2})_x$ layer | |
| 6 | $P^+$ Buffer | ~500 Å Si (B-doped ~2 × $10^{18}$ $cm^{-3}$) | |
| 7 | | $P^+$ Si substrate | Crystalline |

Figure 51:
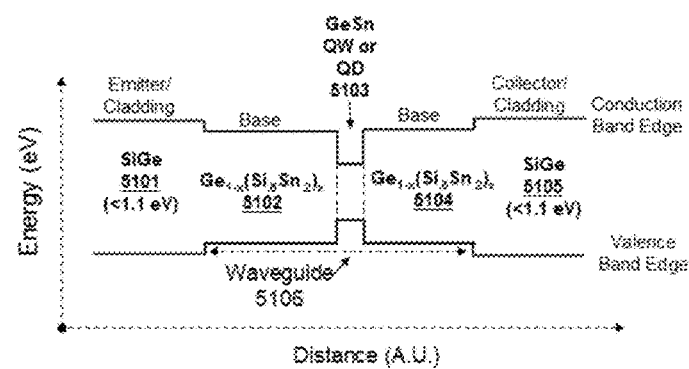
FIG. 51 shows a possible exemplary flat band energy band diagram for a symmetric double HBT where a GeSn QW or QD is embedded in a GeSiSn base region with SiGe emitter/cladding and SiGe collector/cladding.

FIG. 51 shows a possible exemplary flat band energy band diagram for a symmetric double heterojunction transistor where a GeSn QW or QD is embedded in the GeSiSn base region with SiGe emitter/cladding and SiGe collector/cladding. This structure can work as an NPN or PNP transistor light emitter device. Here a GeSn QW or QD 5103 is inserted into a $Ge_{1-x}(Si_{0.8}Sn_{0.2})_x$ 5102 & 5104 base region. The SiGe 5101 emitter/cladding and the SiGe 5105 collector/cladding, form the major index difference for light confinement in the waveguide 5106 region, and also have a large bandgap energy for to funnel carriers into the active region.

Table 10 shows a possible exemplary structure for a symmetric NPN double heterojunction transistor laser structure with an $N^-$ SiGe emitter/cladding, a GeSn QD embedded in $P^+$ GeSiSn base with an $N^-$ SiGe collector/cladding.

TABLE 10

A symmetric NPN double heterojunction transistor laser structure with a SiGe
emitter/cladding, a GeSn QD embedded in GeSiSn base with a SiGe collector/cladding.

| Layer | Layer Name | Description | Comment |
|---|---|---|---|
| 1 | $N^+$ cap | ~1000 Å SiGe (As-doped >$10^{19}$ $cm^{-3}$) | |
| 2 | $N^-$ Emitter Cladding | ~4000 Å SiGe (As-doped ~5 × $10^{17}$) | |
| 3 | $P^+$ Base | ~500 Å $Ge_{1-x}(Si_{0.8}Sn_{0.2})_x$ (B-doped >$10^{19}$ $cm^{-3}$) | |
| 4 | QW or QD undoped | ~55 Å GeSn | Light emission |
| | | Sn content can be: 0 ≤ Sn % ≤ 20% | 1000 nm-4000 nm |
| | | QW (Sn % ~7% to 12% GeSn) | |
| | | QW thickness range 10 Å-1000 Å | |
| | | QD (Sn % ~12% to 20% GeSn) | |
| | | QD size range 10 Å-200 Å | |
| 5 | $P^+$ Base | ~500 Å $Ge_{1-x}(Si_{0.8}Sn_{0.2})_x$ (B-doped >$10^{19}$ $cm^{-3}$) | |

TABLE 10-continued

A symmetric NPN double heterojunction transistor laser structure with a SiGe
emitter/cladding, a GeSn QD embedded in GeSiSn base with a SiGe collector/cladding.

| Layer | Layer Name | Description | Comment |
|---|---|---|---|
| 6 | N⁻ Collector/Cladding | ~4000 Å SiGe (As-doped ~5 × 10$^{17}$ cm$^{-3}$) SiGe Ge content can be varied to accomodate the Ge$_{1-x}$(Si$_{0.8}$Sn$_{0.2}$)$_x$ layer | |
| 7 | N⁺ sub-collector | ~500 Å Si (As-doped ~5 × 10$^{18}$ cm$^{-3}$) | |
| 8 | | N⁺ Si conducting substrate | Crystalline |

Table 11 shows a possible exemplary structure for a symmetric PNP double heterojunction transistor laser structure with a P⁻ SiGe emitter/cladding, GeSn QD embedded in N⁺ GeSiSn base with a P⁻ SiGe collector/cladding.

TABLE 11

A symmetric PNP double heterojunction transistor laser with SiGe emitter/cladding, GeSn
QD embedded in GeSiSn base and SiGe collector/cladding.

| Layer | Layer Name | Description | Comment |
|---|---|---|---|
| 1 | P⁺ cap | ~1000 Å SiGe (B-doped >10$^{19}$ cm$^{-3}$) | |
| 2 | P⁻ upper Cladding | ~4000 Å SiGe (B doped ~5 × 10$^{17)}$) | |
| 3 | N⁺ Base | ~500 Å Ge$_{1-x}$(Si$_{0.8}$Sn$_{0.2}$)$_x$ (As-doped >10$^{19}$ cm$^{-3}$) | |
| 4 | QW or QD undoped | ~55 Å GeSn Sn content can be: 0 ≤ Sn % ≤ 20% QW (Sn % ~7% to 12% GeSn) QW thickness range 10 Å-1000 Å QD (Sn % ~12% to 20% GeSn) QD size range 10 Å-200 Å | Light emission 1000 nm-4000 nm |
| 5 | N⁺ Base | ~500 Å Ge$_{1-x}$(Si$_{0.8}$Sn$_{0.2}$)$_x$ (As doped >10$^{19}$ cm$^{-3}$) | |
| 6 | P⁻ Collector/Cladding | ~4000 Å SiGe (B-doped ~5 × 10$^{17}$ cm$^{-3}$) SiGe Ge content can be varied to accomodate the Ge$_{1-x}$(Si$_{0.8}$Sn$_{0.2}$)$_x$ layer | |
| 7 | P⁺ sub-collector | ~500 Å Si (B-doped ~5 × 10$^{18}$ cm$^{-3}$) | |
| 8 | | P⁺ Si substrate | Crystalline |

It should be noted that there are many types of N-type and P-type dopants. For standard III-V semiconductors like GaAs, InP, InGaAs, InGaP, the N-type dopants are Si, Ge, Sn, Pb, S, Se, Te. The P-type dopants for standard III-V semiconductors are C, Zn, Be, Mg. Common dopants for group IV semiconductors like GeSn, Ge, Si, SiGe, GeSiSn for N-type dopants are P, As, Sb. The P-type dopants are B, Al, Ga.

Exemplary Configuration 4, Si Emitter—SiGe base with GeSn QD—Si Collector transistor laser. The introduction of a GeSn quantum well into a standard SiGe HBT design allows for the novel development of a Si photonic transistor laser. SiGe has a wide range of band gaps as shown by the figure below, which is a plot of the Si$_x$Ge$_{1-x}$ energy bandgap as a function of x or Si content. To fabricate a light emitting bipolar transistor the following flatband diagram is shown for an NPN device. Inserted into the SiGe base is a GeSn quantum well. The base region could also be a thin Ge highly doped material. The figure shows an exemplary flat band energy diagram of the material structure.

Figure 52:
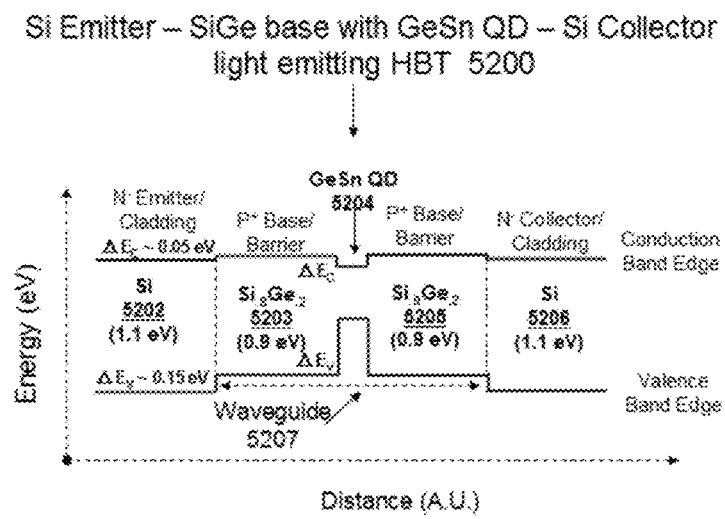
FIG. 52 shows an exemplary flat band diagram of a Si Emitter—SiGe base with GeSn QD—Si Collector light emitting HBT.

FIG. 52 shows an exemplary flat band diagram of a Si Emitter—SiGe base with GeSn QD—Si Collector light emitting HBT 5200. This HBT laser is grown on Si substrates, thus compatible with Si processing. Here a GeSn QD 5204 has barriers region of Si$_{0.8}$Ge$_{0.2}$ 5203 & 5205 P⁺ base/barrier. The Si$_{0.8}$Ge$_{0.2}$ forms the P⁺ base and also acts as a barrier layer for quantum confine the electrons and holes in the GeSn QD 5204. For a QD the growth of a large lattice constant material on a smaller lattice constant material results in strained layer epitaxy allowing the self-assembled three dimensional island growth. Typical quantum dot diameters are in the range of 1-20 nm, but are dependent on the wavelength of light that needs to be emitted. The GeSn 5204 inserted into a base/barrier serves for the collection region for electrons and holes to recombine to generate light. The Si$_{0.8}$Ge$_{0.2}$ 5203 & 5205 also serve as the optical confinement layer and the waveguide material. The Si 5202 & 5206 serves as the N⁻ emitter/cladding and N⁻ collector/cladding material for this structure. The cladding serves as funneling carriers into the active/waveguide region and traps the emit light in the waveguide 5207 structure.

Figure 53:
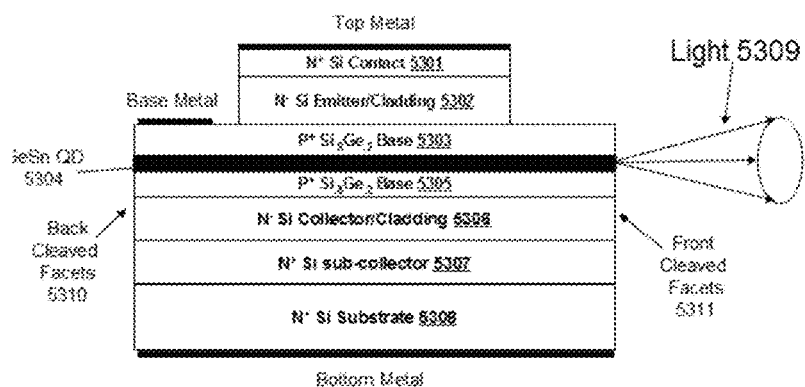
FIG. 53 shows a possible depiction of a cross-sectional device depiction of a Si based edge emitting transistor laser or light emitting structure.

FIG. 53 shows a possible cross-sectional device depiction of a Si based edge emitting transistor laser or light emitting structure. The transistor laser includes a GeSn QD 5304 inserted into a Si$_{0.8}$Ge$_{0.2}$ 5303 & 5305 P⁺ base/barrier of the HBT. The laser can require a resonant cavity to get optical gain, and typically this can be formed from the front and back cleaved facets of the semiconductor crystal wafer. The structure can be grown on N⁺ Si conducting substrate 5308, which is the seed crystal to grow the full structure. An N⁺ Si sub-collector 5307 is grown on the substrate. A N⁻ Si collector/cladding 5306 and the N⁻ Si emitter/cladding 5302 do dual functions of optical confinement of the light 5309 produced form the active region GeSn QD 5304 and the controlling the flow of electrons and holes. The P⁺ Si$_{0.8}$Ge$_{0.2}$ Base 5305 & 5303 form the barrier material for the GeSn QD 5304, and also provide the waveguide material. The laser can require a resonant cavity to get optical gain, and typically this can formed from the front cleaved facets 5311 and back cleaved facets 5310 of the semiconductor crystalline structure.

Table 12: Shows an exemplary structure that could be grown. Note for this HBT device the Si$_{0.8}$Ge$_{0.2}$ base could be graded down to lower Si content or be replaced with a Ge base material.

TABLE 12

Epitaxial structure of NPN light emitting SiGe—GeSn—SiGe HBT

| Layer | Layer Name | Description | Comment |
|---|---|---|---|
| 1 | N$^+$ cap | ~2000 Å Si (As-doped >10$^{19}$ cm$^{-3}$) | As = Arsenic |
| 2 | N$^-$ Emitter/Cladding | ~5000 Å Si (As-doped ~5 × 10$^{17}$ cm$^{-3}$) | |
| 3 | P$^+$ Base | ~500 Å Si$_{.8}$Ge$_{.2}$ (B-doped >10$^{19}$ cm$^{-3}$) | SiGe Could be graded |
| 4 | QD undoped | ~55 Å GeSn | Light emission |
| | | Sn content can be: 0 ≤ Sn % ≤ 20% | 1000 nm-3000 nm |
| | | QD size range 10 Å-200 Å | |
| 5 | P$^+$ Base | ~500 Å Si$_{.8}$Ge$_{.2}$ (B-doped >10$^{19}$ cm$^{-3}$) | SiGe could be graded |
| 6 | N$^-$ Collector/Cladding | ~5000 Å Si (As-doped ~5 × 10$^{17}$ cm$^{-3}$) | |
| 7 | N$^+$ sub-collector | ~2000 Å Si (As-doped ~5 × 10$^{18}$ cm$^{-3}$) | |
| 8 | | N$^+$ Si conducting substrate | Crystalline |

Figure 54:
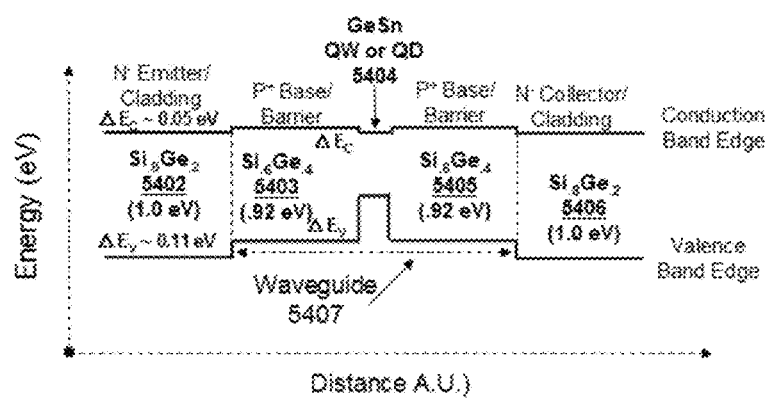
FIG. 54 shows an additional of the variation laser structure of FIG. 52, using $Si_{0.6}Ge_{0.4}$ as a Base/Barrier material.

FIG. 54 shows a laser structure, an additional variation of FIG. 52, because using higher Ge content in the Si$_{0.6}$Ge$_{0.4}$, it can be possible to produce QWs or QDs in this structure. FIG. 54 shows the flat band energy diagram of this structure. The laser includes a GeSn QW or QD 5404 inserted into a Si$_{0.6}$Ge$_{0.4}$ P$^+$ barrier/base 5403 & 5405. This HBT laser is grown on Si substrates, thus compatible with Si processing. The Si$_{0.6}$Ge$_{0.4}$ forms the P$^+$ base and also acts as a barrier layer for quantum confine the electrons and holes in the GeSn QW or QD 35404. The GeSn QW or QD 5404 inserted into a base/barrier serves for the collection region for electrons and holes to recombine to generate light. The Si$_{0.6}$Ge$_{0.4}$ 5403 & 5405 also serve as the optical confinement layer and the waveguide material. The Si$_{0.8}$Ge$_{0.2}$ 5402 & 5406 serves as the emitter/cladding and collector/cladding material for this structure. The cladding serves as funneling carriers into the active/waveguide 5407 region and traps the emitted light in the waveguide structure.

Table 13: Shows an exemplary structure that could be grown which includes Si$_{0.6}$Ge$_{0.4}$ P$^+$ base.

Figure 55:
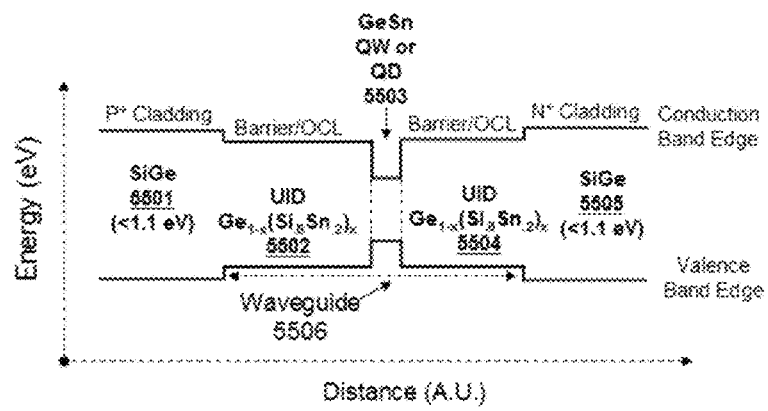
FIG. 55 shows an exemplary flat band energy diagram of an SCH laser utilizing a GeSn QW or QD region located in UID $Ge_{1-x}(Si_{0.8}Sn_{0.2})_x$ barrier/OCL.

FIG. 55 shows an exemplary flat band energy diagram of an SCH laser utilizing a GeSn QW or QD region 5503 located in UID Ge$_{1-x}$(Si$_{0.8}$Sn$_{0.2}$)$_x$ barrier/OCL layer 5502 & 5504 region with P$^+$ SiGe 5501 cladding and N$^+$ SiGe 5505 cladding layers. This structure represents a PN junction or diode with an unintentionally doped (UID) active region and optical confinement region between the P$^+$ SiGe 5501 and N$^+$ SiGe 5505 cladding. The UID Ge$_{1-x}$(Si$_{0.8}$Sn$_{0.2}$)$_x$ 5502 & 5504 forms the barrier material for the GeSn QW or QD 5503 active region. The combination of the barrier and active region forms the waveguide 5506 of the laser. The P$^+$ SiGe 5501 cladding region serves for injection of the holes and for the optical confinement of the light emitted from the active region. The N$^+$ SiGe 5505 cladding region serves for injection of the electrons and for the optical confinement of the light emitted from the active region in the waveguide 5506. The UID Ge$_{1-x}$(Si$_{0.8}$Sn$_{0.2}$)$_x$ 5502 & 5504 could be replaced with a Ge barrier layer as an alternative version of the SCH laser structure. The Ge barrier to GeSn would have a type I heterojunction alignment.

TABLE 13

Epitaxial structure of NPN light emitting SiGe—GeSn—SiGe HBT (with Si$_{.6}$Ge$_{.4}$)

| Layer | Layer Name | Description | Comment |
|---|---|---|---|
| 1 | N$^+$ cap | ~2000 Å Si$_{.8}$Ge$_{.2}$ (As-doped >10$^{19}$ cm$^{-3}$) | As = Arsenic |
| 2 | N$^-$ Emitter/Cladding | ~5000 Å Si$_{.8}$Ge$_{.2}$ (As-doped ~5 × 10$^{17}$ cm$^{-3}$) | |
| 3 | P$^+$ Base | ~500 Å Si$_{.6}$Ge$_{.4}$ (B-doped >10$^{19}$ cm$^{-3}$) | SiGe could be graded |
| 4 | QW or QD undoped | ~55 Å GeSn | Light emission |
| | | Sn content can be: 0 ≤Sn % ≤ 20% | 1000 nm-4000 nm |
| | | QW (Sn % ~7% to 12% GeSn) | |
| | | QW thickness range 10 Å-1000 Å | |
| | | QD (Sn % ~12% to 20% GeSn) | |
| | | QD size range 10 Å-200 Å | |
| 5 | P$^+$ Base | ~500 Å Si$_{.6}$Ge$_{.4}$ (B-doped >10$^{19}$ cm$^{-3}$) | SiGe could be graded |
| 6 | N$^-$ Collector/Cladding | ~5000 Å Si$_{.8}$Ge$_{.2}$ (As-doped ~5 × 10$^{17}$ cm$^{-3}$) | |
| 7 | N$^+$ sub-collector | ~2000 Å Si (As-doped ~5 × 10$^{18}$ cm$^{-3}$) | |
| 8 | | N$^+$ Si conducting substrate | Crystalline |

The transistor laser has the integrated features of both the transistor and the laser. From such a structure it can be straightforward to simplify the structure and grow a separate confinement heterostructure (SCH) laser.

Table 14 shows an exemplary epitaxial structure SCH injection diode laser with a GeSn QW or QD region with GeSiSn barriers.

TABLE 14

Exemplary epitaxial structure SCH injection diode laser with a GeSn QW or QD region with GeSiSn barriers.

| Layer | Layer Name | Description | Comment |
|---|---|---|---|
| 1 | P$^+$ cap | ~1000 Å SiGe (B-doped >10$^{19}$ cm$^{-3}$) | |
| 2 | P$^+$ Cladding | ~5000 Å SiGe (B-doped ~1 × 10$^{18}$) | |

TABLE 14-continued

Exemplary epitaxial structure SCH injection diode laser
with a GeSn QW or QD region with GeSiSn barriers.

| Layer | Layer Name | Description | Comment |
|---|---|---|---|
| 3 | UID Barrier/OCL | ~500 Å $Ge_{1-x}(Si_{0.8}Sn_{0.2})_x$ | Also could use a Ge barrier |
| 4 | QW undoped Or QD | ~55 Å GeSn<br>Sn content can be: 0 ≤ Sn % ≤ 20%<br>QW (Sn % ~7% to 12% GeSn)<br>QW thickness range 10 Å-1000 Å<br>QD (Sn % ~12% to 20% GeSn)<br>QD size range 10 Å-200 Å | Light emission<br>1000 nm-4000 nm |
| 5 | UID Barrier/OCL | ~500 Å $Ge_{1-x}(Si_{0.8}Sn_{0.2})_x$ | Also could use a Ge barrier |
| 6 | N$^+$ Cladding | ~5000 Å SiGe (As-doped ~1 × $10^{18}$ cm$^{-3}$)<br>SiGe: Ge content can be varied to accomodate the $Ge_{1-x}(Si_{0.8}Sn_{0.2})_x$ layer | |
| 7 | N$^+$ Buffer | ~5000 Å Si (As-doped ~5 × $10^{18}$ cm$^{-3}$) | |
| 8 | | N$^+$ Si conducting substrate | Crystalline |

Exemplary Configuration 5A: An NPN GaAs Emitter—GeSn Base—GaN Collector double heterojunction bipolar transistor with dissimilar materials. This device configuration comprises an emitter/base stack of GaAs—GeSn wafer bonded to a GaN collector. GaN with its high band gap offers tremendous improvements in the breakdown voltage of the HBT. The device elucidated can include a double heterojunction GaAs—GeSn—GaN HBT device. The advent of device technology based on GaN with its high electric field strength is a new direction for high-power RF amplification. GaN based materials have a large bandgap and high electron saturation velocity. The embodiments described herein demonstrate a new semiconductor transistor IC with ultra-high performance in applications requiring both high speed and high power rugged electronics. In examples described herein, the GaN can be grown on the various substrates like sapphire, SiC, Si GaAs, GaN and template substrates.

Polar GaN wurtzite structure can be grown on sapphire, SiC (many polytypes: 3C, 4H, 6H, etc.), Si substrates, or template substrates and has piezoelectric and polarization charge. GaN grown in the wurtzite (hexagonal) phase results in large spontaneous and piezoelectric polarization charge.

Non-polar GaN cubic (FCC) structure can be grown on GaAs, Si, or template substrates. GaN in this form has no polarization charge. A cubic form of GaN with (001) orientation can be grown on zinc blend GaAs. Thus the cubic GaN can be grown on conducting GaAs which can act as the sub-collector. The zinc-blend (cubic) GaN collector has a negligible conduction band offset with respect to the GeSn base. The conduction band offset between GaAs and cubic GaN is roughly $\Delta E_C$~-0.024 eV. Thus the GeSn (close to Ge) the conduction band offset to GaN is about $\Delta E_C$~0 eV at the base/collector heterojunction. Additionally, non-polar wurtzite forms can be cut from the c-plane growth along the "a" or "m" plane directions. If the GaN is grown along the m or a-plane axis, these polarization effects can be eliminated. Typical GaN wurzite crystals grown along the direction (c-plane) of III-nitrides suffer from polarization induced electric fields. Electric fields do not exist across the along nonpolar directions a-plane or m-plane). Thus, high quality non-polar GaN substrate crystals are produced by slicing a c-plane GaN boule along the "a" or "m" plane. This results in low defect density non-polar substrates, which have improved substrates for fabrication of devices.

The GaAs—GeSn—GaN heterojunction transistor described herein represents a revolutionary jump in both high power and high frequency performance. This device embodies enormous RF power output, ruggedness, high bandwidth, and good linearity, combined with low turn-on voltage, which is desirable for minimizing power consumption. This unique arrangement of materials combines the high transconductance of heterojunction bipolar transistor (HBT) technology, with the enormous breakdown voltage (using a GaN collector), and a desirable emitter-base heterojunction (wide band-gap GaAs emitter on a narrow band-gap high conductivity P-type GeSn base). The huge breakdown field of GaN allows the use of short collector devices with high bandwidths (e.g. cut-off frequency $F_t$ and maximum oscillation frequency $F_{max}$>than 150 Ghz). The combination of a low band-gap (<0.66 eV) GeSn base coupled with a wide band-gap GaN (~3.4 eV) collector can be used for high speed power applications. By using a vertical stack of junctions, the device layers are shorter, resulting in lower resistances and shorter transit delays, both contributing to much higher frequencies. The use of efficient GaAs—GeSn—GaN transistors can significantly enhance battery life while also enabling operation at high powers with exceptional frequency response. Ultra high performance transistors that can operate at higher temperatures, higher power densities, higher voltages and higher frequencies are desirable for next-generation commercial applications (IT, consumer, automotive, industrial, etc.).

By utilizing various crystal growth technologies, pulse laser ablation epitaxy, molecular beam epitaxy, metal organic chemical vapor deposition, liquid phase epitaxy, vapor phase epitaxy, or various other epitaxial growth techniques for the growth of base-emitter stack of P$^+$ GeSn base onto the N$^-$ GaAs emitter thus forming the base-emitter stack, because at low Sn % lattice of GeSn is close to that of GaAs. Then the GeSn—GaAs emitter stack can be coupled with the exemplary wafer bonding technology can be merged to the GaN collector as described herein, thus forming a monolithic GaAs(emitter)-GeSn(base)-GaN(collector) semiconductor stack that is a desirable HBT embodiment for high-power, high-frequency electronics can be created. In some examples, the uniqueness of embodiments can result in a near zero conduction band offset through the three different semiconductor materials (GaAs—GeSn—GaN). New materials are required to build high power electronics that can also operate at frequencies in the 10 to 100 GHz range. The formation of near lattice-matched GeSn on GaAs then wafer bonded to GaN is a possible key to the realization of these devices.

Figure 56:
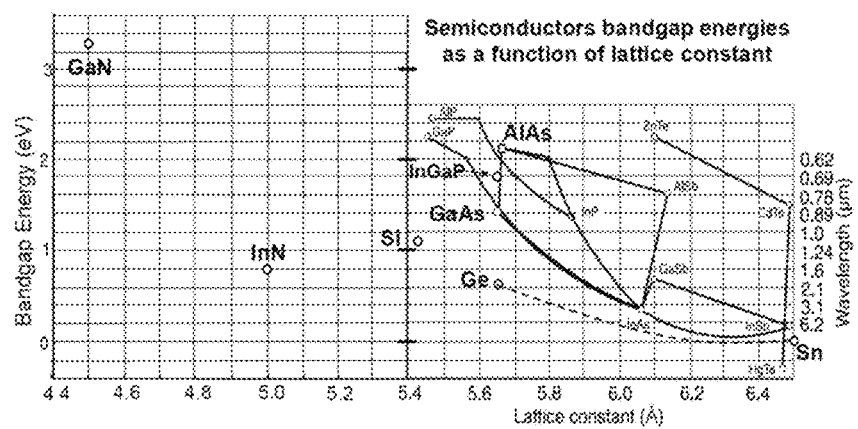
FIG. 56 shows energy band gaps of various semiconductors vs. their lattice constant.

FIG. 56 shows the energy band gaps of various semiconductors vs. their lattice constant. The graph has a vertical axis with the values of the bandgap energy (eV) and a horizontal axis with the values of the Lattice constant (Å). Various semiconductors are plotted as a function of their bandgap energy and lattice constant. The condition of lattice matching constrains certain combinations of semiconductors. It is readily seen that new types of semiconductor devices can be formed if the lattice matching constraint were eliminated. It would then be possible to optimize new types of heterojunctions based on the optimized materials characteristics instead of those constrained to near lattice constant materials.

The merging of the GeSn base region with the GaN collector by utilizing the wafer bonding process for fabrication of heterogeneous materials described herein. With this approach, the GeSn and GaN epitaxial layers can be joined to make a single composite structure. Monolithic wafer bonding is an advanced process for forming PN junctions. This wafer bonding technique allows formation of a robust monolithic structure, where the interface is covalently bonded. The new composite material establishes the GeSn—GaN base-collector heterointerface. Wafer bonding allows for the formation of a heterointerface without having to perform heteroepitaxy of two poorly latticed matched materials.

The new HBT has a base-collector junction comprising the GeSn P+ base region wafer bonded to the GaN N− collector is described herein. GeSn lattice constant can vary from 5.65 Å to 5.833 and lattice constant of GaN is 4.4 Å, which is a huge mismatch (>28%). Such a mismatch does not allow for single or unstrained crystal structures, because the critical thickness for the base to be grown on the collector would be thin. With our approach, the GeSn and GaN epitaxial layers can be joined to make a single composite crystalline structure. The wafer bonding technique described herein allows us to form a junction that is a robust monolithic structure, where the interface is covalently bonded.

Figure 57:
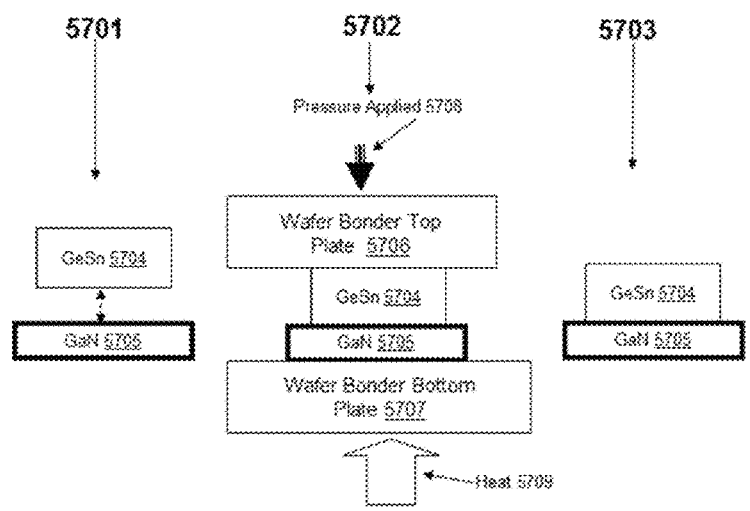
FIG. 57 shows an exemplary wafer bonding process that enables monolithic joining of two dissimilar semiconductor materials.

FIG. 57 shows the exemplary wafer bonding process that enables monolithic joining of two dissimilar semiconductor materials. By employing pressure, heat, gas ambient, and time, covalently bonded composite structures can be developed. The new composite material establishes the critical GeSn—GaN base-collector heterointerface. Wafer bonding allows formation of a heterointerface without having to perform heteroepitaxy of two poorly matched materials. Exemplary wafer bonding methodology comprises (5701) the GeSn 5704 and GaN 5705 semiconductors are cleaned in preparation for joining, (5702) the GeSn 5704 and GaN 5705 are placed on each other in between the wafer bonder top plate 5706 and wafer bonder bottom plated 5707, basically the jaws of the wafer bonder, and held under heat 5709 and pressure 5708 for the requisite time and in a gas ambient, then (5703) the final structure is a monolithic composite material with GeSn 5704 bonded to GaN 5705. The GaAs—GeSn—GaN material structure avoids the use of ternary alloy semiconductors thereby making the epitaxial process less complex and eliminating alloy scattering of electrons.

NPN GaAs—GeSn—GaN HBTs can include the following concepts: Growth of near lattice matched P-type GeSn base on N-type GaAs emitter (GeSn/GaAs stack) because the lattice constant of Ge is almost the same as GaAs thus for low content Sn, GeSn has a slightly larger lattice constant than GaAs. Monolithic formation by wafer bonding of GeSn/GaAs stack to the N-type GaN (to circumvent large lattice mismatched growth). One of the advantages of the embodiments described herein is the formation of a unique transistor semiconductor stack that can have a near zero conduction band offset between all three materials, with each material optimized for overall HBT performance.

Figure 58:
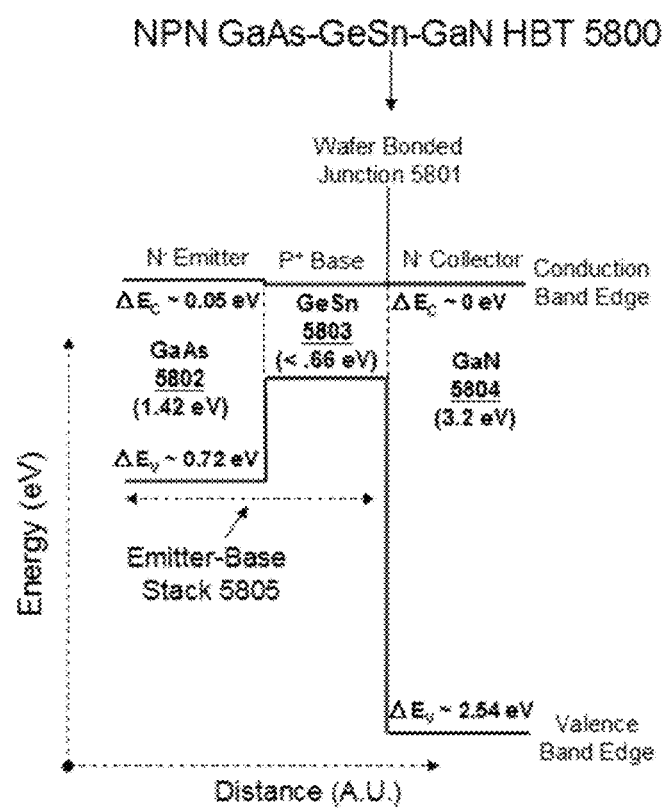
FIG. 58 shows an exemplary flat band energy diagram wafer bonded NPN GaAs—GeSn—GaN HBT.

FIG. 58 shows an exemplary flat band energy diagram wafer bonded NPN GaAs—GeSn—GaN HBT 5800. Here an emitter up emitter-base stack 5805 comprising of N− emitter GaAs 5802 grown on P+ Base GeSn 5803 structure. The full monolithic structure can be formed using an epitaxial liftoff (ELO) procedure. This emitter-base stack 5805 is wafer bonded to the N− collector GaN 5804 thus forming a wafer bonded junction 5801 at the base-collector interface. The methodology of wafer bonding this emitter-base stack to the GaN is described in Exemplary ELO Wafer Bonding Configuration 6A. Note the conduction band offset $\Delta E_C$ is approximately near zero through the NPN HBT structure.

Figure 59:
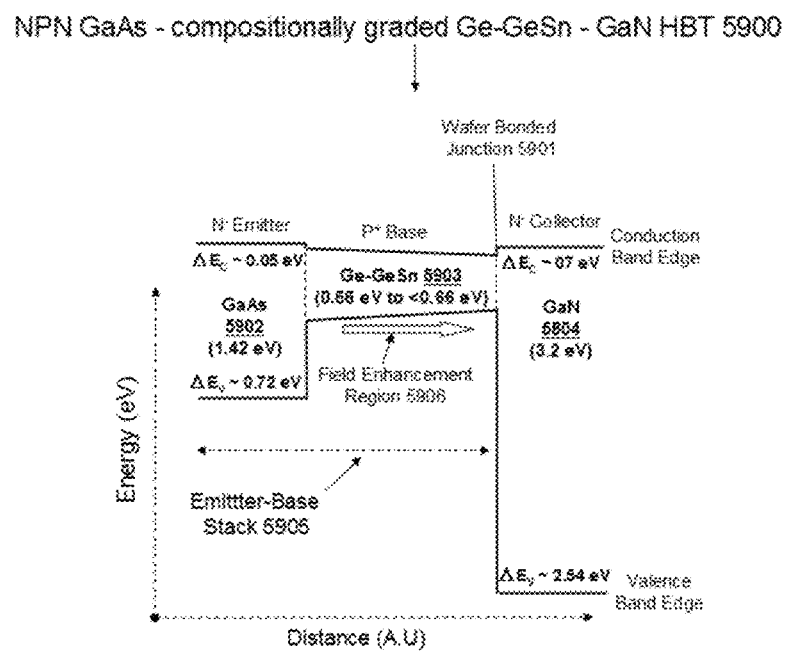
FIG. 59 shows an exemplary flat band energy diagram of an NPN GaAs-graded GeSn—GaN HBT.

Additionally, the base can be graded from Ge—GeSn to have electric field enhancement of the charge carriers. FIG. 59 shows an exemplary flat band energy diagram of the NPN GaAs, graded Ge—GeSn, GaN HBT 5900. Here a base up emitter-base stack 5905 comprises P+ Base compositionally graded Ge—GeSn 5903 and grown on an N− emitter GaAs 5902 structure. The compositionally graded Ge—GeSn 5903 layer may comprise at the emitter interface a Ge or a low Sn % GeSn layer which is graded to higher Sn % GeSn at the collector interface. The compositional grading range can go from Ge at the emitter to GeSn at various compositions up to 20%. This emitter-base stack 5905 is then wafer bonded with the P+ Base next to the N− collector GaN 5804 thus forming a wafer bonded junction 5901 at the base-collector interface. Due to the compositional grading of the Ge—GeSn 5903 in the P+ Base, there is a field enhancement region 5906 that accelerates the carriers toward the collector. The methodology of wafer bonding this emitter-base stack is described in Exemplary Inverted Wafer Bonding Configuration 6B. Note the conduction band offset $\Delta E_C$ is small through the NPN HBT structure.

Figure 60:
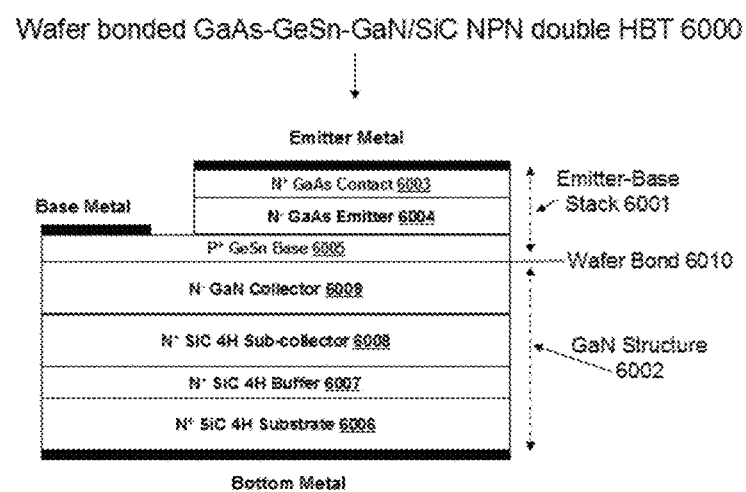
FIG. 60 shows an exemplary cross-sectional device depiction of a wafer bonded GaAs—GeSn—GaN NPN double HBT in a mesa configuration.

FIG. 60 shows an exemplary cross-sectional device depiction of the wafer bonded GaAs—GeSn—GaN NPN double HBT 6000 in a mesa configuration. Note that this is a vertical device, which is desirable for power applications because the lateral area can be minimized. The device is grown on an N+ SiC 4H substrate 6006. The NPN HBT comprises an emitter base stack 6001 with a wafer bond 6010 to the GaN structure 6002 to form the monolithic device. The GaN structure 6002 can comprise a variety of forms, but for an exemplary case the GaN is grown on a SiC substrate, though a GaN, sapphire, GaAs, Si substrate could also be used. Starting with an N+ SiC substrate 6006, which can be of the 3C, 4H, 6H, etc. variety, on which an N+ SiC buffer 6007 is grown. Then an N+ SiC sub-collector 6008 can be grown, onto which an N− GaN collector 6009 is grown. This finalizes the GaN structure 6002. Because the GaN is grown on 4H SiC (wurtzite or hexagonal) this results in a polar GaN collector 6009. For the emitter-base stack 6001 an ELO procedure to be described in Configuration 6A, forms the N+ GaAs contact 6003—the N− GaAs emitter 6004 and the P+ GeSn base 6005, finalizing the emitter base stack 6001. P+ GeSn base 6005 layer forms the heavily doped P-type base. GeSn also has a large hole mobility which is a precondition for making the base region thin. The conduction band offset between GaAs—GeSn is almost zero, thus the majority of the 0.75 eV bandgap difference appears in the valence band. The GaN can serve as the collector layer with a large breakdown voltage for the transistor because it has a large bandgap energy of 3.2 eV.

Table 15 is an exemplary Epitaxial structure of an NPN GaAs—GeSn—GaN wafer bonded HBT. In this structure, the GaN is grown on SiC which is a typical substrate for the growth and one of the many described substrates that can be used. SiC is preferred for high power electronics because it has the highest thermal conductivity between GaN, Si, GaAs and sapphire the other primary substrates for GaN.

TABLE 15

Epitaxial structure of an NPN GaAs—GeSn—GaN wafer bonded HBT

| Layer | Layer Name | Description | Comment |
|---|---|---|---|
| 1 | N$^+$ cap | ~1000 Å InGaAs (Te-doped >10$^{19}$ cm$^{-3}$) | |
| 2 | N$^-$ Emitter Cap | ~1500 Å GaAs (Si-doped ~5 × 10$^{18}$ cm$^{-3}$) | |
| 3 | N$^-$ Emitter | ~500 Å GaAs (Si-doped ~3 × 10$^{17}$ cm$^{-3}$) | |
| 4 | P$^+$ Base | ~500 Å GeSn (B-doped >10$^{19}$ cm$^{-3}$) 0 ≤ Sn % ≤ 20% Thickness range 100 Å-5000 Å | Or graded Ge—GeSn |
| 5 | N$^-$ Collector | ~10000 Å GaN (N-doped ~1 × 10$^{16}$ cm$^{-3}$) | Wafer Bonded to above |
| 6 | N$^+$ sub-collector | ~5000 Å SiC (N-doped ~5 × 10$^{18}$ cm$^{-3}$) | |
| 7 | High Purity Buffer | ~500 Å SiC (N-doped ~5 × 10$^{18}$ cm$^{-3}$) | N = nitrogen |
| 8 | | N$^+$ SiC (4H) conducting substrate | Crystalline |

Figure 61:
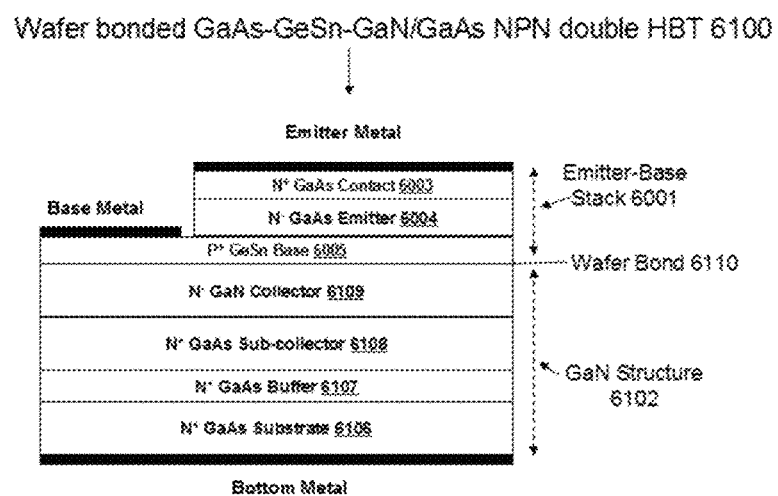
FIG. 61 shows a possible exemplary cross-section embodiment of a wafer bonded GaAs—GeSn—GaN NPN double HBT in a mesa configuration.

FIG. 61 shows another possible exemplary cross-section device depiction of the wafer bonded GaAs—GeSn—GaN NPN double HBT 6100 in a mesa configuration. Note that this is a vertical device, which is desirable for power applications because the lateral area can be minimized. In this case the device is grown on a face centered cubic (FCC) N$^+$ GaAs substrate 6106. The NPN HBT comprises an emitter base stack 6001 with a wafer bond 6110 to the GaN structure 6102 to form the monolithic device. The GaN structure 6102 can comprise a variety of forms, but for an exemplary case the GaN is grown on a GaAs substrate, though a GaN, sapphire, SiC, Si substrate could also be used. Starting with an N$^+$ GaAs substrate 6106, which a N$^+$ GaAs buffer 6107 is grown. Then an N$^+$ GaAs sub-collector 6108 can be added, onto which an N$^-$ GaN collector 6109 is grown. This finalizes the GaN structure 6102. Because the GaN is grown on FCC GaAs (cubic) this results in a non-polar GaN collector 6109. An ELO procedure in Configuration 6A, describes how the emitter-base stack 6001 is wafer bonded to the GaN collector structure. P$^+$ GeSn base 6005 layer forms the heavily doped P-type base. GeSn also has a large hole mobility which is a precondition for making the base region thin. The conduction band offset between GaAs—GeSn is almost zero, thus the majority of the 0.75 eV bandgap difference appears in the valence band. The GaN can serve as the collector layer with a large breakdown voltage for the transistor because it has a large bandgap energy of 3.2 eV.

In some examples, formation of this monolithic composite material of an NPN GaAs—GeSn—GaN wafer bonded HBT can create a desirable device architecture in that the conduction band offsets are near zero for both emitter-base and base-collector hetero-interfaces and the valence band offset is large at the emitter-base GaAs—GeSn and base-collector GeSn—GaN heterojunctions. This property allows for the formation of heterojunction transistor structure that can have large gain (large valence band offset between GaAs and GeSn), low base sheet resistance (GeSn has high hole mobility) and, low turn-on voltage (GeSn has low band-gap energy), and large breakdown voltage (GaN has large breakdown electric field strength and high saturated velocity), which are desirable device metrics for next-generation electronic transistors. The GaAs—GeSn—GaN HBT has the gain of GaAs, the huge breakdown voltage for robustness, the high frequency performance greater than GaAs HBTs, the low turn-on voltage of GeSn, improved electron transport because of the near zero conduction band offset between the emitter-base-collector. Electrons can easily be injected from the GaAs emitter through the GeSn base to the GaN collector. By adding the ability to grade the base composition from Ge—GeSn such that the bandgap energy of the material is gradually reduced throughout the base as described in our configurations. This grading causes an electric field, which in turn reduces the transit time, thus increasing $F_t$. The GaAs—GeSn—GaN materials stack can be desirable for making NPN HBTs that can outperform standard SiGe, GaAs, and InP heterojunction bipolar transistors.

Exemplary GaAs emitter advantages: The large valence band offset between GaAs emitter and GeSn base can stop back injection of holes into the emitter. This is desirable because the base is doped heavily P-type (typically>1×10$^{19}$ cm$^{-3}$), with such high doping of the base, the emitter-base valence band offset blocks the holes even though the base doping is much higher than the N-type emitter doping (low 10$^{17}$ cm$^{-3}$). This allows for low N-type doping of the emitter and high P-type doping of the base, thus lowering base emitter capacitance while still achieving sizable current gain. GeSn is near latticed matched to GaAs (5.65 Å), which enables dislocation free growth. GaAs—GeSn—GaN material structure avoids the use of ternary alloy semiconductors thereby making the epitaxial process less complex and eliminating alloy scattering of electrons. The use of a GaAs (instead of InGaP) emitter and GaN (instead of GaAs) collector significantly increases the overall thermal conductivity of the material structure. The GaAs—GeSn emitter base junction has a large valence (at least 0.72 eV which is larger than the GeSn band gap). This eliminates the back injection of holes to the emitter from the base, which reduces the gain of the transistor.

Exemplary GeSn Base Advantages (low Sn % similar properties to Ge): GeSn has a low band gap (lower than Ge: the term low energy band gap base typically refers to the relevant semiconductors with band gaps less than 0.75 eV, like GeSn, Ge, InGaAs, GaAsSb) which results in low turn-on voltage (less than 0.5 V). GeSn (low Sn %) hole mobility is high (2000 cm$^2$/Vs) like Ge and acceptors can be incorporated to high density (>1×10$^{19}$ cm$^{-3}$), thus the base can be made ultra-thin while maintaining a low base sheet resistance which increases current gain and decreases electron transit time. By adding the ability to grade the base composition from Ge to GeSn such that the bandgap energy of the material is gradually reduced throughout the base as described in our configurations. This grading causes an electric field, which in turn reduces the transit time, thus increasing $F_t$. GeSn can be made to become a direct gap semiconductor (unlike Ge which is an indirect semiconductor). GeSn for low Sn concentration has shallow acceptors, so the hole concentration is generally equal to the acceptor doping level and independent of temperature. GeSn can be heavily doped P-type. The low base sheet resistance (<<less than 18 Ohm/sq) results in a high $F_{max}$. (>than 150 GHz), GeSn hole resistivity should be on the order of 0.0002 Ohm-cm. The surface recombination velocity is low for P-type Ge and GeSn.

Exemplary GaN Collector advantages: GaN collector can be grown on GaN, SiC (many polytypes, i.e. 3C, 4H, 6H), Si, Sapphire, GaAs and template substrates. Thus the substrate can be chosen to optimize the properties of the device. For instance for high power devices it can be useful to grow the GaN on SiC substrates because they have a thermal conductivity. Typically GaN comes in the wurtzite and cubic phase. GaN (wurzite and cubic form) has a large lattice mismatch with GeSn, thus wafer bonding circumvents the problem of growing strained and incompatible layers. GaN has high breakdown field, which is excellent for the collector breakdown voltage. GaN has near zero conduction band offset with GaAs, thus no blocking field at the interface. The use of GaN (instead of GaAs) collector significantly increases the overall thermal conductivity of the material structure. GaN has a high saturation velocity, thus electrons travel without intervalley scattering.

Furthermore, because GeSn has a low resistivity of 0.0002 ohm-cm, one can decrease the thickness of the base significantly, while still moderately increasing the base sheet resistance value. The frequency response of the device is related to the $F_t$ and $F_{max}$. The relationship between transit frequency $F_t$ and the maximum oscillation frequency $F_{max}$ is as follows for an HBT: $F_{max}=(F_t/8\pi R_B C_{CB})^{1/2}$. The transit frequency $F_t$ is basically the inverse of the time for the electron to traverse the emitter, base and collector. The parameters $R_B$ and $C_{CB}$ refer to the base sheet resistance and the capacitance of the collector base junction. The parameter $F_{max}$ is the unity power gain frequency and indicates the maximum frequency with power gain from a device. The transit frequency can be further improved by having a higher saturation velocity which the GaN collector exhibits.

The NPN GaAs—GeSn—GaN HBT (referred to as GeSn HBT) as compared to standard NPN InGaP—GaAs—GaAs HBT (referred as GaAs HBT) would have the following mainly advantages. The differences between the two devices are typically independent of the emitter, and mostly rely on the base material GeSn and the collector material GaN.

Advantage 1: If the GaAs HBT had a base thickness of 1000 Å, for the GeSn HBT base thickness could be halved to 500 Å, The $F_t$ for GeSn HBT would increase because of the thinner base. Because the GeSn base resistivity (0.0002 ohm-cm) is 10 times less than GaAs resistivity (0.002 ohm-cm), the parameter $F_{max}$ would increase by a factor of $(5*F_t)^{1/2}$. This is because $F_t$ increased because the base thickness was halved, but the base sheet resistance of the GeSn base only increased by a factor of two, but it is still 5 times less than the base sheet resistance of the GaAs HBT. Furthermore, by using GaN ($1.5\times10^5$ m/s) which has a higher saturation velocity than GaAs ($1\times10^5$ m/s), this results in faster electron transit time across the GaN collector.

A commonly used metric used for comparing various semiconductors is the Johnson's figure of merit (FOM), which can compares different semiconductors for suitability for high frequency power transistor applications. Table 16 shows a comparison Johnson FOM for Si, GaAs, and GaN.

TABLE 16

Johnson FOM for Si, GaAs, GaN

|  | Si | GaAs | GaN |
|---|---|---|---|
| Energy Bandgap (eV) $E_{gap}$ | 1.1 | 1.4 | 3.4 |
| Electron Saturation Velocity (cm/s) $V_{sat}$ | $1 \times 10^7$ | $1 \times 10^7$ | $1.5 \times 10^7$ |
| Peak Electron Saturation Velocity (cm/s) $V_{sat\,peak}$ | $1 \times 10^7$ | $1.9 \times 10^7$ | $2.5 \times 10^7$ |
| Normalized Johnson Figure of Merit ($E_{gap}^4 \times V_{sat\,peak}^2$) | 1 | 9.5 | 572 |

Johnson Figure of Merit = Maximum power times frequency ≈ $E_{gap}^4 \times V_{sat}^2$ Advantage 2: Because GaN has such large breakdown voltage for example for a Ge—GaN base collector junction where the GaN collector is only 5000 Å thick, the breakdown voltage is greater than 100 V. A typical GaAs heterojunction base-collector, where the GaAs collector is over 10000 Å thick has a breakdown voltage of only 20 volts. Thus one can reduce the GaN collector thickness as compared to the GaAs, without hurting robustness, thus the transit time or $F_t$ is increased because of a thinner base and collector, which in turn increases the $F_{max}$ with an additional factor because of the low resistivity GeSn base. Typical values of $F_t$ and $F_{max}$ should be greater than 150 GHz.

Exemplary Wafer Bonding of GeSn Stack to GaN: The method of wafer bonding is chosen as the most direct means of forming the GeSn to the GaN structure. The bonder, shown and described below, can eliminate the problems associated with the more conventional torqued jig fixtures. Using the method described here, the bonder allows gradual pressure application for the delicate bonding of GeSn and GaN. The large size heaters in the plates provide fast temperature ramp up for the bonding process. The bonder has a self-leveling action to the surface mechanism and ensures that it is flat with the surface. We have developed different wafer bonders and as well as different wafer bonding processes. QuantTera's custom wafer bonders have two independent temperature controllers to precisely control the temperature of the top and bottom bonding plates.

Our wafer bonders have a unique feature that the top and bottom plates are under electronically controlled differential air pressure. There is no non-linear return spring force needing to be concerned. The top plate moving up and down relies on the differential air pressure in the top plate's air cylinder; and thus, the bonding pressure can be continuously adjusted precisely to provide optimized wafer bonding conditions. Our wafer bonding system has precise temperature and pressure control to ensure the bonding of the materials. Operation step 1 comprises lowering the wafer bonder top plate so that it barely touches the materials to be bonded. Pressure is then slowly applied at this time and the temperature of the bonder top and bottom plate are raised. Independent temperature control of the top and bottom plate temperatures allows the accommodation of materials that may have different thermal expansion coefficients, thus minimizing stress to the bonded interface. Our bonders can reach temperatures above 500° C. in various gas ambients, but typically a nitrogen purge is used during the bonding process. Our bonders can accommodate up to 4" diameter wafers. In a single step we can easily achieve a PN homojunction or heterojunction bonded materials.

Figure 62:
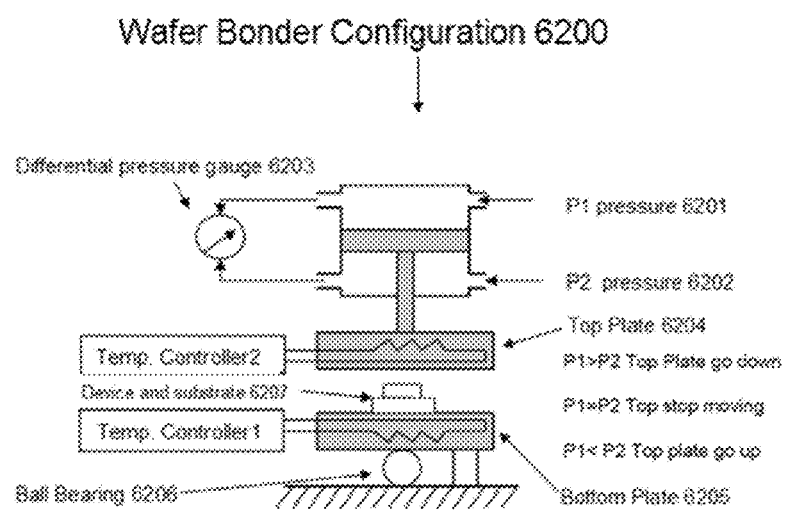
FIG. 62 shows QuantTera's wafer bonder configuration.

FIG. 62 shows QuantTera's wafer bonder configuration 6200. The bonder uses differential air pressure between P1 pressure 6201 and P2 pressure 6202, where the pressure is measured by the differential pressure gauge 6203. The pressure controls the action of the top plate 6204 in moving down to clamp the device and substrate 6207, which sits on the bottom plate 6205, which has a ball bearing 6206 for conformal leveling action. Two independent temperature controllers control the temperature of the top plate 6204 and bottom plate 6205.

Table 17 shows an exemplary wafer bonding process.

TABLE 17

Exemplary wafer bonding process

| Step | Description |
|---|---|
| 1 | The wafer is cleaved to appropriate size. |
| 2 | Semiconductor materials are thoroughly cleaned. |
| 3 | Oxides are removed from surface by chemical etch or plasma etcher. |
| 4 | GeSn stack material and the GaN material are placed on top of each other. |
| 5 | GeSn and GaN materials are placed in wafer bonder, which under pressure joins the materials together at typical temperatures of 300-600° C. for 1 to 2 hours. In a gas ambient. |
| 6 | The composite structure is cooled and then removed. |
| 7 | The composite unit acts as a monolithic PN structure. |
| 8 | Current voltage testing of the PN junction |
| 9 | Shear test to see the strength of wafer bonded junction |

Figure 63:
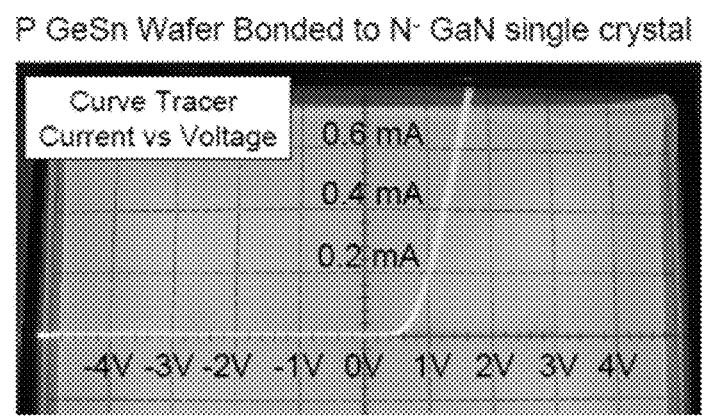
FIG. 63 shows a current-voltage characteristic of a wafer bonded P GeSn to N⁻ GaN showing PN rectifying behavior.

Wafer bonding allows formation of a heterointerface without having to perform heteroepitaxy of two poorly matched materials. FIG. 63 shows the current-voltage characteristic of the wafer bonded P GeSn to N—GaN showing PN rectifying behavior. The vertical axis is current in units of mA, and the horizontal axis is voltage in units of V. The turn-on voltage of the device is less than 0.5 V.

The wafer bonding process allows for independent optimization of materials without regard to lattice matching. It should be noted that Ge lattice constant is about 5.65 Å and GaN is 4.4 Å, which is a huge mismatch (28%). Interface defects can be minimized by varying wafer bonding parameters such, as oxide removal, temperature, time, and pressure. Table 18 lists the thermal expansion coefficients of the GaAs, GeSn, and GaN. Because the thermal expansion coefficients of all the materials are similar, the thermal stress generated during wafer bonding should be minimal.

TABLE 18

Thermal Expansion Coefficients of GaAs, GeSn, GaN

| Material | Thermal Expansion Coefficient ($10^{-6}$ $K^{-1}$) @ 300 K |
|---|---|
| GaAs | 6.0 |
| GeSn similar to Ge | 5.9 |
| GaN | 5.6 |

Possible advantages of the GaAs—GeSn—GaN HBT devices described herein: The GaAs—GeSn—GaN stack minimizes the conduction band offsets, which hinder electron transport (ultra-fast transistor action). The semiconductor materials are optimized for performance: GaN collector; GeSn base; and GaAs emitter. GaAs and GeSn are near latticed matched and wafer bonding allows for the integration of GaN without having to perform lattice-mismatch growth (Ge is latticed matched to GaAs, thus GeSn for low content Sn has a slightly larger lattice constant than GaAs). Wafer bonding is desirable for GaAs—GeSn—GaN because the thermal expansion coefficients are close to each other. The GaAs—GeSn—GaN HBT exceeds SiGe, InP and GaAs HBTs in terms of turn-on voltage, has much lower base sheet resistance allowing for a much thinner base, and the breakdown field that is 10 times higher. Two fundamental obstacles to conventional GaN HBTs are the high resistivity and large bandgap energy of the base layer. This results in a HBT with high base sheet resistivity and large turn-on voltage. Most of the GaN NPN HBTs have utilized complex re-growth strategies in an attempt to address these problems. Despite limited success with regard to DC transistor properties, these issues remain as impediments to high frequency operation of conventional GaN HBTs. The GaAs—GeSn—GaN HBT described herein solves all these issues and outperform the technology of traditional systems. Prominent commercial markets exist where the GaAs—GeSn—GaN transistor described herein can be implemented: 1) cellular handset market, 2) RF high power electronics.

Exemplary Configuration 5B: NPN InGaP Emitter-GeSn Base-GaN Collector Double HBT 6200 with all dissimilar materials Desirable combination of semiconductors (near Zero Conduction Band Offset between Emitter-Base-Collector). To further improve on configuration 5A, an InGaP emitter region is added that is lattice matched to GaAs. This device comprises an emitter stack of InGaP—GeSn wafer bonded to a GaN collector. GaN with it high band gap offers tremendous improvements in the breakdown voltage of the HBT. Note the InGaP layer can be compositionally graded to enhanced device performance. The monolithic InGaP—GeSn—GaN stack is unusual in that the conduction band offset is near zero. This special property allows for the formation of heterojunction transistor structure that can have large gain, and large breakdown voltage (GaN has large breakdown electric field strength and high saturated velocity). These material characteristics can make a desirable bipolar transistor. The InGaP—GeSn—GaN materials stack can be desirable for making NPN HBTs that can outperform standard SiGe, GaAs, and InP heterojunction bipolar transistors.

Figure 64:
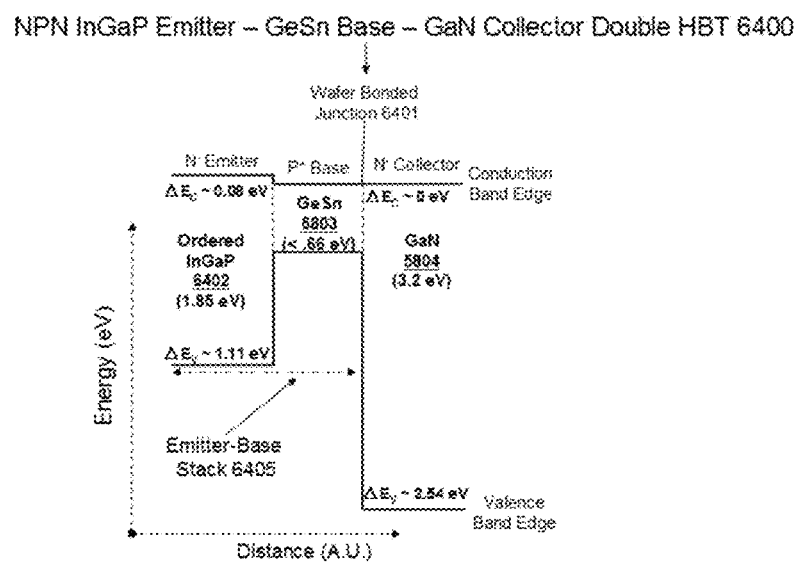
FIG. 64 shows an exemplary flat band energy band diagram of an NPN InGaP Emitter—GeSn Base—GaN Collector Double HBT.

FIG. 64 shows the exemplary flat band energy band diagram of NPN InGaP Emitter—GeSn Base—GaN Collector Double HBT 6400. This new material structure with near zero conduction band offsets between interfaces and a large valence band offset at the emitter-base and base collector heterojunction. Electrons can easily be injected from the InGaP emitter through the GeSn base to the GaN collector. Conduction band offsets at emitter-base and base-collector junctions are near zero, with large valence band offsets between the InGaP—GaAs and GaAs—GaN heterojunctions. The band alignments are desirable for high performance HBTs. Here an emitter up emitter-base stack 6405 comprising N$^-$ emitter ordered InGaP 6402 grown on P$^+$ Base GeSn 5803 structure. The ordered InGaP 6402 should have the smallest conduction band offset $\Delta E_C$ with the GeSn 5803. This emitter-base stack 6405 is then wafer bonded to the N$^-$ collector GaN 5804 thus forming a wafer bonded junction 6401 at the base-collector interface. The methodology of wafer bonding this emitter-base stack is described in Exemplary ELO Wafer Bonding Configuration 6A. Note the conduction band offset $\Delta E_C$ is approximately near zero through the NPN HBT structure.

InGaP semiconductor can be grown epitaxially and latticed matched to GaAs at the composition $In_{0.49}Ga_{0.51}P$. If typically grown at high temperatures, it can grow in an ordered phase where the crystalline structure forms sheets of In—P and Ga—P atoms can alternate in the (001) planes of the FCC unit cell without the intermixing of the Ga and In atoms on the lattice planes. This results in an almost zero conduction band discontinuity between the InGaP and GaAs and is called the ordered phase (this can be of weakly type I or weakly type II because it is close to zero). With different growth conditions, the In and Ga atoms can intermix and the disordered InGaP phase can form, which has a conduction band offset (0.1 eV vs. 0.03 eV for the ordered phase). In either case the conduction band offset of InGaP to GaAs or GeSn is small.

Figure 65:
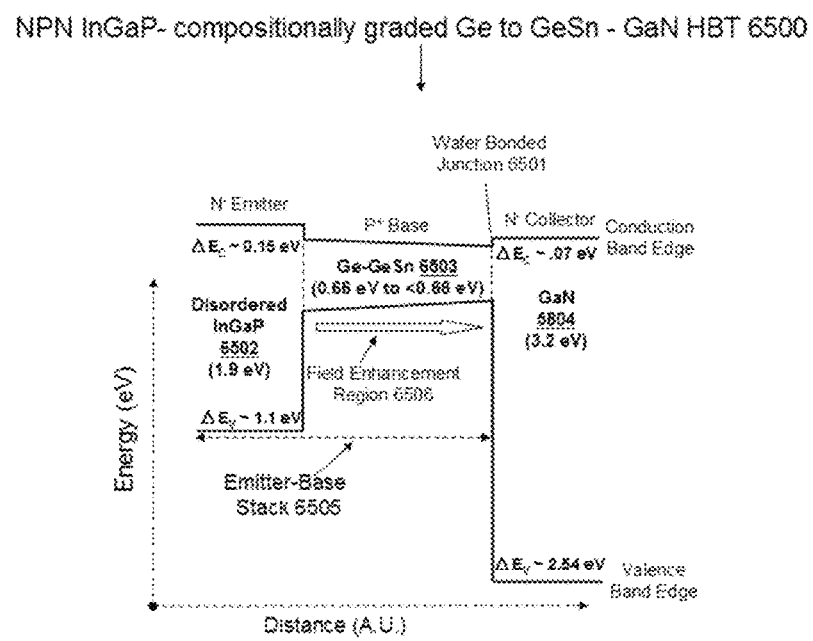
FIG. 65 shows an exemplary flat band energy diagram of an NPN InGaP—graded Ge—GeSn—GaN HBT.

Additionally, the base can be graded from Ge—GeSn to have electric field enhancement of the charge carriers. FIG. 65 shows an exemplary flat band energy diagram of the NPN InGaP-graded Ge to GeSn—GaN HBT 6500. Here for variation a base up emitter-base stack 6505 comprising P+ Base compositionally graded Ge—GeSn 6503 grown on a N− emitter disordered InGaP 6502 structure. The compositionally graded Ge—GeSn 6503 layer may comprise at the emitter a Ge or a low Sn % GeSn layer which is graded to higher Sn % GeSn at the collector interface. The compositional grading range can go from Ge at the emitter to GeSn at various compositions up to 20%. This emitter-base stack 6505 is then wafer bonded with the P+ Base next to the N− collector GaN 5804 thus forming a wafer bonded junction 6501 at the base-collector interface. Due to the compositional grading of the Ge—GeSn 6503 in the P+ Base, there is a field enhancement region 6506 that accelerates the carriers toward the collector. The methodology of wafer bonding the emitter-base stack to the GaN is described in Exemplary Inverted Wafer Bonding Configuration 6B. Note the conduction band offset $\Delta E_C$ is small through the NPN HBT structure. Note the differences between flat band energy diagrams FIG. 63 with the ordered InGaP and FIG. 64 with disordered InGaP is small.

Exemplary InGaP ($In_{0.49}Ga_{0.51}P$) Emitter Advantages. The large valence band offset between InGaP emitter and GaAs base stops back injection of holes into the emitter. This allows for low N-type doping of the emitter and high P-type doping of the base, thus lowering base emitter capacitance while still achieving sizable current gain. The near zero band conduction offset between the InGaP and the GeSn base can be desirable for electron injection into the base layer. Ordered InGaP may have reduced temperature sensitivity to the current gain. InGaP can be latticed matched to GaAs or Ge or GeSn (low Sn %), which enables dislocation free growth.

Table 19 shows an exemplary epitaxial structure of NPN InGaP—GeSn—GaN HBT grown and wafer bonded. In this structure the GaN is wurtzite hexagonal structure, a or m plane material. GaN in this form has no polarization charge that degrades the base-collector performance. Non-polar GaN wurzite substrates are illustrated here though one could use SiC, GaAs, Si, sapphire (non-polar and polar forms). GaN (FCC) can also be grown on GaAs which also lacks polarization charge effects.

Exemplary advantages of InGaP—GeSn—GaN HBT technology: The NPN InGaP—GeSn—GaN stack minimizes the conduction band offsets, which hinder electron transport (ultra-fast transistor action). The semiconductor materials are optimized for performance: GaN collector, GeSn base: InGaP emitter. Wafer bonding allows for the integration of GaN without having to perform lattice-mismatch growth. Wafer bonding is desirable for GaN—GeSn because the thermal expansion coefficients are close to each other. Additionally, strain effects can be incorporated in this device because the alloy composition of the InGaP can be changed to introduce tensile or compressive strain.

GaN collector for its high saturation velocity and large band gap energy which results in a high breakdown voltage. In examples described herein, the GaN can be grown on the various substrates like sapphire, SiC, Si GaAs, GaN and template substrates. Polar GaN wurtzite structure can be grown on sapphire, SiC (many polytypes: 3C, 4H, 6H, etc.), Si substrates, or template substrates and has piezoelectric and polarization charge. GaN is grown in the wurtzite (hexagonal) phase results in large spontaneous and piezoelectric polarization charge thus possibly creating a potential energy barrier at the wafer-bonded Ge—GaN base/collector interface. Non-polar GaN cubic (FCC) structure can be grown on GaAs, Si, or template substrates. GaN in this form has no polarization charge that degrades the base-collector performance. A cubic form of GaN with (001) orientation can be grown on zinc blende GaAs. Thus the cubic GaN can be grown on conducting GaAs which can act as the sub-collector. The zinc-blende (cubic) GaN collector has a negligible conduction band offset with respect to the GeSn base. The conduction band offset between GaAs and cubic GaN is roughly $\Delta E_C \sim -0.024$ eV. Thus the GeSn (close to Ge) the conduction band offset to GaN is about $\Delta E_C \sim 0$ eV at the base/collector heterojunction. Additionally, non-polar wurtzite forms, are cut from the c-plane growth along the "a" or "m" plane directions. If the GaN is grown along the m or a-plane axis, these polarization effects can be eliminated. Typical GaN wurzite crystals grown along the direction (c-plane) of III-nitrides suffer from polarization induced electric fields. Electric fields do not exist across nonpolar directions (a-plane or m-plane). Thus, high quality non-polar GaN substrate crystals are produced by slicing a c-plane GaN boule along the "a" or "m" plane. This results in low defect density non-polar substrates, which have improved substrates for fabrication of devices. Because configuration 5A showed the wafer bonding of emitter stack to a polar GaN collector, for this configuration 5B a non-polar GaN

TABLE 19

Epitaxial Structure of NPN InGaP—GeSn—GaN HBT

| Layer | Layer Name | Description | Comment |
|---|---|---|---|
| 1 | N+ cap | ~1000 Å InGaAs (Te-doped >$10^{19}$ $cm^{-3}$) | |
| 2 | N− Emitter Cap | ~1500 Å GaAs (Si-doped ~5 × $10^{18}$ $cm^{-3}$) | |
| 3 | N− Emitter | ~500 Å InGaP (Si-doped ~3 × $10^{17}$ $cm^{-3}$) | Ordered or disordered |
| 4 | P+ Base | ~500 Å GeSn (B-doped >$10^{19}$ $cm^{-3}$) 0 ≤ Sn % ≤ 20% Thickness range 100 Å-5000 Å | Or graded Ge—GeSn |
| 5 | N− Collector | ~10000 Å Non-polar GaN (Si-doped ~1 × $10^{16}$ $cm^{-3}$) | Wafer Bonded to above |
| 6 | N+ sub-collector | ~5000 Å Non-polar GaN (Si-doped ~5 × $10^{18}$ $cm^{-3}$) | |
| 7 | Substrate | Non-polar GaN N+ conducting substrate | Crystalline | substrate is demonstrated. Finally to fully fabricate the device the GaAs top half of HBT stack is wafer bonded to the GaN.

The (ordered or disordered) InGaP—GeSn emitter base junction has a large valence offset (at least 1.1 eV which is much larger than the GeSn band gap) and a small conduction band offset. This eliminates the back injection of holes to the emitter from the base, which reduces the gain of the transistor. Also because this is a double HBT, the offset voltage in the output characteristic will be reduced thus enhancing the power added efficiency. The base is doped heavily $P^+$ (typically $>1 \times 10^{19}$ cm$^{-3}$), with such high doping of the base, the emitter valence band offset blocks the holes even though the base doping is much higher than the $N^-$ emitter doping (low $10^{17}$ cm$^{-3}$). Furthermore, because GeSn has a low resistivity of 0.0002 ohm-cm, one can decrease the thickness of the base significantly, while still moderately increasing the base sheet resistance value. The frequency response of the device is related to the $F_t$ and $F_{max}$. The relationship between transit frequency $F_t$ and the maximum oscillation frequency $F_{max}$ is as follows for an HBT: $F_{max}=(F_t/8\pi R_B C_{CB})^{1/2}$. The transit frequency $F_t$ is basically inverse of the time for the electron to traverse the emitter, base and collector. The parameters $R_B$ and $C_{CB}$ refer to the base sheet resistance and the capacitance of the collector base junction. The parameter $F_{max}$ is the unity power gain frequency and indicates the maximum frequency with power gain from a device. The transit frequency can be further improved by having a higher saturation velocity which the GaN collector exhibits.

In some examples, the key innovation can be the formation of an advanced manufacturing platform to demonstrate a fully optimized transistor semiconductor stack, which cannot be grown with standard crystal growth methodologies. The uniqueness of the device described herein lies in the zero conduction band offset through the three different semiconductor materials (InGaP—GeSn—GaN) emitter-base-collector optimized for overall HBT performance, which is impossible to grow by standard crystal growth techniques. The parameters that InGaP—GeSn—GaN NPN transistor can achieve are the following: double heterojunction, emitter-base, and base collector can reduce offset voltage, high gain (large valence band offset at emitter base junction), high breakdown voltages for improved ruggedness for high power applications, and a short collector structure can result in improved electron transit time.

Exemplary ELO Wafer Bonding Configuration 6A: Fabrication of InGaP Emitter—GeSn Base—GaN Collector double HBT as an example of the ELO wafer bonding device fabrication process. For configuration 6A an epitaxial lift off (ELO) process and wafer bonding can be used to fabricate the emitter/base stack to the GaN collector. Epitaxial lift off and wafer bonding process is a quick-turn method for integration of fabricated GeSn devices to be joined on the GaN substrate. Combining the techniques of epitaxial lift off and wafer bonding releases the restrictions of lattice matching imposed by epitaxial growth and opens new degrees of freedom for the design of semiconductor devices, because the combination of unique properties of different materials becomes possible.

Figure 66:
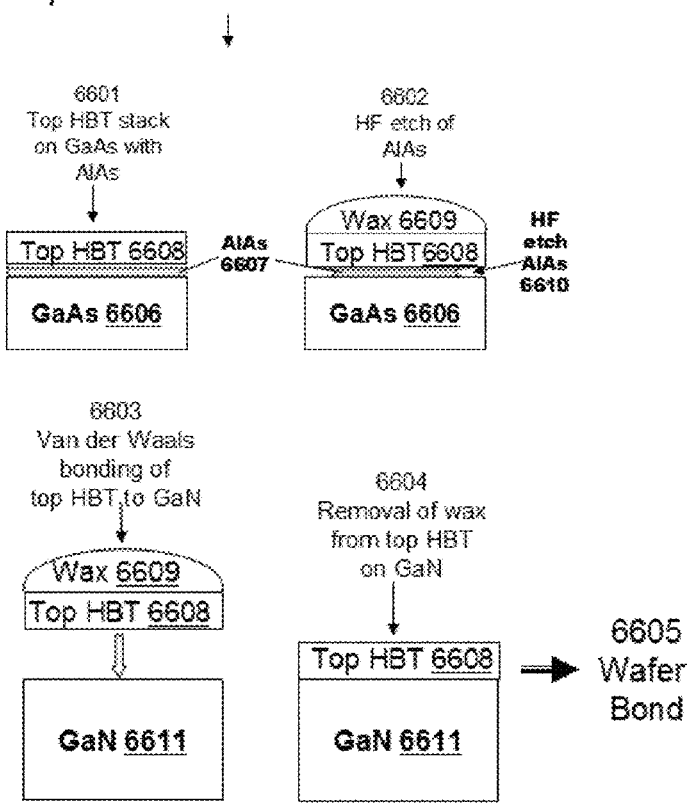
FIG. 66 shows a schematic methodology of the epitaxial lift off process.

FIG. 66 shows a schematic methodology of the epitaxial lift off process 6600. An epitaxial layer stack top HBT 6608 (preprocessed top half of the HBT device: InGaP emitter/GeSn base stack) is grown on a sacrificial GaAs 6606 substrate with a thin aluminum arsenide (AlAs 6607) inserted in between. The top HBT 6608 is covered with wax 6609 for mechanical strength, This thin AlAs 6607 sacrificial layer is removed by etching in hydrofluoric acid (HF etch AlAs 6610) in order to lift off the epitaxial layers from the GaAs 6606 substrate. The wax 6609 protecting the top HBT 6608 without the GaAs 6606 substrate is then transferred onto a new substrate like GaN 6611 via Van der Waals forces. This technique allow for the clean and flat surfaces of two dissimilar materials to be brought into close proximity where attractive forces pull them together, forming an intimate contact between different materials. The strength of the adhesion depends on the type of interaction. Van der Waals forces provide the first step of attraction. The bonding strength can be increased in the materials by wafer bonding at elevated temperatures. Both InP and GaAs devices integrated have been fabricated with near perfect interfaces for bonding to Si, AlN, Sapphire, and LiNbO$_3$ (a piezoelectric for SAW applications) wafers. FIG. 66 which demonstrates an exemplary ELO process 6600 can be described as follows: (6601) epitaxial HBT stack layer growth with AlAs release layer, top HBT on GaAs with AlAs; (6602) Wax 6609 covers top HBT 6608, epitaxial lift off by HF etch, AlAs 6610 releases the top layer off of GaAs 6606 substrate; (6603) Van der Waals bonding by surface tension of the top HBT 6608 to GaN 6611 substrate; (6604) removal of wax from top HBT 6608 on GaN 6611; and (6605) then wafer bonding to further strengthen the top HBT/GaN monolithic structure.

Figure 67:
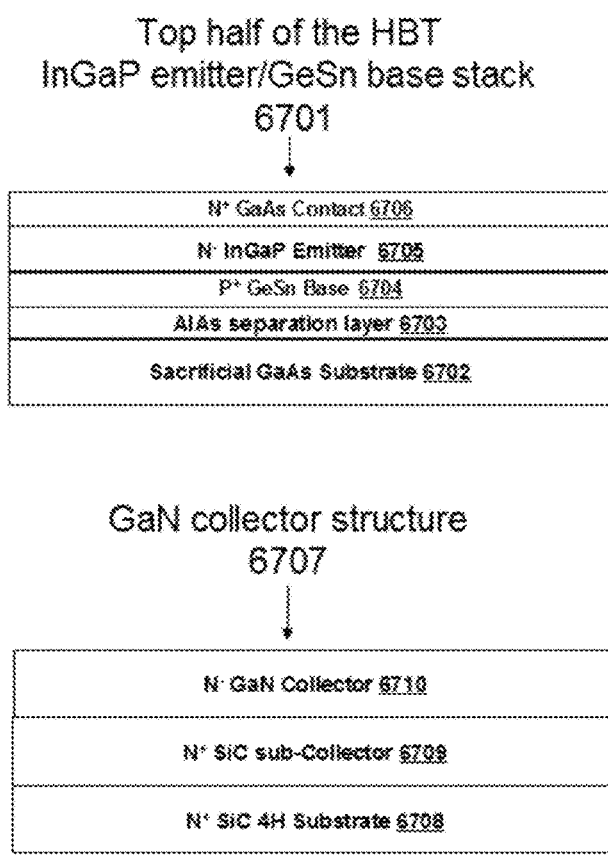
FIG. 67 a shows a schematic of the top half of an HBT InGaP emitter/GeSn base stack with the inclusion of an AlAs sacrificial layer.

Exemplary details of Device Fabrication and growth of ELO top half (example: InGaP—GeSn—GaN HBT). FIG. 67 shows the schematic of the top half of the HBT InGaP emitter/GeSn base stack 6701 with the inclusion of the AlAs sacrificial layer. Note the sacrificial layer could be AlGaAs from 40% to 100% Al. The top half of the HBT InGaP emitter/GeSn base stack 6701 comprises: a sacrificial GaAs substrate 6702; AlAs separation layer 6703; P$^+$ GeSn Base 6704; N$^-$ InGaP emitter 6705; N$^+$ GaAs contact 6706 epitaxial stack. This top half of the HBT InGaP emitter/GeSn base stack 6701 will then be wafer bonded to the GaN collector stack 6707. The GaN collector stack 6707 comprises a starting N$^+$ SiC 4H substrate 6708, with an N$^+$ SiC sub-collector 6709, then finally an N$^-$ GaN collector 6710. There could be many different variations of the GaN collector stack 6707, such as growth on GaN, Si, GaAs, sapphire substrates, or template substrates.

Table 20 shows an exemplary structure top half of the HBT InGaP emitter/GeSn base stack 6701. Table 20 shows an exemplary structure top half of the HBT InGaP emitter/GeSn base stack 6701

| Layer | Layer Name | Description | Comment |
|---|---|---|---|
| 1 | N$^+$ cap (non-alloyed) | ~1,000 Å InGaAs (Te-doped $>10^{19}$ cm$^{-3}$) | |
| 2 | N− Emitter Cap | ~1500 Å GaAs (Si-doped ~5 × $10^{18}$ cm$^{-3}$) | |
| 3 | N− Emitter | ~500 Å In$_{0.49}$Ga$_{0.51}$P (Si-doped ~3 × $10^{17}$ cm$^{-3}$) | Ordered or disordered |
| 4 | P$^+$ Base | ~500 Å GeSn (B-doped $>10^{19}$ cm$^{-3}$) 0 ≤ Sn % ≤ 20 Thickness range 100 Å-5000 Å | Or graded Ge—GeSn |

| Layer | Layer Name | Description | Comment |
|---|---|---|---|
| 5 | Sacrificial layer | ~50 Å AlAs | Release layer |
| 6 | High Purity Buffer | ~500 Å GaAs (un-doped) | |
| 7 | Sacrificial | GaAs substrate | Semi-insulating or conducting |

Table 21 shows an exemplary GaN collector structure 6707. Note that the GaN collector can be grown on Si, SiC, GaAs, Sapphire, and GaN, etc. substrates. Also it is possible to use a SiC collector.

TABLE 21

Exemplary GaN collector structure 6707

| Layer | Layer Name | Description | Comment |
|---|---|---|---|
| 1 | N⁻ Collector | 10,000 Å GaN (Si-doped ~1 × $10^{16}$ cm⁻³) | Wurtzite phase |
| 2 | N⁺ sub-collector | 5,000 Å 4H SiC (~5 × $10^{18}$ cm⁻³) | Standard (nitrogen doped) |
| 3 | N⁺ Buffer | 500 Å 4H SiC | |
| 4 | | 4H SiC (conducting substrate) | N⁺ substrate: other phases of SiC possible. |

From this point the device to wafer bonded can be pre-processed or post-processed. For this first exemplary configuration the ELO device will be demonstrated pre-processed (device has been partially fabricated). The pre-processed top half of HBT is covered in a "black wax" (Apiezon W) or "white wax" (crystal bond) or other type of adhesive. In some examples, it is useful to place a mechanical holder like an exemplary sapphire mechanical substrate to the wax for additional rigidity and a mechanical strength. The sacrificial AlAs layer is undercut in hydrofluoric HF acid and deionized water at room temperature at various ratios. After release the etchant is diluted with de-ionized water, the wax-covered ELO structure is moved to the GaN substrate where Van der Waals bonding occurs. In various embodiments, the adhesion process is handled in water to minimize contamination of the surfaces.

Figure 68:
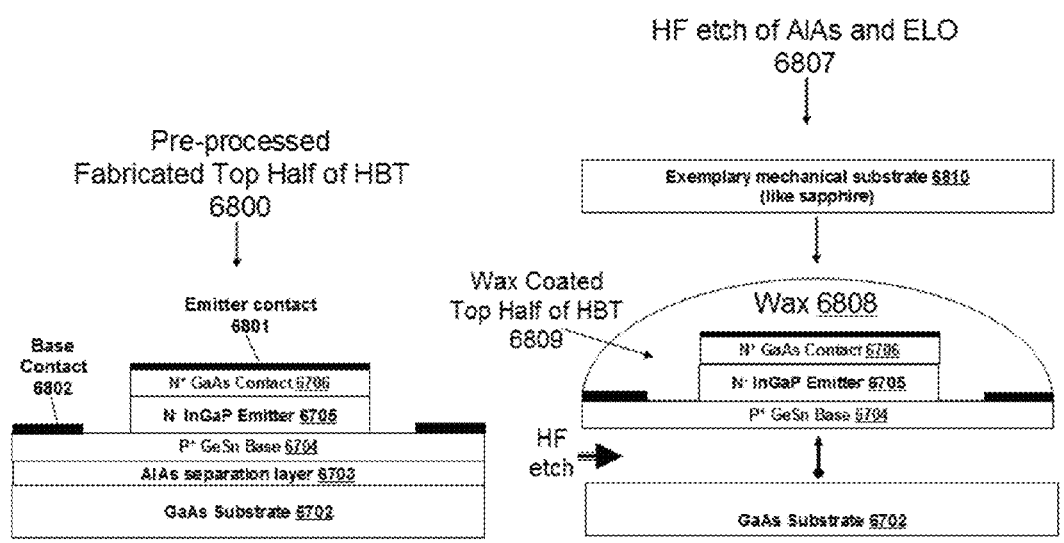
FIG. 68 shows a pre-processed top half of an HBT Top.

FIG. 68 shows a pre-processed top half of the HBT which comprises the N⁺ GaAs contact 6706, N⁺ InGaP emitter 6705: P⁺ GeSn base 6704; AlAs layer 6703 on GaAs substrate 6702; mesa device structure with emitter contact 6801 and base contact 6802. Next comes the HF etch of AlAs and ELO 6807 step. Before etching the device, an adhesive like wax 6808 is melted on pre-processed fabricated Top Half of HBT 6800 and sometimes it can be useful to have a mechanical substrate 6810 place on the wax for additional mechanical strength. This can be useful in large wafer devices (2", 3", 4", 6", 12", 18", etc., wafer sizes and not only limited to these sizes). For the ELO process the wax 6808 coated pre-processed fabricated Top Half of HBT 6801 assembly is placed into a solution of anhydrous hydrofluoric (HF) acid and over time the wax coated top half of the HBT 6809 is removed from the sacrificial GaAs substrate 6702. The solution can be heated and temperature controlled, the lift off process time depends on area of the device, and may take from several minutes to many hours. Once the sample is lift-off, the wax provides for mechanical strength of the lifted off layer and allows for ease of transport to the GaN substrate.

Figure 69:
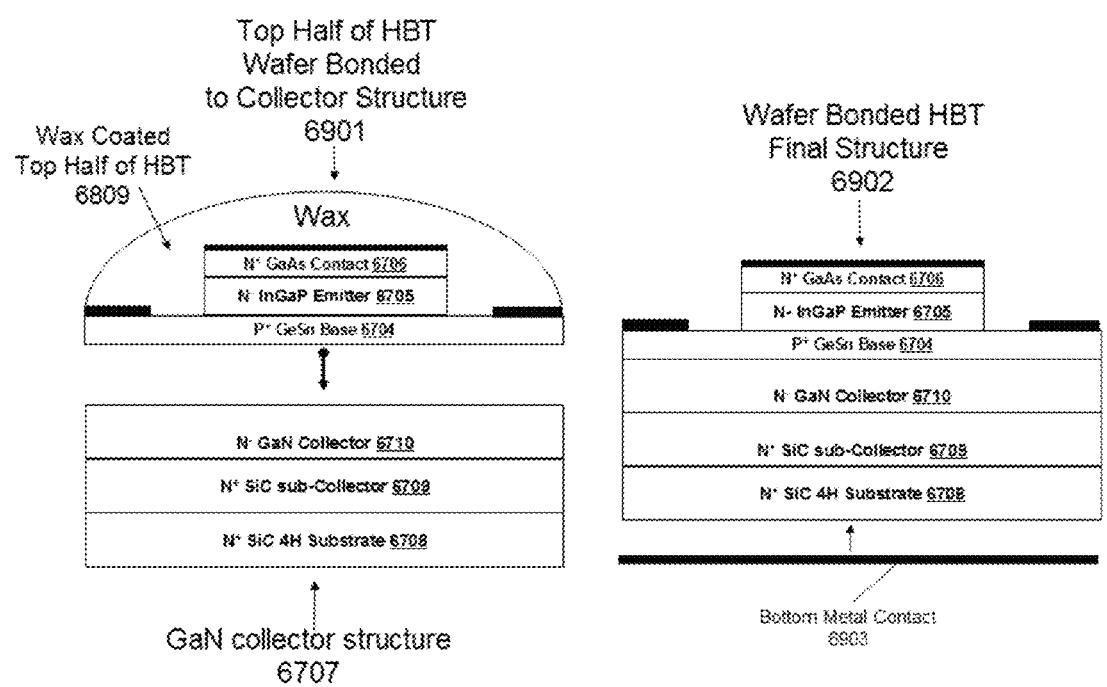
FIG. 69 shows where a top half of an HBT wafer is bonded to GaN collector structure.

FIG. 69 shows where the top half of HBT wafer bonded to collector structure 6901, which comprises the wax coated top of the HBT 6809 placed on the GaN collector structure 6707 with van der Waals bonding. Note the GaN collector could have a layer to electrically enhance performance, which can be deposited by PLD any other epitaxial process. There are many other seed layers that could be used for this purpose. The seed layer is could be used for adhesion or modifying the electrical interface properties of the heterojunction to improve performance or reliability.

Initially, the wax coated top of the HBT 6809 placed on the GaN collector structure 6707 with van der Waals bonding results in the adhesion of layers. The structure is put into trichloroethylene or acetone or some solvent to remove the wax, which then forms the wafer bonded HBT 6902. To finalize the device for test a bottom metal contact 6903 is applied to the N⁺ SiC 4H substrate 6708. The final wafer bonded structure may then be placed in a wafer bonder, and under heat and pressure, stronger bond formation between the top half of the HBT and the GaN collector structure 6707 should result for a permanent final structure. Finally, bottom metallization of the structure allows for the testing of this heterojunction bipolar structure for DC testing in a standard emitter-base-collector configuration. For RF testing contacts can be in this case put on top of the sub-collector to reduce the capacitance effects of the substrate, but this uses standard RF device fabrication techniques.

Figure 70:
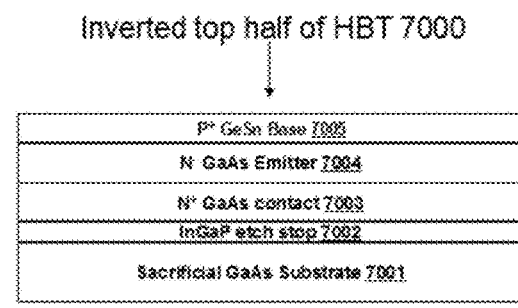
FIG. 70 shows an inverted top half of an HBT.

Exemplary Inverted Wafer Bonding Configuration 6B: Device Fabrication & Growth of Inverted Top Half of the GeSn Base HBT for Wafer Bonding and Post Processing Additionally, it can be useful to use an inverted top of the HBT for wafer bonding. FIG. 70 shows an inverted top half of HBT 7000. This comprises growth on a sacrificial GaAs substrate 7001; followed by a latticed matched InGaP etch stop 7002, an N⁺ contact GaAs 7003, then a N⁻ GaAs emitter 7004, and then the P⁺ GeSn base 7005. Table 22 show an exemplary design of the structure.

TABLE 22

Exemplary epitaxial structure of the inverted top half of HBT

| Layer | Layer Name | Description | Comment |
|---|---|---|---|
| 1 | P⁺ Base | ~500 Å GeSn (B-doped >$10^{19}$ cm⁻³) 0 ≤ Sn % ≤ 20 Thickness range 100 Å-5000 Å | Or graded Ge—GeSn |
| 2 | N⁻ Emitter | ~500 Å $In_{0.49}Ga_{0.51}P$ (Si-doped ~3 × $10^{17}$ cm⁻³) | Ordered or disordered |
| 3 | N⁻ Emitter Cap | ~1500 Å GaAs (Si-doped ~5 × $10^{18}$ cm⁻³) | |

TABLE 22-continued

Exemplary epitaxial structure of the inverted top half of HBT

| Layer | Layer Name | Description | Comment |
|---|---|---|---|
| 4 | N+ Contact | ~1000 Å GaAs (Si-doped ~5 × $10^{18}$ $cm^{-3}$) | |
| 5 | | ~50 Å InGaP | Stop Etch |
| 6 | High Purity Buffer | ~500 Å GaAs | UID |
| 7 | | GaAs substrate | Semi-insulating or conducting |

Figure 71:
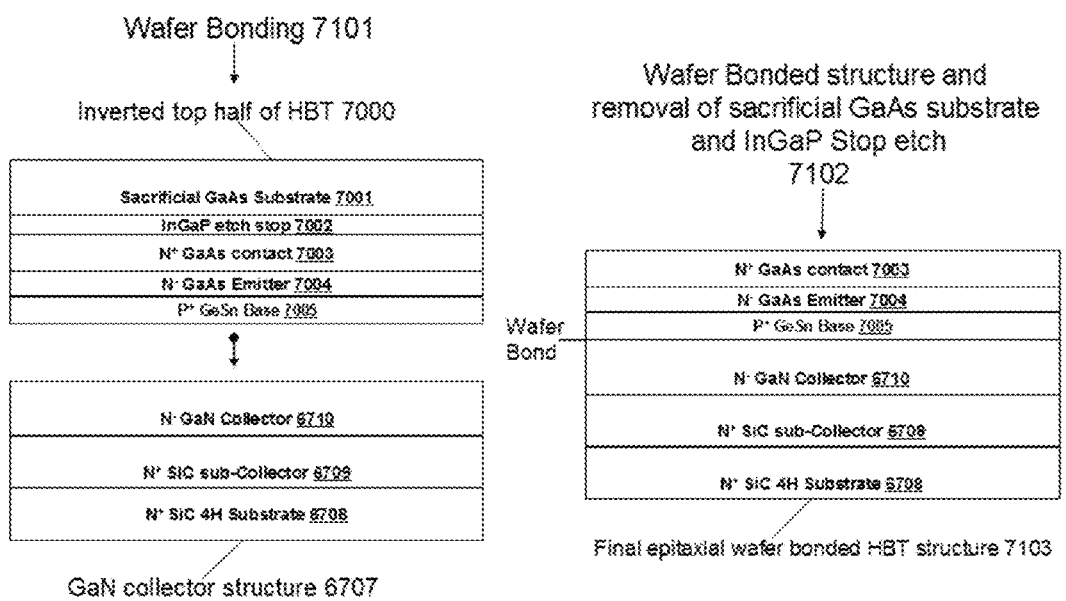
FIG. 71 shows the straightforward wafer bonding of an inverted top half of an HBT to a GaN collector structure.

FIG. 71 shows the straightforward wafer bonding 7101 of the inverted top half of HBT 7000 to the GaN collector structure 6707. This step shows the final wafer bonded structure and removal of the sacrificial GaAs substrate and InGaP stop etch 7102. The wafer bonded junction occurs at the P+ GeSn base to the N− GaN collector. The wafer bonding process would occur under heat, pressure, time, current/voltage bias, gaseous environment, etc. The final step is the wafer bonded structure and removal of sacrificial GaAs substrate 7001 and InGaP Stop etch 7002. Thus, after wafer bonding, the sacrificial GaAs substrate 7001 and InGaP etch stop 7002 would be removed by lapping (thinning) and then etching to the InGaP etch stop layer. This leaves the final epitaxial wafer bonded HBT structure 7103.

Figure 72:
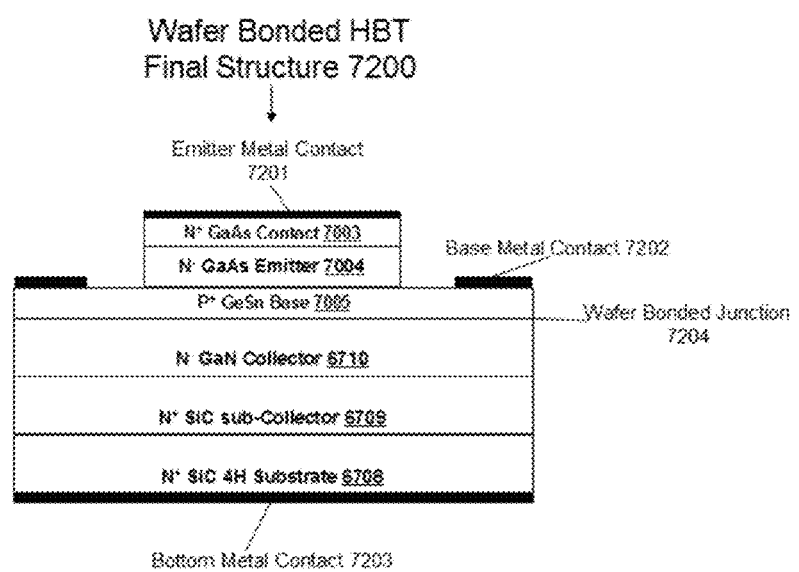
FIG. 72 shows a cross-sectional device depiction of a fully wafer bonded HBT structure.

FIG. 72 shows the post-processing of final epitaxial wafer bonded HBT structure 7103, where a standard quick lot HBT device fabrication procedure can be used to test the HBT. The device fabrication of the structure relies on standard GaAs fabrication techniques since the wafer bonded junction 7204 never gets exposed to any of the chemical processes. This standard device processing technology is used for the fabrication of HBTs and can be generally used for all the different configurations previously elucidated. This HBT test mask set will provide immediate feedback for fine tuning the growth process HBT device fabricated using a Quick lot mask set. There are many methodologies for the fabrication of the HBT. One possible version is to apply photoresist across the surface of the HBT structure 7103. A photomask will be placed on the photoresist surface and exposed with UV light which imprints a pattern of the emitter metal contact 7201 across the surface. Next, the HBT structure 7103 with exposed photoresist is put into a developer solution. The pattern is developed and then metal is blanket coated across the surface using a metal evaporator. The whole structure is put into acetone which dissolves the photoresist leaving only emitter metal contact 7201 pattern across the top of the N+ GaAs contact 7003.

The emitter metal contact 7201 than can act as a metal mask for mesa etching the HBT structure 7103 down to the P+ GeSn Base 7005. Here, photoresist is spun all over the mesa etched structure. With a photomask that has base metal contact 7202 pattern is placed on the photoresist. The photomask covering the photoresist is subsequently exposed with UV light and then developed to open a pattern where the base metal contact 7202 can be deposited on the P+ GeSn base 7005. Typically a metal evaporator will deposit blanket metal all over the surface of the mesa etched structure. The structure will then be put in acetone for metal lift off, thus resulting in a pattern of base metal contact 7202 on the P+ GeSn Base 7005.

Next, back metallization or the bottom metal contact 7203 is applied to the N+ SiC 4H substrate 6708. FIG. 72 shows the final wafer bonded HBT structure 7200. Sometimes the HBT device needs to be alloyed at elevated temperature to activate the metal contacts. The device is ready for DC testing.

Typical parameters that are measured and used to qualify the HBT materials are sheet resistance of the emitter, base and sub-collector, by both TLM and van Der Pauw cross structures. Various sized HBTs (emitter sizes are 40×40, 50×50, 75×75, 100×100 $\mu m^2$) are used to determine effects of geometry to device parameters such as Gummel, Gain, Output Characteristics and breakdown voltages.

To summarize, the devices are fabricated using standard semiconductor process techniques. For the PN junction fabrication a single mask level for the etching of the base and ohmic anneals will be used. The process will use mesa wet-etch and metallization lift-off techniques common in HBT fabrication. AuGeNiAu or other metals can be used for the N-type GaAs materials and Al to P-type GeSn. The junctions of interest are the emitter-base junction, and the base-collector junction.

Exemplary Embodiment: Base region with all the above compositional Ge—GeSn grading variations of the base from emitter side to collector side.

Exemplary Embodiment: Base region including all the variations and inclusion of a GeSn quantum well or GeSn quantum dot structure in the base region making a light emitting transistor laser.

Exemplary Summary of HBT parameters: The embodiments described herein can relate to the following: any bipolar transistor using a GeSn base; any bipolar transistor using a compositionally graded Ge—GeSn base and/or any light emitting bipolar transistor laser using a GeSn quantum well or quantum dot in the base region.

It should be noted that the values of the bandgap energies can change due to growth conditions and other factors. The values of the conduction and valence band offsets between dissimilar heterojunction semiconductors are used as guidelines and can be different dependent on the growth conditions, doping levels, and other factors. These parameters are also dependent on the temperature of the materials.

Although the embodiments have been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the methods, processes, and activities described herein may be comprised of many different activities, procedures and be performed by many different modules, in many different orders that any element of the figures may be modified and that the foregoing discussion of certain of these embodiments does not necessarily represent a complete description of all possible embodiments.

All elements claimed in any particular claim are essential to the embodiment claimed in that particular claim. Consequently, replacement of one or more claimed elements constitutes reconstruction and not repair. Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims, unless such benefits, advantages, solutions, or elements are stated in such claim.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

The invention claimed is:

1. A heterojunction bipolar transistor comprising:
   a GeSn base region;
   an emitter base junction comprising a first conduction band offset; and
   a base collector junction comprising a second conduction band offset;
   wherein:
      the first conduction band offset is less than 0.1 electron volts; and
      the second conduction band offset is less than 0.1 electron volts.

2. The heterojunction bipolar transistor of claim 1, wherein the heterojunction bipolar transistor is an NPN device.

3. The heterojunction bipolar transistor of claim 1, wherein the GeSn base region comprises a graded Ge—GeSn base region.

4. The heterojunction bipolar transistor of claim 1, wherein the GeSn base region comprises a Sn content varying from 0% to approximately 20% or less.

5. The heterojunction bipolar transistor of claim 1, wherein the GeSn base region comprises a GeSn quantum well or a GeSn quantum dot, and wherein the GeSn quantum well or the GeSn quantum dot is part of an active region of a light emitting transistor laser.

6. The heterojunction bipolar transistor of claim 1, wherein:
   the heterojunction bipolar transistor comprises a symmetric double heterojunction bipolar transistor.

7. The heterojunction bipolar transistor of claim 1, further comprising:
   an emitter comprising GaAs; and
   a collector comprising GaAs.

8. The heterojunction bipolar transistor of claim 1, further comprising:
   an emitter comprising InGaP; and
   a collector comprising GaAs.

9. The heterojunction bipolar transistor of claim 8, wherein the InGaP is ordered.

10. The heterojunction bipolar transistor of claim 1, further comprising:
    an emitter comprising AlGaAs; and
    a collector comprising GaAs.

11. The heterojunction bipolar transistor of claim 1, further comprising:
    an emitter comprising GaAs; and
    a collector comprising GaN.

12. The heterojunction bipolar transistor of claim 11, wherein the collector is non-polar.

13. The heterojunction bipolar transistor of claim 1, further comprising:
    an emitter comprising InGaP; and
    a collector comprising GaN.

14. The heterojunction bipolar transistor of claim 13, wherein the InGaP is ordered.

15. The heterojunction bipolar transistor of claim 13, wherein the GaN is non-polar.

16. The heterojunction bipolar transistor of claim 1, further comprising:
    an emitter comprising SiGeSn; and
    a collector comprising SiGeSn;
    wherein:
       the SiGeSn of the emitter strains the GeSn base region; and
       the SiGeSn of the collector strains the GeSn base region.

17. The heterojunction bipolar transistor of claim 16, wherein:
    the SiGeSn of the emitter strains the GeSn base region by tensilely stressing the GeSn base region; and
    the SiGeSn of the collector strains the GeSn base region by tensilely stressing the GeSn base region.

18. The heterojunction bipolar transistor of claim 16, wherein:
    the SiGeSn of the emitter strains the GeSn base region by compressively stressing the GeSn base region; and
    the SiGeSn of the collector strains the GeSn base region by compressively stressing the GeSn base region.

19. The heterojunction bipolar transistor of claim 1, wherein the GeSn base region is located over a Si substrate.

20. The heterojunction bipolar transistor of claim 1, wherein the heterojunction bipolar transistor comprises a laser.

21. The heterojunction bipolar transistor of claim 1, wherein the GeSn base region comprises compressively strained GeSn.

22. The heterojunction bipolar transistor of claim 1, wherein the GeSn base region comprises relaxed GeSn.

23. The heterojunction bipolar transistor of claim 1, wherein the GeSn base region comprises GeSn as an indirect bandgap semiconductor.

24. The heterojunction bipolar transistor of claim 1, wherein the GeSn base region comprises GeSn as a direct bandgap semiconductor.

25. The heterojunction bipolar transistor of claim 1, wherein the GeSn base region comprises a GeSn active region within a light emitting device or a transistor laser.

26. The heterojunction bipolar transistor of claim 1, wherein the GeSn base region comprises a direct bandgap GeSn active region that is part of a light emitting device or transistor laser.

27. A method of manufacturing a heterojunction bipolar transistor comprising:
    forming a GeSn base region;
    forming an emitter base junction comprising a first conduction band offset, the first conduction band offset being less than 0.1 electron volts; and
    forming a base collector junction comprising a second conduction band offset, the second conduction band offset being less than 0.1 electron volts.

28. The method of claim 27, wherein forming the GeSn base region comprises forming the GeSn base region to comprise a GeSn quantum well or a GeSn quantum dot, wherein the GeSn quantum well or the GeSn quantum dot is surrounded by GaAs or Ge P-type regions.

29. The method of claim 27, further comprising wafer bonding a GaN collector to the GeSn base region.

30. The method of claim 27, wherein:
the heterojunction bipolar transistor comprises a symmetric double heterojunction bipolar transistor.

31. A device comprising:
a first heterojunction bipolar transistor comprising a PNP device having a first GeSn base region, a first emitter base junction, and a first base collector junction; and
a second heterojunction bipolar transistor comprising an NPN device having a second GeSn base region, a second emitter base junction, and a second base collector junction;
wherein:
the first heterojunction biopolar transistor and the second heterojunction bipolar transistor are located over a common substrate;
the first emitter base junction comprises a first conduction band offset less than 0.1 electron volts;
the first base collector junction comprises a second conduction band offset less than 0.1 electron volts;
the second emitter base junction comprises a third conduction band offset less than 0.1 electron volts; and
the second base collector junction comprises a fourth conduction band offset less than 0.1 electron volts.

32. A method of manufacturing a device comprising:
forming a first heterojunction bipolar transistor over a common substrate, the first heterojunction bipolar transistor comprising a PNP device having a first GeSn base region, a first emitter base junction, and a first base collector junction; and
forming a second heterojunction bipolar transistor over the common substrate, the second heterojunction bipolar transistor comprising an NPN device having a second GeSn base region, a second emitter base junction, and a second base collector junction;
wherein:
the first emitter base junction comprises a first conduction band offset less than 0.1 electron volts;
the first base collector junction comprises a second conduction band offset less than 0.1 electron volts;
the second emitter base junction comprises a third conduction band offset less than 0.1 electron volts; and
the second base collector junction comprises a fourth conduction band offset less than 0.1 electron volts.

33. A transistor laser comprising:
a heterojunction bipolar transistor comprising:
a GeSn active region;
an emitter base junction comprising a first conduction band offset; and
a base collector junction comprising a second conduction band offset;
wherein:
the first conduction band offset is less than 0.1 electron volts; and
the second conduction band offset is less than 0.1 electron volts.

34. The transistor laser of claim 33, wherein the GeSn active region comprises a GeSn quantum well.

35. The transistor laser of claim 34, wherein the GeSn quantum well comprises a Sn percentage of approximately 0% to 10% within the GeSn quantum well.

36. The transistor laser of claim 33, wherein the GeSn active region comprises a GeSn quantum dot.

37. The transistor laser of claim 36, wherein the GeSn quantum dot comprises a Sn percentage of approximately 10% to 20% within the GeSn quantum dot.

38. The transistor laser of claim 33, wherein the GeSn active region comprises a GeSn quantum well or a GeSn quantum dot, and wherein the GeSn quantum well or the GeSn quantum dot is located within a Ge barrier.

39. The transistor laser of claim 33, wherein the GeSn active region comprises a GeSn quantum well or a GeSn quantum dot, and wherein the GeSn quantum well or the GeSn quantum dot is located within a GaAs barrier.

40. The transistor laser of claim 33, wherein the GeSn active region comprises a GeSn quantum well or a GeSn quantum dot, and wherein:
when the GeSn active region comprises the GeSn quantum well, the transistor laser comprises a laser structure; and
when the GeSn active region comprises the GeSn quantum dot, the transistor laser comprises the laser structure.

41. A method of forming a transistor laser, the method comprising:
forming a heterojunction bipolar transistor comprising a GeSn active region, forming an emitter base junction comprising a first conduction band offset, and forming a base collector junction comprising a second conduction band offset;
wherein:
the first conduction band offset is less than 0.1 electron volts; and
the second conduction band offset is less than 0.1 electron volts.

42. A transistor laser comprising:
a GeSn active region;
wherein:
the GeSn active region comprises a GeSn quantum dot.

43. The transistor laser of claim 42, wherein:
the GeSn quantum dot comprises a Sn percentage of approximately 10% to 20% within the GeSn quantum dot.

44. A transistor laser comprising:
a GeSn active region;
wherein:
the GeSn active region comprises a GeSn quantum well or a GeSn quantum dot; and
the GeSn quantum well or the GeSn quantum dot is located within a Ge barrier or a GaAs barrier.

* * * * *